(12) United States Patent
Chin et al.

(10) Patent No.: US 12,315,764 B2
(45) Date of Patent: May 27, 2025

(54) CONDUCTIVE STRUCTURES WITH BARRIERS AND LINERS OF VARYING THICKNESSES

(71) Applicant: Taiwan Semiconductor Manufacturing Company, Ltd., Hsinchu (TW)

(72) Inventors: Shu-Cheng Chin, Hsinchu (TW); Chih-Chien Chi, Hsinchu (TW); Chi-Feng Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 616 days.

(21) Appl. No.: 17/647,748

(22) Filed: Jan. 12, 2022

(65) Prior Publication Data

US 2023/0154792 A1    May 18, 2023

Related U.S. Application Data

(60) Provisional application No. 63/264,054, filed on Nov. 15, 2021.

(51) Int. Cl.
*H01L 21/768*    (2006.01)
*H01L 23/522*    (2006.01)
*H01L 23/532*    (2006.01)

(52) U.S. Cl.
CPC .. *H01L 21/76846* (2013.01); *H01L 21/76844* (2013.01); *H01L 23/5226* (2013.01); *H01L 23/53238* (2013.01); *H01L 23/53295* (2013.01)

(58) Field of Classification Search
CPC ......... H01L 21/76885; H01L 21/76831; H01L 21/76847; H01L 21/76879; H01L 21/76843; H01L 21/76849; H01L 21/76883; H01L 21/76897; H01L 21/76846; H01L 21/76844; H01L 23/5226; H01L 23/53295; H01L 23/53238; H01L 21/76805; H01L 21/76852; H01L 21/76834
See application file for complete search history.

(56) References Cited

U.S. PATENT DOCUMENTS

| 2006/0197193 A1* | 9/2006 | Gu | H01L 21/76891 |
| | | | 257/E21.582 |
| 2007/0032062 A1* | 2/2007 | Lee | H01L 21/76807 |
| | | | 438/597 |
| 2007/0209925 A1* | 9/2007 | Tang | H01J 37/3266 |
| | | | 204/192.1 |

(Continued)

*Primary Examiner* — Galina G Yushina
(74) *Attorney, Agent, or Firm* — Harrity & Harrity, LLP

(57) ABSTRACT

A barrier layer is selectively formed on a bottom surface of a recess (e.g., in which a back end of line (BEOL) conductive structure will be formed) using a combination of flash physical vapor deposition with atomic layer deposition. Additionally, a ruthenium liner is selectively deposited on sidewalls of the BEOL conductive structure using a blocking material. Accordingly, the barrier layer prevents diffusion of metal ions from the BEOL conductive structure and is thinner at the bottom surface as compared to the sidewalls in order to reduce contact resistance. Additionally, the ruthenium liner improves copper flow into the BEOL conductive structure and is thinner at the bottom surface in order to further reduce contact resistance.

20 Claims, 47 Drawing Sheets

(56) References Cited

U.S. PATENT DOCUMENTS

| | | | |
|---|---|---|---|
| 2008/0083989 A1* | 4/2008 | Aoi | H01L 21/28562 |
| | | | 257/E21.171 |
| 2014/0284802 A1* | 9/2014 | Sakata | H01L 23/53257 |
| | | | 257/750 |
| 2014/0367857 A1* | 12/2014 | Yang | H01L 21/76849 |
| | | | 438/653 |
| 2015/0279852 A1* | 10/2015 | Mizutani | H10B 41/27 |
| | | | 257/315 |
| 2021/0280780 A1* | 9/2021 | Zhong | H10N 70/063 |

* cited by examiner

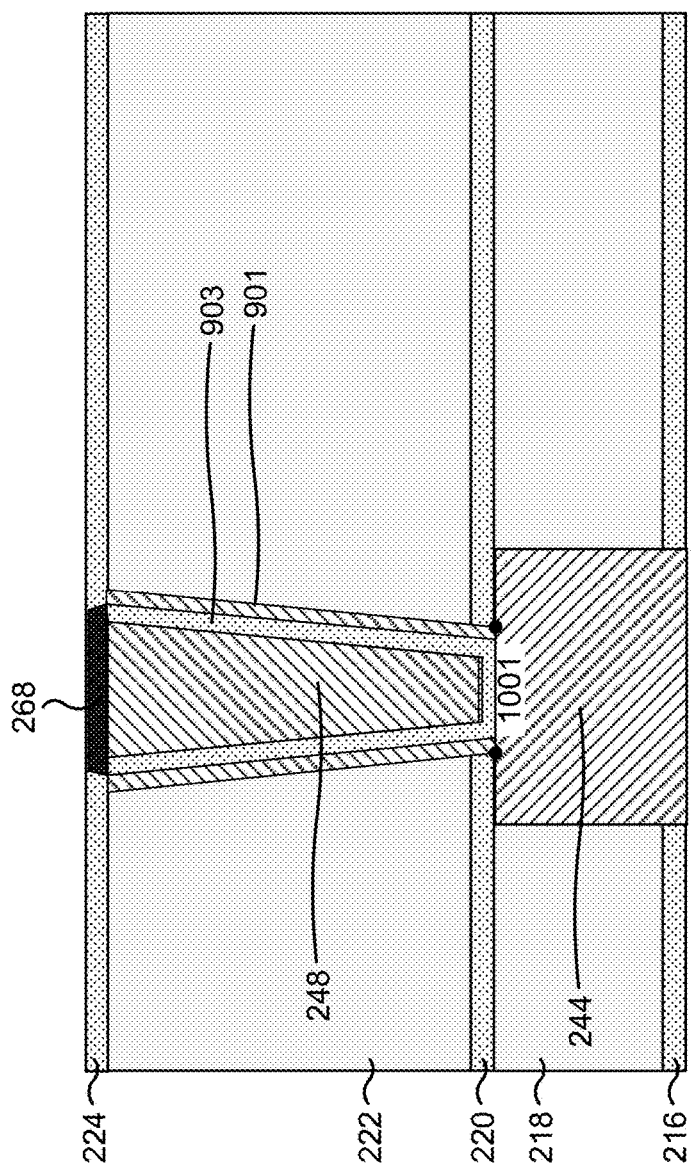

CONDUCTIVE STRUCTURES WITH BARRIERS AND LINERS OF VARYING THICKNESSES

CROSS-REFERENCE TO RELATED APPLICATION

This Patent Applications claims priority to U.S. Provisional Patent Application No. 63/264,054, filed on Nov. 15, 2021, and entitled "CONDUCTIVE STRUCTURES WITH BARRIERS AND LINERS OF VARYING THICKNESSES." The disclosure of the prior Application is considered part of and is incorporated by reference into this Patent Application.

BACKGROUND

Some electronic devices, such as a processor, a memory device, or another type of electronic device, include a middle end of line (MEOL) region that electrically connects transistors in a front end of line (FEOL) region to a back end of line (BEOL) region. The BEOL region or MEOL region may include a dielectric layer and via plugs formed in the dielectric layer. A plug may include one or more metals for electrical connection.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 10A and 10B are diagram of an example conductive structure described herein.

DETAILED DESCRIPTION

Figure 1:
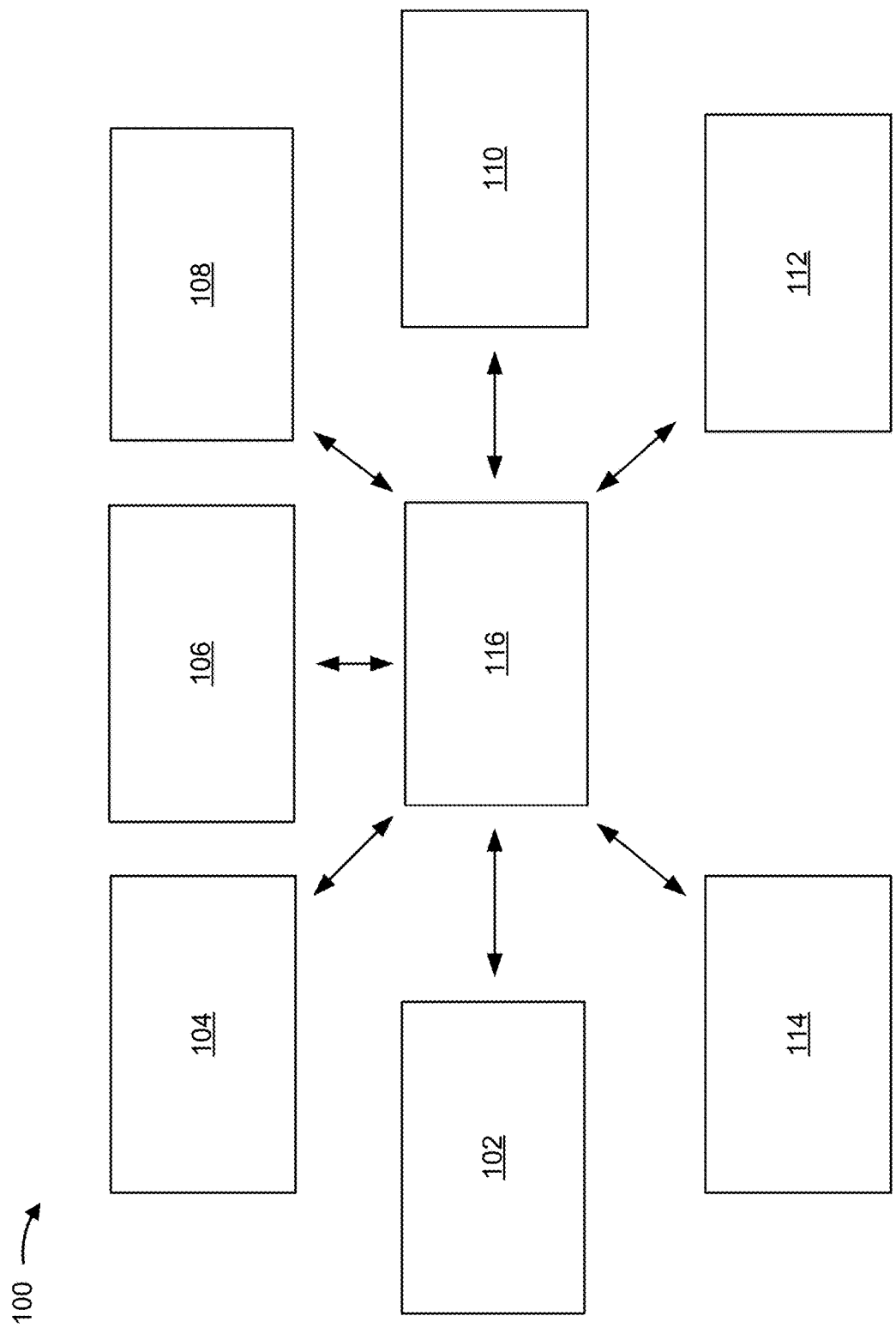
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Copper is often used for back end of line (BEOL) metallization layers and vias (also referred to as M1, M2, . . . or Mx (x may be a positive integer) interconnects or metallization layers) or for middle end of line (MEOL) contact plugs (also referred to as M0 interconnects or metallization layers) due to low contact resistance and sheet resistance relative to other conductive materials, such as aluminum (Al). Lower resistivity provides lower resistance/capacitance (RC) time constants and faster propagation of signals across an electronic device. However, copper also has a high diffusion (or electromigration) rate, which can cause copper ions to diffuse into surrounding dielectric material. This diffusion results in an increase in resistivity for BEOL metallization layers and vias (or for MEOL contact plugs). Increased resistivity can decrease electrical performance of an electronic device. Moreover, diffusion may result in copper ions migrating into other BEOL layers, MEOL layers, and/or front end of line (FEOL) layers, such as source or drain interconnects (also referred to as source/drain vias or VDs) and/or gate interconnects (also referred to as gate vias or VGs), which can cause semiconductor device failures and reduced manufacturing yield.

Accordingly, barrier layers and/or liners (such as titanium nitride (TiN), tantalum nitride (TaN), ruthenium (Ru), cobalt (Co), RuCo, and/or the like) may be deposited to prevent diffusion and/or improve adhesion. However, the barrier layers may increase contact resistance when deposited at an interface between BEOL layers or between an M1 layer and an M0 interconnect, which decreases electrical performance of the electronic device.

Some implementations described herein provide techniques and apparatuses for selectively forming a barrier layer (e.g., tantalum nitride (TaN)) on a bottom surface of a recess (e.g., in which a BEOL conductive structure will be formed) by a physical vapor deposition (PVD) process, such that a subsequently formed ruthenium liner can be selectively deposited on sidewalls of the BEOL conductive structure but thinner on or partially or entirely exposes the bottom surface. The barrier layer prevents diffusion of metal ions from the BEOL conductive structure and may be thinner at the bottom surface as compared to the sidewalls in order to reduce contact resistance in some embodiments. The ruthenium liner improves copper flow into the BEOL conductive structure and is thinner at or exposes the bottom surface in order to further reduce contact resistance.

The Ru-based VD or VG may induce Cu/Co diffusion from the upper Cu/Co interconnects, which increases risk of Cu loss and electromigration (EM) fail. Additionally, or alternatively, some implementations described herein provide techniques and apparatuses for forming a graphene cap between a cobalt liner or copper via of an M0 interconnect and a VD or a VG. The graphene cap blocks diffusion of cobalt or copper from the upper interconnect into the lower VD or the VG. The graphene cap also blocks, or at least reduces, deposition of a barrier layer (e.g., titanium nitride (TiN), tantalum nitride (TaN), or another nitride material) in order to reduce contact resistance at an interface between the VD or the VG and the M0 interconnect.

Some implementations described herein provide techniques and apparatus for forming a graphene cap over Ru-sealed Cu interconnects, such as an M1 layer, an M2 layer, an M3 layer, or another BEOL conductive structure (or metallization layer). The graphene or graphite layer blocks upward diffusion of copper from the underlying BEOL conductive structure. Additionally, the graphene cap does not diffuse (unlike cobalt does) and selectively deposits on the BEOL conductive structure but not a surrounding dielectric (unlike ruthenium).

Additionally, or alternatively, some implementations described herein provide techniques and apparatus for forming a cobalt cap between a cobalt liner of an M1 layer and a single damascene metal etched M0 interconnect. The layer of cobalt diffuses into the M0 interconnect and prevents additional diffusion of the cobalt liner. The cobalt cap may also be used to block, or at least reduce, deposition of a barrier layer (e.g., titanium nitride (TiN), tantalum nitride (TaN), or another nitride material) in order to reduce contact resistance at an interface between the M1 layer and the M0 interconnect.

FIG. 1 is a diagram of an example environment 100 in which systems and/or methods described herein may be implemented. The example environment 100 includes semiconductor processing tools that can be used to form semiconductor structures and devices, such as a conductive structure as described herein.

As shown in FIG. 1, environment 100 may include a plurality of semiconductor processing tools 102-114 and a wafer/die transport tool 116. The plurality of semiconductor processing tools 102-114 may include a deposition tool 102, an exposure tool 104, a developer tool 106, an etch tool 108, a planarization tool 110, a plating tool 112, an ion implantation tool 114, and/or another semiconductor processing tool. The tools included in the example environment 100 may be included in a semiconductor clean room, a semiconductor foundry, a semiconductor processing and/or manufacturing facility, or another location.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 may include a chemical vapor deposition (CVD) tool, such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or another type of exposure tool. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or another type of etch tool. In some implementations, the etch tool 108 includes a chamber that is filled with an etchant, and the substrate is placed in the chamber for a particular time period to remove particular amounts of one or more portions of the substrate. In some implementations, the etch tool 108 etches one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

The wafer/die transport tool 116 includes a mobile robot, a robot arm, a tram or rail car, an overhead hoist transfer (OHT) vehicle, an automated material handling system (AMHS), and/or another type of tool that is used to transport wafers and/or dies between semiconductor processing tools 102-114 and/or to and from other locations such as a wafer rack, a storage room, or another location. In some implementations, the wafer/die transport tool 116 is a programmed tool to travel a particular path and/or may operate semi-autonomously or autonomously.

The number and arrangement of tools shown in FIG. 1 are provided as one or more examples. In practice, there may be additional tools, fewer tools, different tools, or differently arranged tools than those shown in FIG. 1. Furthermore, two or more tools shown in FIG. 1 may be implemented within a single tool, or a single tool shown in FIG. 1 may be implemented as multiple, distributed tools. Additionally, or alternatively, a set of tools (e.g., one or more tools) of environment 100 may perform one or more functions described as being performed by another set of tools of environment 100.

Figure 2:
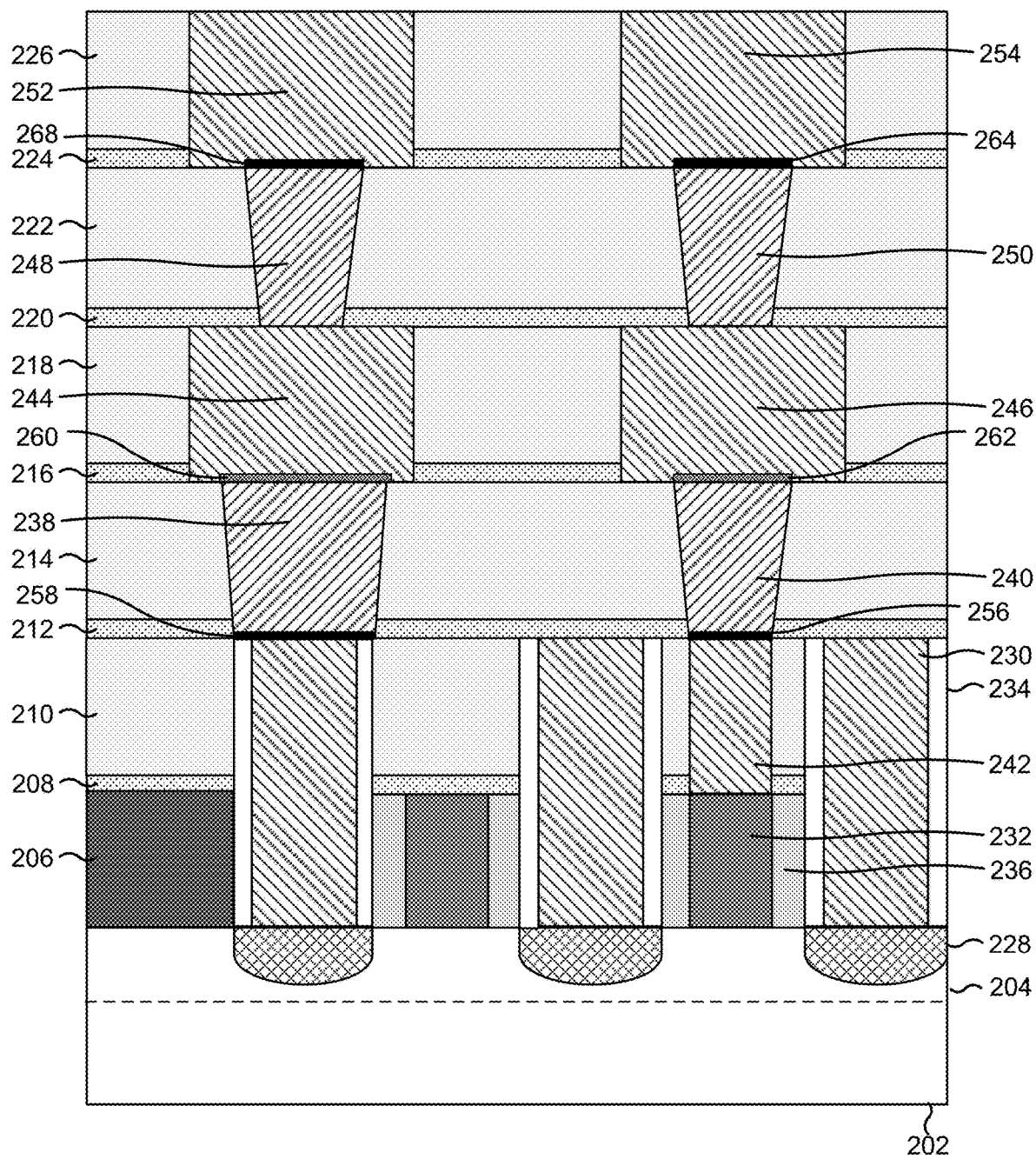
FIG. 2 is a diagram of an example semiconductor structure described herein.

FIG. 2 is a diagram of a portion of an example device 200 described herein. Device 200 includes an example of a memory device, a logic device, a processor, an input/output device, and/or another type of semiconductor device that includes one or more transistors.

The device 200 may include a substrate 202, an active layer, and one or more stacked layers, including a dielectric layer 206, an etch stop layer (ESL) 208, a dielectric layer 210, an ESL 212, a dielectric layer 214, an ESL 216, a dielectric layer 218, an ESL 220, a dielectric layer 222, an ESL 224, and a dielectric layer 226, among other examples. The dielectric layers 206, 210, 214, 218, 222, and 226 are included to electrically isolate various structures of the device 200. The dielectric layers 206, 210, 214, 218, 222, and 226 may include a silicon nitride ($SiN_x$), an oxide (e.g., a silicon oxide (SiOx) and/or another oxide material), and/or another type of dielectric material. The ESLs 208, 212, 216, 220, 224 includes a layer of material that is configured to permit various portions of the device 200 (or the layers included therein) to be selectively etched or protected from etching to form one or more of the structures included in the device 200. For example, the ESLs 208, 212, 216, 220, and 224 may each include silicon nitride ($SiN_x$), an oxide (e.g., a silicon oxide ($SiO_x$), silicon oxynitride ($SiO_xN_x$) metal oxide, and/or metal oxynitride.

As an example in FIG. 2, the device 200 may include a plurality of epitaxial (epi) regions 228 that are grown and/or otherwise formed on and/or around portions of a fin structure 204 of the substrate 202. The epitaxial regions 228 are formed by epitaxial growth. In some implementations, the epitaxial regions 228 are formed in recessed portions in the fin structure 204. The recessed portions may be formed by strained source drain (SSD) etching of the fin structure 204 and/or another type etching operation. The epitaxial regions 228 function as source or drain regions of the transistors included in the device 200.

The epitaxial regions 228 are electrically connected to metal source or drain contacts 230 of the transistors included in the device 200. The metal source or drain contacts (MDs) 230 include cobalt (Co), ruthenium (Ru), and/or another conductive or metal material. The transistors further include gates 232, which are formed of a polysilicon material, a metal (e.g., tungsten (W) or another metal), and/or another type of conductive material. In some implementations, the gates 232 may comprise multiple layers of material, such as multiple layers of metal or multiple layers including at least one polysilicon layer and at least one metal layer, among other examples. The metal source or drain contacts 230 and the gates 232 are electrically isolated by one or more sidewall spacers, including spacers 233 on each side of the metal source or drain contacts 230 and spacers 236 on each side of the gate 232. The spacers 233 and 236 include a silicon oxide ($SiO_x$), a silicon nitride ($SixN_y$), a silicon oxy carbide (SiOC), a silicon oxycarbonitride (SiOCN), and/or another suitable material. In some implementations, the spacers 233 are omitted from the sidewalls of the source or drain contacts 230.

As further shown in FIG. 2, the metal source or drain contacts 230 and the gates 232 are electrically connected to one or more types of interconnects. The interconnects electrically connect the transistors of the device 200 and/or electrically connect the transistors to other areas and/or components of the device 200. In some implementations, the interconnects electrically connect the transistors to a back end of line (BEOL) region of the device 200.

The metal source or drain contacts 230 are electrically connected to source or drain interconnects 238 (e.g., source or drain vias or VDs). One or more of the gates 232 are electrically connected to gate interconnects 240 (e.g., gate vias or VGs). The interconnects 238 and 240 include a conductive material such as tungsten, cobalt, ruthenium, copper, and/or another type of conductive material. In some implementations, the gates 232 are electrically connected to the gate interconnects 240 by gate contacts 242 (CB or MP) to reduce contact resistance between the gates 232 and the gate interconnects 240. The gate contacts 242 include tungsten (W), cobalt (Co), ruthenium (Ru), titanium (Ti), aluminum (Al), copper (Cu) or gold (Au), among other examples of conductive materials.

As further shown in FIG. 2, the interconnects 238 and 240 are electrically connected to a plurality of MEOL and BEOL layers, each including one or more metallization layers and/or vias. As an example, the interconnects 238 and 240 may be electrically connected to an M0 metallization layer that includes conductive structures 244 and 246. The M0 metallization layer is electrically connected to a V0 via layer that includes vias 248 and 250. The V0 via layer is electrically connected to an M1 metallization that includes conductive structures 252 and 254. In some implementations, the BEOL layers of the device 200 include additional metallization layers and/or vias that connect the device 200 to a package.

As further shown in FIG. 2, the device 200 includes one or more graphene caps 256, 258, 264, and 268. As used herein, "graphene" may refer to a single, two-dimensional sheet of carbon atoms or to a few two-dimensional sheets of carbon atoms stacked together without forming graphite bonds. The graphene caps may have a depth included in a range from approximately 2 Ångströms (Å) to approximately 15 Å. By selecting a depth of at least 2 Å, the graphene is protected from overgrowth by a corresponding ESL (e.g., ESL 212, ESL 216, ESL 220, or another ESL) during epitaxial growth of the corresponding ESL. Preventing epitaxial overgrowth of the corresponding ESL reduces contact resistance at the graphene cap. By selecting a depth of no more than 15 Å, the graphene does not significantly increase contact resistance. Selecting a depth of no more than 15 Å also shortens an amount of time, power, and chemicals consumed to deposit the graphene.

Additionally, or alternatively, and as further shown in FIG. 2, the device 200 includes one or more cobalt caps 260 and 262 to pre-diffuse cobalt into interconnects 238 and 240. The cobalt caps may have a depth included in a range from approximately 3 Ångströms (Å) to approximately 30 Å. By selecting a depth of at least 3 Å, the cobalt is protected from overgrowth by a corresponding ESL (e.g., ESL 212, ESL 216, ESL 220, or another ESL) during epitaxial growth of the corresponding ESL. Preventing epitaxial overgrowth of the corresponding ESL reduces contact resistance at the cobalt cap. Additionally, selecting a depth of at least 3 Å provides sufficient cobalt pre-diffusion to ensure that additional cobalt is not diffused from cobalt liners of metallization layers 244 and 246. By selecting a depth of no more than 30 Å, the cobalt does not significantly increase contact resistance. Selecting a depth of no more than 30 Å also shortens an amount of time, power, and chemicals consumed to deposit the cobalt.

As indicated above, FIG. 2 is provided as an example. Other examples may differ from what is described with regard to FIG. 2.

Figure 3:
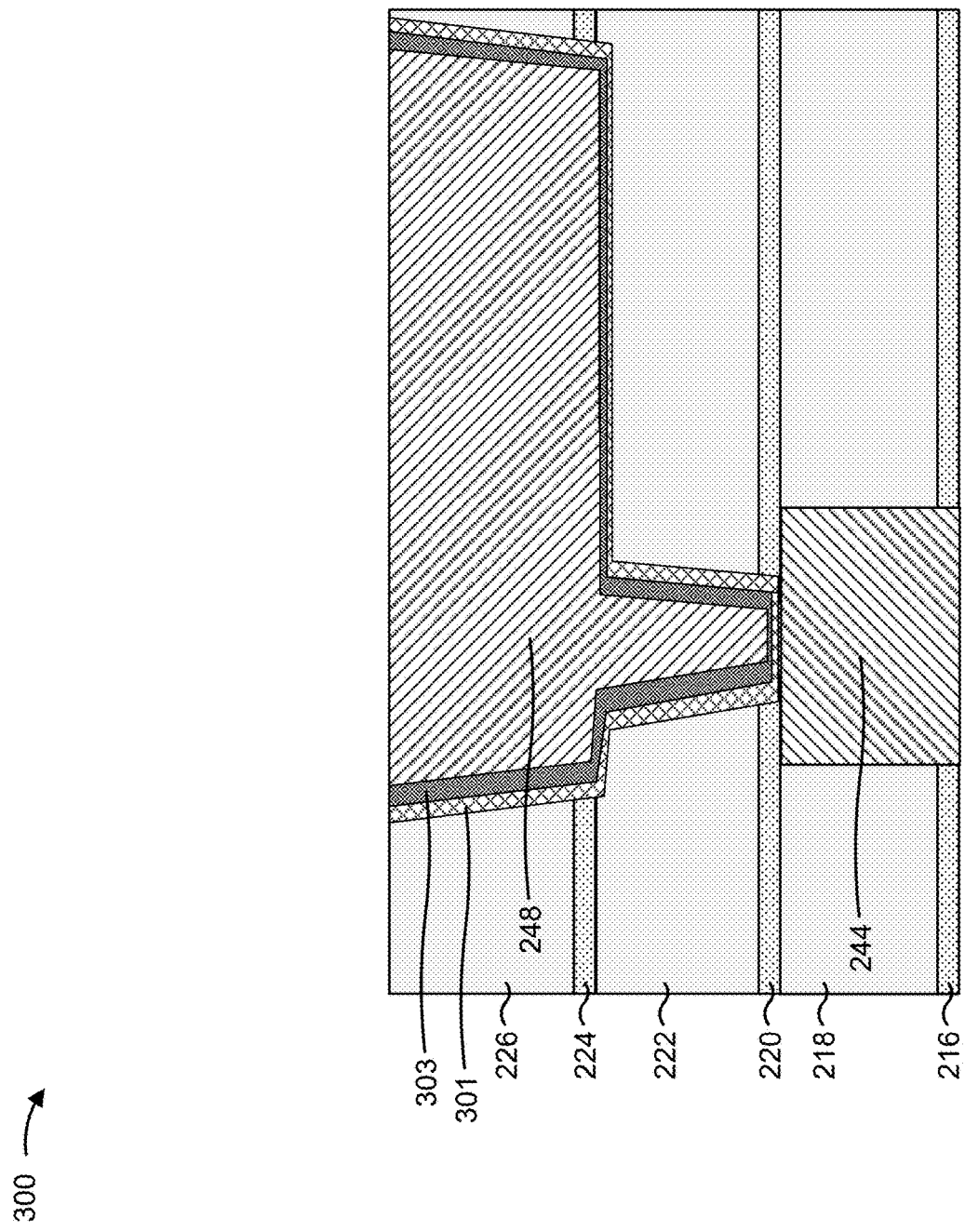
FIG. 3 is a diagram of an example semiconductor structure described herein.

FIG. 3 is a diagram of an example semiconductor structure 300 described herein. The semiconductor structure 300 includes a conductive structure 248 that is formed with a barrier layer 301 and a liner layer 303 over a conductive structure 244. Although described using the conductive structure 248 over the conductive structure 244 that connects to a source/drain contact 230 that is over source/drain 228, the description similarly applies to conductive structure 250 over a conductive structure 246 that connects to a gate contact 242 that is over gate 232. Additionally, or alternatively, the description similarly applies to higher-layer metallization layers in a BEOL other than the conductive structure 248 and/or the conductive structure 250 (or interconnects in an MEOL when the interconnects comprise copper).

As shown in FIG. 3, the conductive structure 248 may be formed in a dielectric layer 226 above an ESL 224 and formed in a dielectric layer 222 above an ESL 220. For example, the dielectric layers 222 and 226 may each include silicon oxycarbide (SiOC). The ESLs 220 and 224 may each include aluminum oxide ($Al_2O_3$), aluminum nitride (AlN), silicon nitride (SiN), silicon oxynitride ($SiO_xN_y$), aluminum oxynitride (AlON), and/or a silicon oxide ($SiO_x$). In some implementations, the ESL 220 and/or the ESL 224 include a plurality of ESL layers stacked together to function as an etch stop. The conductive structure 248 is electrically connected to the conductive structure 244 that is formed in a dielectric layer 218 above an ESL 216. For example, the dielectric layer 218 may include silicon oxycarbide (SiOC). The ESL 216 may include aluminum oxide ($Al_2O_3$), aluminum nitride (AlN), silicon nitride (SiN), silicon oxynitride ($SiO_xN_y$), aluminum oxynitride (AlON), and/or a silicon oxide ($SiO_x$).

Figure 4A:
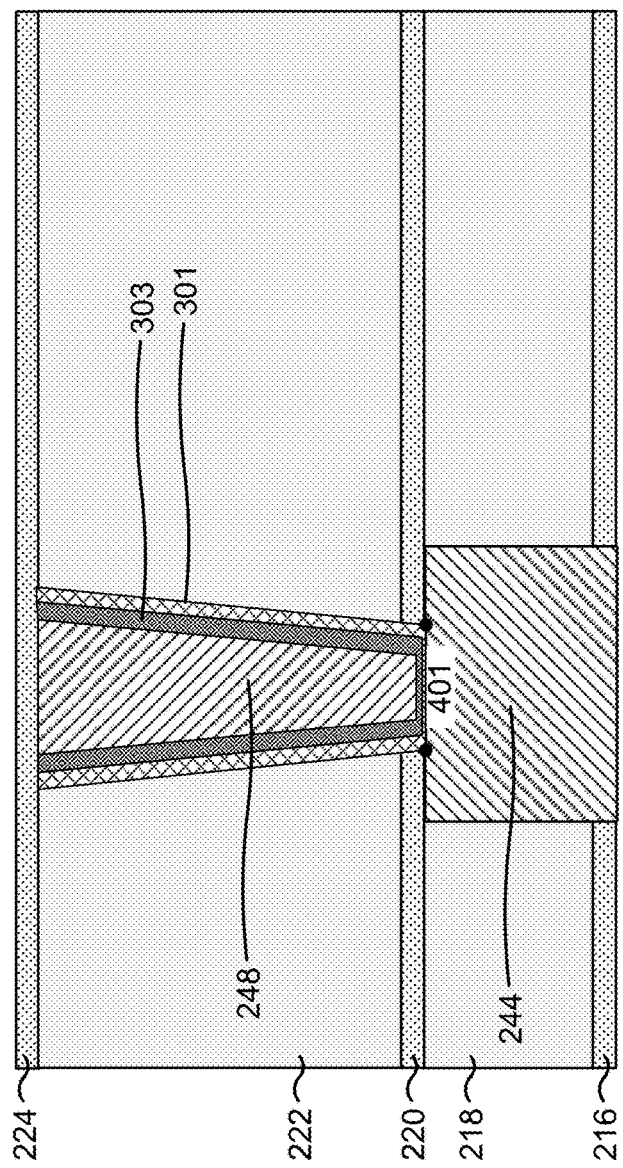
FIGS. 4A and 4B are diagrams of an example implementation described herein.

In some implementations, the conductive structure 248 is formed in a recess (e.g., recess 501 as described in connection with FIGS. 5A-5H). Sidewalls of the recess may form an angle from approximately 84 degrees to approximately 90 degrees. Selecting an angle of at least 84 degrees allows the conductive structure 248 to remain relatively narrow and conduct current faster. Selecting an angle of no more than 90 degrees allows for formation of material on sidewalls of the recess. Although depicted with the conductive structure 248 having a dual damascene profile, the description similarly applies to a conductive structure 248 having a single damascene profile (e.g., as depicted in FIG. 4A).

The barrier layer 301 may include tantalum (Ta), tantalum nitride (TaN), tantalum pentoxide ($Ta_2O_5$), titanium-tantalum alloy nitride (TaTiN), and/or titanium nitride (TiN), among other examples. The barrier layer 301 helps prevent diffusion of copper atoms from the conductive structure 248 to other layers. The barrier layer 301 may have a thickness in a range from approximately 8 Ångströms (Å) to approximately 25 Å. By selecting a thickness of at least 8 Å, the barrier layer 301 is thick enough to prevent copper diffusion from the conductive structure 248. By selecting a thickness of no more than 25 Å, the barrier layer 301 is thin enough such that the contact resistance between the conductive structure 248 and the conductive structure 244 is not significantly increased. Selecting a thickness of no more than 25 Å also shortens an amount of time, power, and chemicals consumed to deposit the barrier layer 301.

As described in connection with FIGS. 5A-5H, the barrier layer 301 may be formed using a combination of flash PVD and ALD. Accordingly, the barrier layer 301 may be thinner at a bottom surface of recess 501 as compared with sidewalls of recess 501. In some implementations, as shown in FIG. 3, the conductive structure 248 has a dual damascene profile such that the bottom surface includes at least a first portion that is lower in the dielectric layer 222 relative to a second portion. As an alternative, and as described in connection with FIG. 4A, the conductive structure 248 has a single damascene profile. In some implementations, a ratio of a thickness of the barrier layer 301 over the bottom surface to a thickness of the barrier layer 301 at the sidewalls may be in a range from approximately 0.5 to approximately 0.75 (such that the thickness of the barrier layer 301 over the bottom surface is no more than 75% of the thickness of the barrier layer 301 at the sidewalls). Selecting a ratio of at least 0.5 ensures that the barrier layer 301 is thick enough at the bottom surface to prevent copper diffusion. Selecting a ratio of no more than 0.75 ensures that the barrier layer 301 is thin enough at the bottom surface such that the contact resistance between the conductive structure 248 and the conductive structure 244 is not significantly increased. For example, the barrier layer 301 may have a thickness from approximately 5 Å to approximately 15 Å at the bottom surface.

In some implementations, the barrier layer 301 is adjacent to the liner layer 303. The liner layer 303 may include ruthenium to improve copper flow into the conductive structure 248. A ratio of a thickness of the barrier layer 301 to a thickness of the liner layer 303 may be in a range from approximately 0.5 to approximately 4.0. Selecting a ratio of at least 0.5 ensures that the barrier layer 301 is thin enough such that the contact resistance between the conductive structure 248 and the conductive structure 244 is not significantly increased and/or the liner layer 303 is thick enough to improve copper flow into the conductive structure 248. Selecting a ratio of no more than 4.0 ensures that the barrier layer 301 is thick enough to prevent copper diffusion from the conductive structure 248 and/or the liner layer 303 is thin enough such that the sheet resistance of the conductive structure 248 is not significantly increased. For example, the liner layer 303 may have a thickness from approximately 8 Å to approximately 20 Å.

As described in connection with FIGS. 5A-5H, the liner layer 303 may be formed in combination with a blocking process. Accordingly, the liner layer 303 may be thinner at a bottom surface of recess 501 as compared with sidewalls of recess 501. In some implementations, as shown in FIG. 3, the conductive structure 248 has a dual damascene profile such that the bottom surface includes at least a first portion that is lower in the dielectric layer 222 relative to a second portion. As an alternative, and as described in connection with FIG. 4A, the conductive structure 248 has a single damascene profile. In some implementations, a ratio of a thickness of the liner layer 303 over the bottom surface to a thickness of the liner layer 303 at the sidewalls may be in a range from approximately 0.3 to approximately 0.4 (such that the thickness of the liner layer 303 over the bottom surface is no more than 40% of the thickness of the liner layer 303 at the sidewalls). Selecting a ratio of at least 0.3 ensures that the liner layer 303 is thick enough at the bottom surface to improve copper flow into the recess 501. Selecting a ratio of no more than 0.4 ensures that the liner layer 303 is thin enough at the bottom surface such that the sheet resistance of the conductive structure 248 is not significantly increased. For example, the liner layer 303 may have a thickness from approximately 3 Å to approximately 8 Å at the bottom surface.

As indicated above, FIG. 3 is provided as an example. Other examples may differ from what is described with regard to FIG. 3.

FIG. 4A illustrates an example semiconductor structure 400 described herein. Semiconductor structure 400 is structurally similar to semiconductor structure 300, described in connection with FIG. 3, and is dimensioned as a circuit element. FIG. 4A illustrates the conductive structure 248 with a critical dimension represented by 401. The width 401 at a bottom surface of the conductive structure 248 may be in a range from approximately 10 nanometers (nm) to approximately 22 nm.

In some implementations, a recess in which the conductive structure 248 is formed (e.g., recess 501 as described in connection with FIGS. 5A-5H) may have a depth that is approximately equal to a thickness of the dielectric layer 222. A ratio of the depth to a thickness of the ESL 220 may be in a range from approximately two to approximately four. Selecting a ratio of at least two ensures that a sufficient volume of the recess 501 is occupied by copper of the conductive structure 248 to reduce resistivity of the conductive structure 248 and/or the ESL 220 is not too thick to prevent the conductive structure 248 from being formed through the ESL 220. Selecting a ratio of no more than four conserves a volume of copper used to form the conductive structure 248 and/or ensures that the ESL 220 is not too thin to stop unwanted etching through the ESL 220 and into the dielectric layer 218. For example, the depth may be in a range from approximately 200 Å to approximately 300 Å, and the thickness of the ESL 220 may be in a range from approximately 80 Å to approximately 120 Å.

Figure 4B:
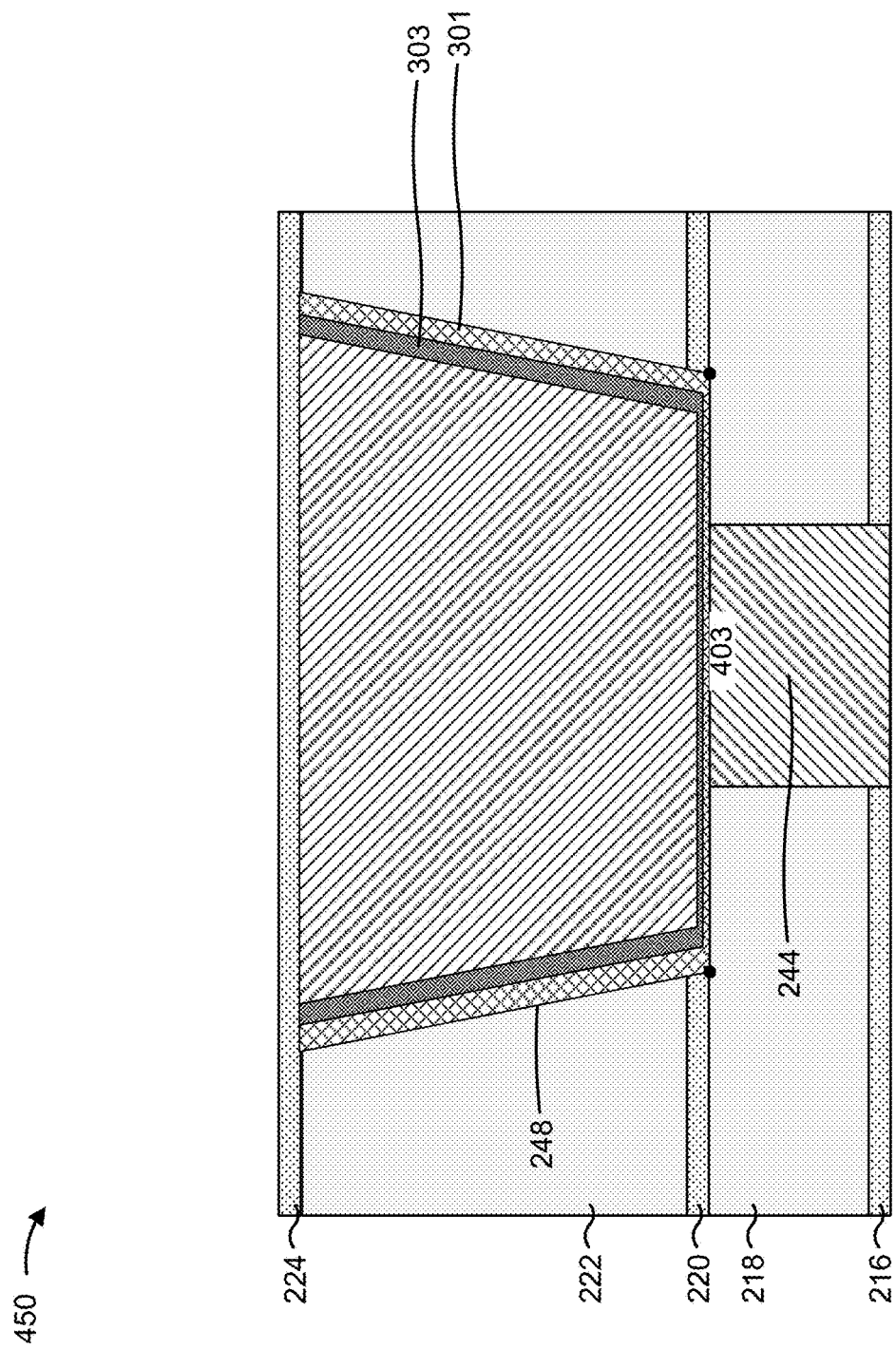

FIG. 4B illustrates an example semiconductor structure 450 described herein. Semiconductor structure 450 is structurally similar to semiconductor structure 300, described in connection with FIG. 3, and is dimensioned as a seal ring. FIG. 4B illustrates the conductive structure 248 with a critical dimension represented by 403. The width 403 at a bottom surface of the conductive structure 248 may be in a range from approximately 100 nm to approximately 180 nm.

As indicated above, FIGS. 4A and 4B are provided as examples. Other examples may differ from what is described with regard to FIGS. 4A and 4B.

FIGS. 5A-5H are diagrams of an example implementation 500 described herein. Example implementation 500 may be an example process for forming a conductive structure 248 over a conductive structure 244 and with a barrier layer 301 and a liner layer 303. The barrier layer 301 is formed thinner at an interface between the conductive structure 248 and the conductive structure 244 in order to reduce contact resistance, which in turn increases electrical performance of an electronic device including the conductive structure 248. Additionally, the liner layer 303 is formed thinner at the interface between the conductive structure 248 and the conductive structure 244 in order to reduce sheet resistance, which in turn increases electrical performance of an electronic device including the conductive structure 248.

Figure 5A:
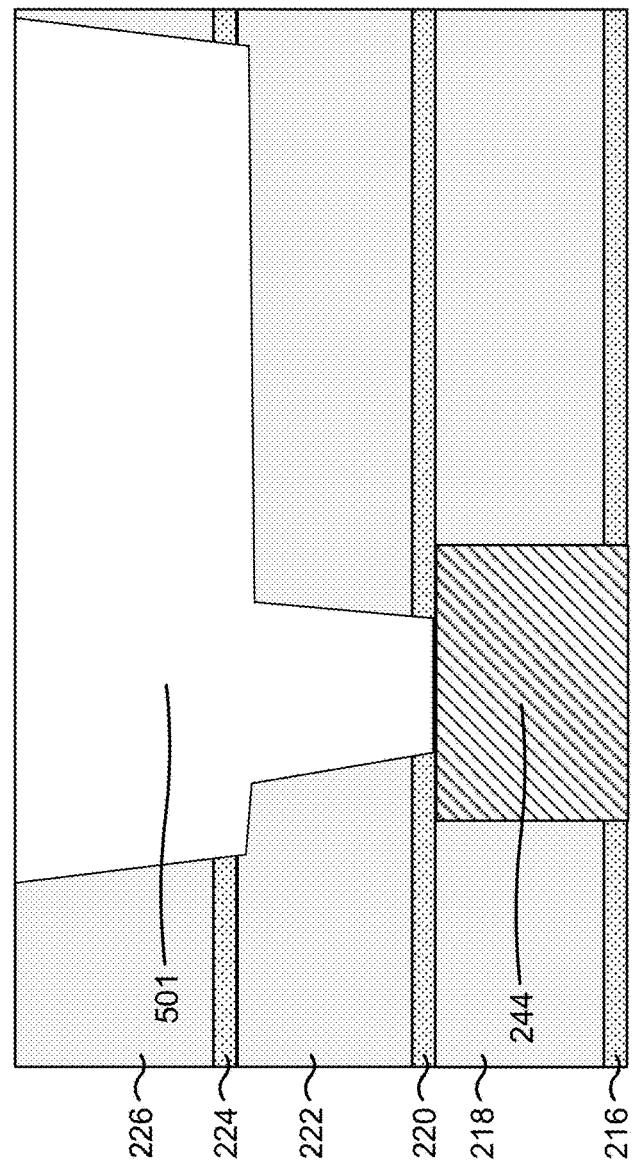
FIGS. 5A-5H are diagrams of an example implementation described herein.

As shown in FIG. 5A, the example process for forming the conductive structure 248 may be performed in connection with an MEOL. In some implementations, the MEOL includes a conductive structure 244 formed in a dielectric layer 218 that is above an ESL 216. Although described with respect to forming the conductive structure 248 over the conductive structure 244 that is connected to a source/drain contact 230 over source/drain 228, the description similarly applies to forming conductive structure 250 over the conductive structure 246 that is connected to a gate contact 242 over gate 232. Additionally, or alternatively, the description similarly applies to higher-layer metallization layers in a BEOL other than the conductive structure 248 and/or the conductive structure 250.

An ESL 220 may be formed over the dielectric layer 218 and the conductive structure 244. The deposition tool 102 may deposit the ESL 220 using a CVD technique, a PVD technique, an ALD technique, or another type of deposition technique. The planarization tool 110 may planarize the ESL 220 after the ESL 220 is deposited.

A dielectric layer 222 may be formed over the ESL 220. For example, the deposition tool 102 may deposit the dielectric layer 222 using a CVD technique, a PVD technique, an ALD technique, or another type of deposition technique. The planarization tool 110 may planarize the dielectric layer 222 after the dielectric layer 222 is deposited.

Similarly, for a dual damascene profile, an additional ESL 224 may be formed over the dielectric layer 222, and an additional dielectric layer 226 may be formed over the ESL 224.

As further shown in FIG. 5A, the dielectric layer 226 may be etched to form an opening (resulting in recess 501) such that the conductive structure 244 is at least partially exposed. For example, the deposition tool 102 may form a photoresist layer on the dielectric layer 226 (or on an ESL formed on the dielectric layer 226), the exposure tool 104 may expose the photoresist layer to a radiation source to pattern the photoresist layer, the developer tool 106 may develop and remove portions of the photoresist layer to expose the pattern, and the etch tool 108 may etch portions of the dielectric layer 226 to form the recess 501. In some implementations, a photoresist removal tool removes the remaining portions of the photoresist layer (e.g., using a chemical stripper, a plasma asher, and/or another technique) after the etch tool 108 etches the recess 501. For a dual damascene profile, as shown in FIG. 5A, the recess 501 may be formed using at least two separate etching steps.

Figure 5B:
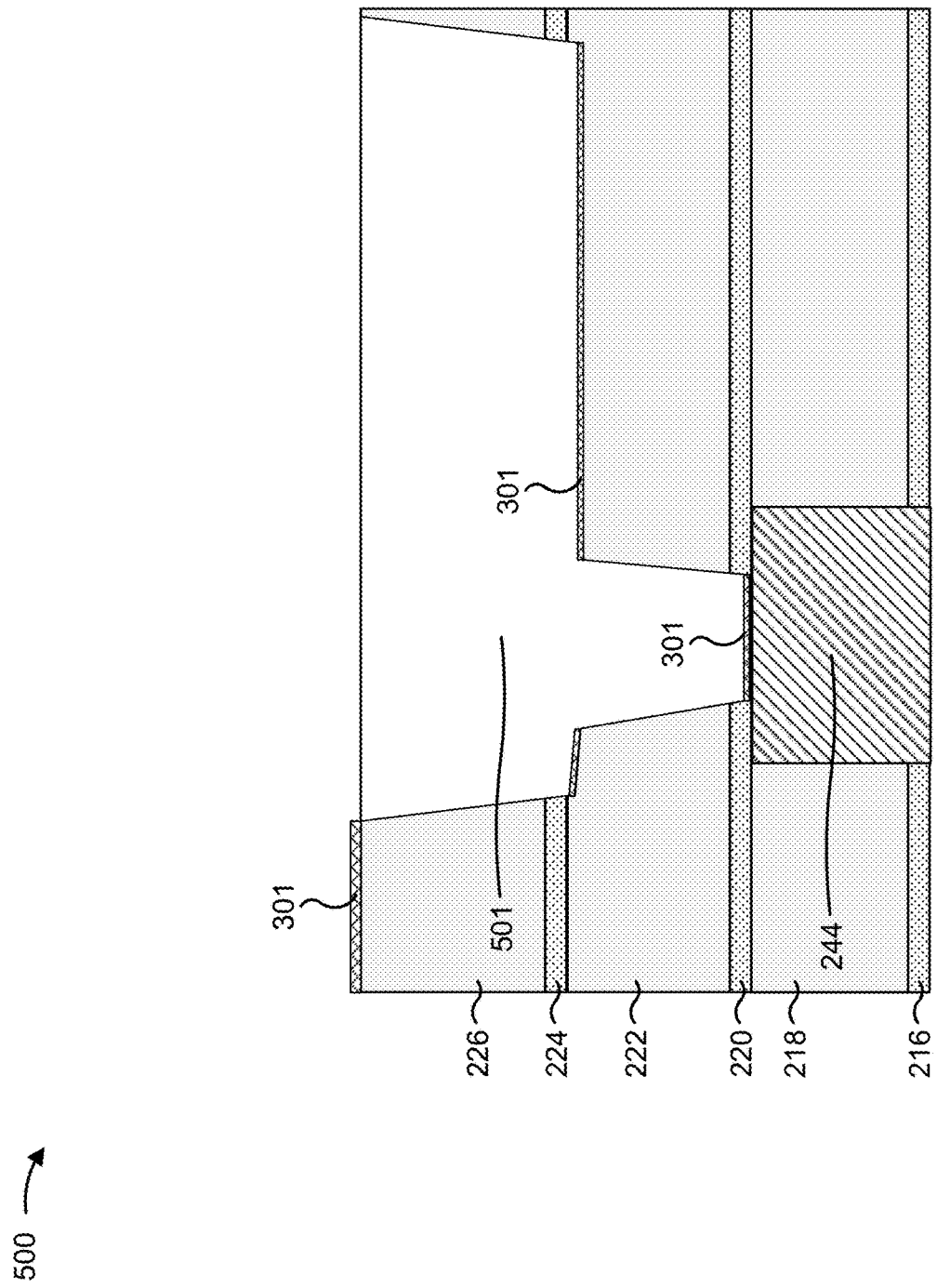

As shown in FIG. 5B, a barrier layer 301 may be formed on a bottom surface of the recess 501. The deposition tool 102 may deposit the barrier layer 301 using a flash PVD process. For example, the deposition tool 102 may deposit the barrier layer 301 using directional deposition such that the barrier layer 301 is deposited on the bottom surface, but not sidewalls, of the recess 501. In some implementations, as shown in FIG. 5B the barrier layer 301 is deposited on the dielectric layer 226 as well.

Figure 5C:
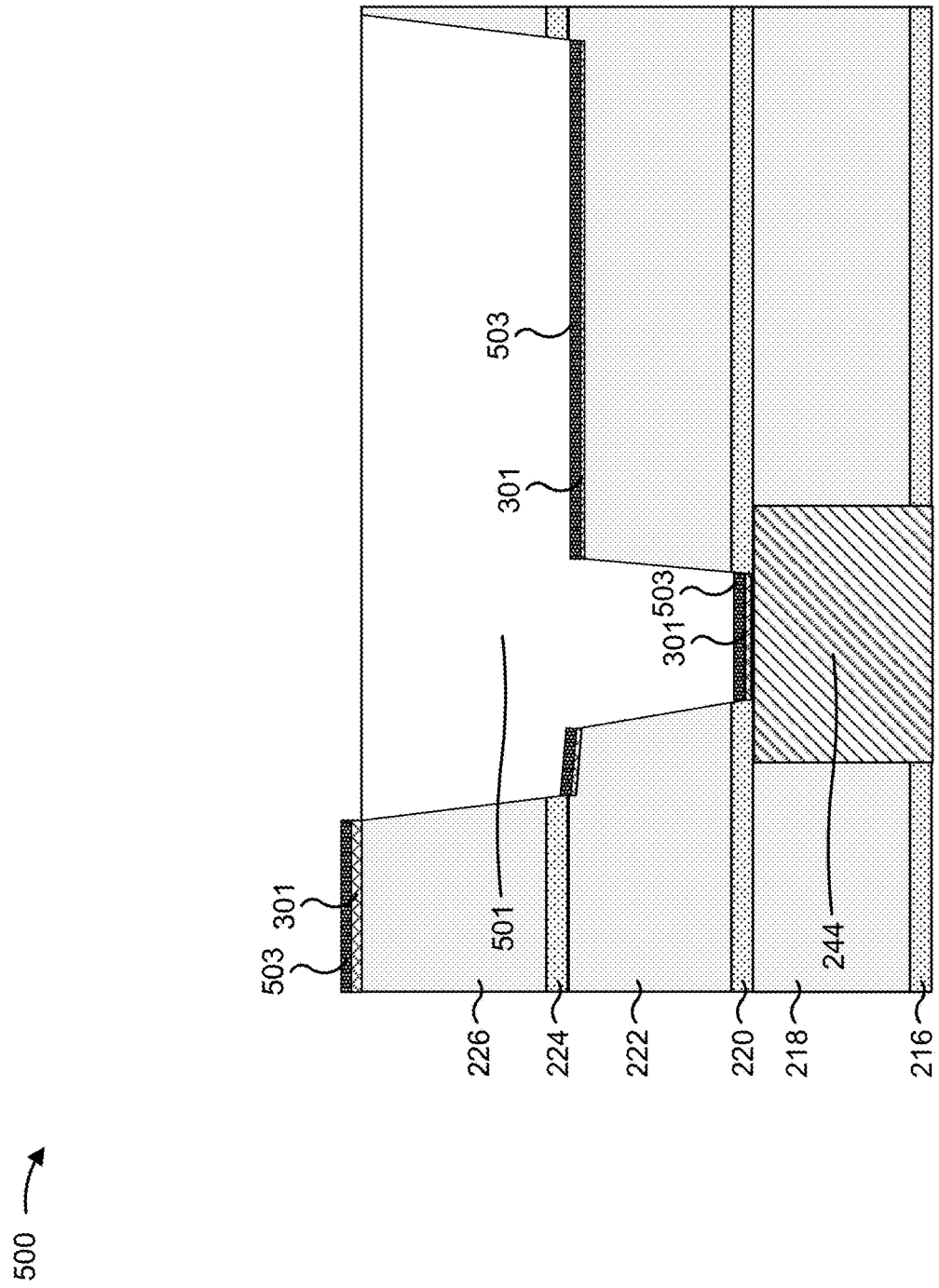

As shown in FIG. 5C, a blocking layer 503 may be formed over the barrier layer 301. The deposition tool 102 may deposit the blocking layer 503 using a CVD technique, a PVD technique, an ALD technique, or another type of deposition technique. In some implementations, the blocking layer 503 includes benzotriazole, 5-Decyne, and/or another material that includes one portion that bonds to the barrier layer 301 and another portion that repels the barrier layer 301 (as well as liner layer 303, as described in greater detail below). The blocking layer 503 may selectively deposit on the barrier layer 301 and not on the dielectric layer 222 because one or more chemicals comprising the blocking layer 503 (and/or one or more precursor materials used to deposit the blocking layer 503) bind with the barrier layer 301 but not to dielectric layer 222.

Figure 5D:
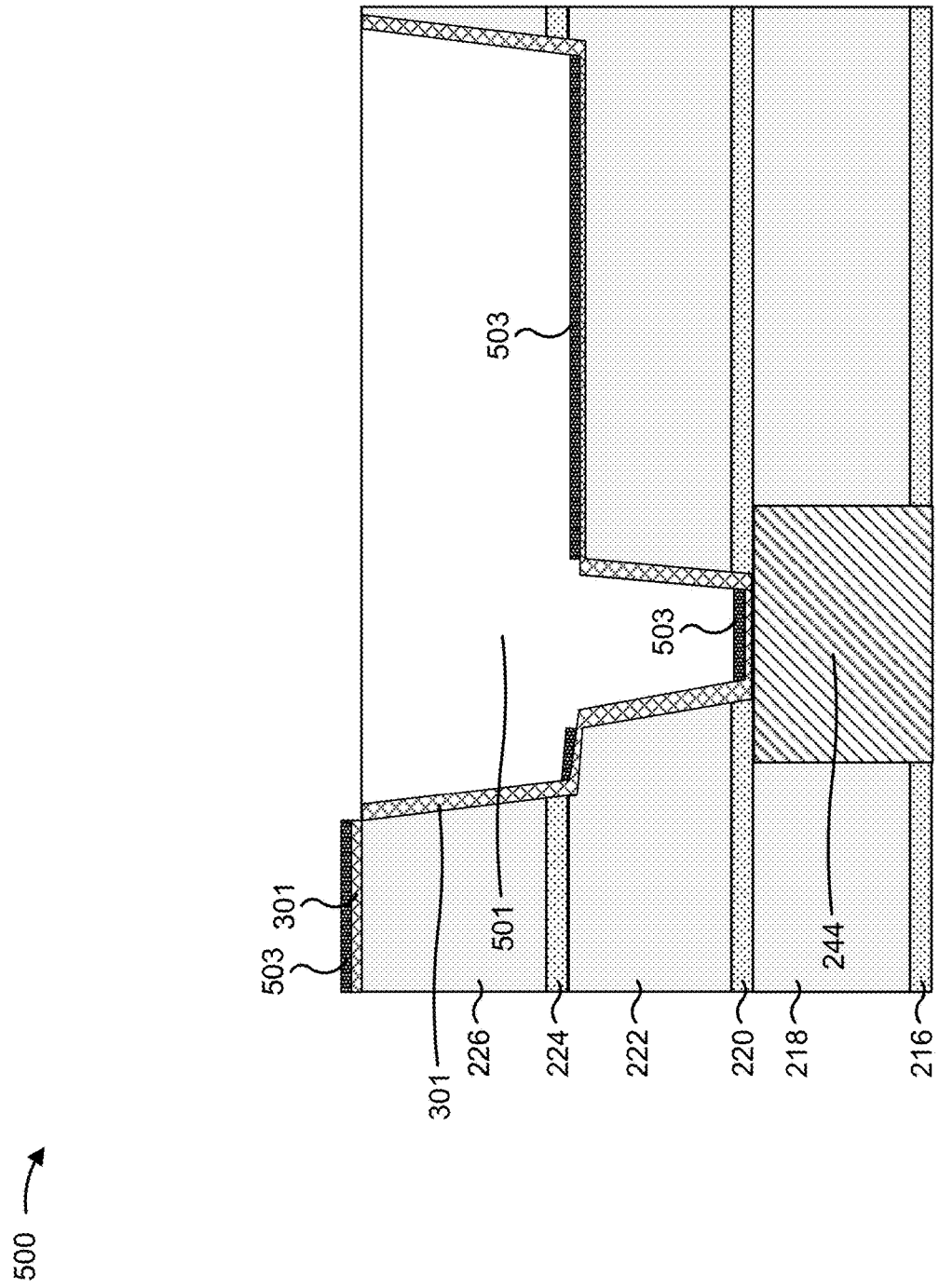

As shown in FIG. 5D, the barrier layer 301 is further formed on the sidewalls of the recess 501. The deposition tool 102 may deposit the barrier layer 301 using a CVD technique, a PVD technique, an ALD technique, or another type of deposition technique. As described above, the blocking layer 503 repels the barrier layer 301 such that the barrier layer 301 is deposited (e.g., via epitaxial growth) on the sidewalls but not on the bottom surface.

Figure 5E:
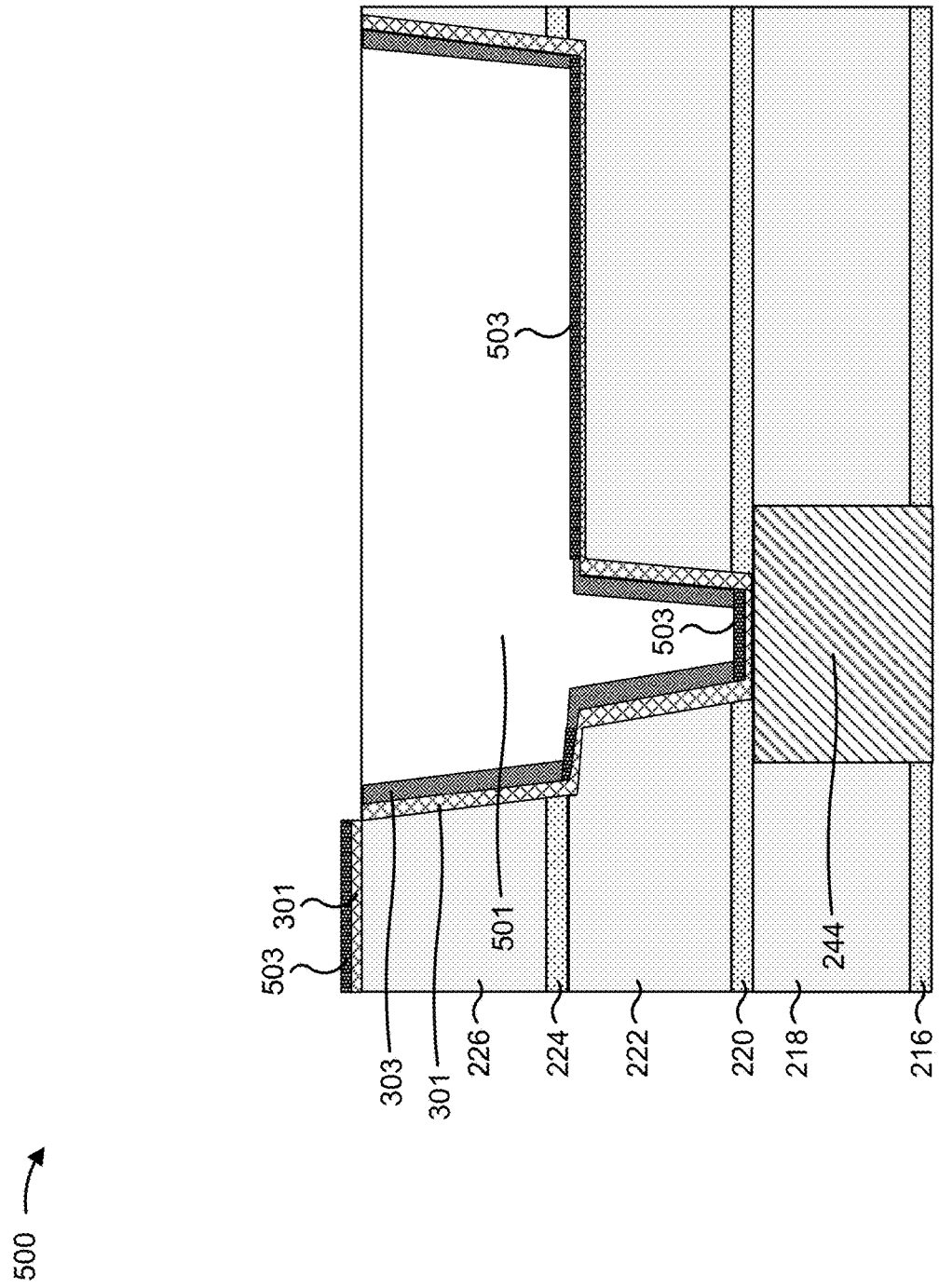

As shown in FIG. 5E, the liner layer 303 is further formed on the sidewalls of the recess 501. The deposition tool 102 may deposit the liner layer 303 using a CVD technique, an ALD technique, or another type of deposition technique. As described above, the blocking layer 503 repels the liner layer 303 such that the liner layer 303 is thicker on the sidewalls as compared with the bottom surface.

Figure 5F:
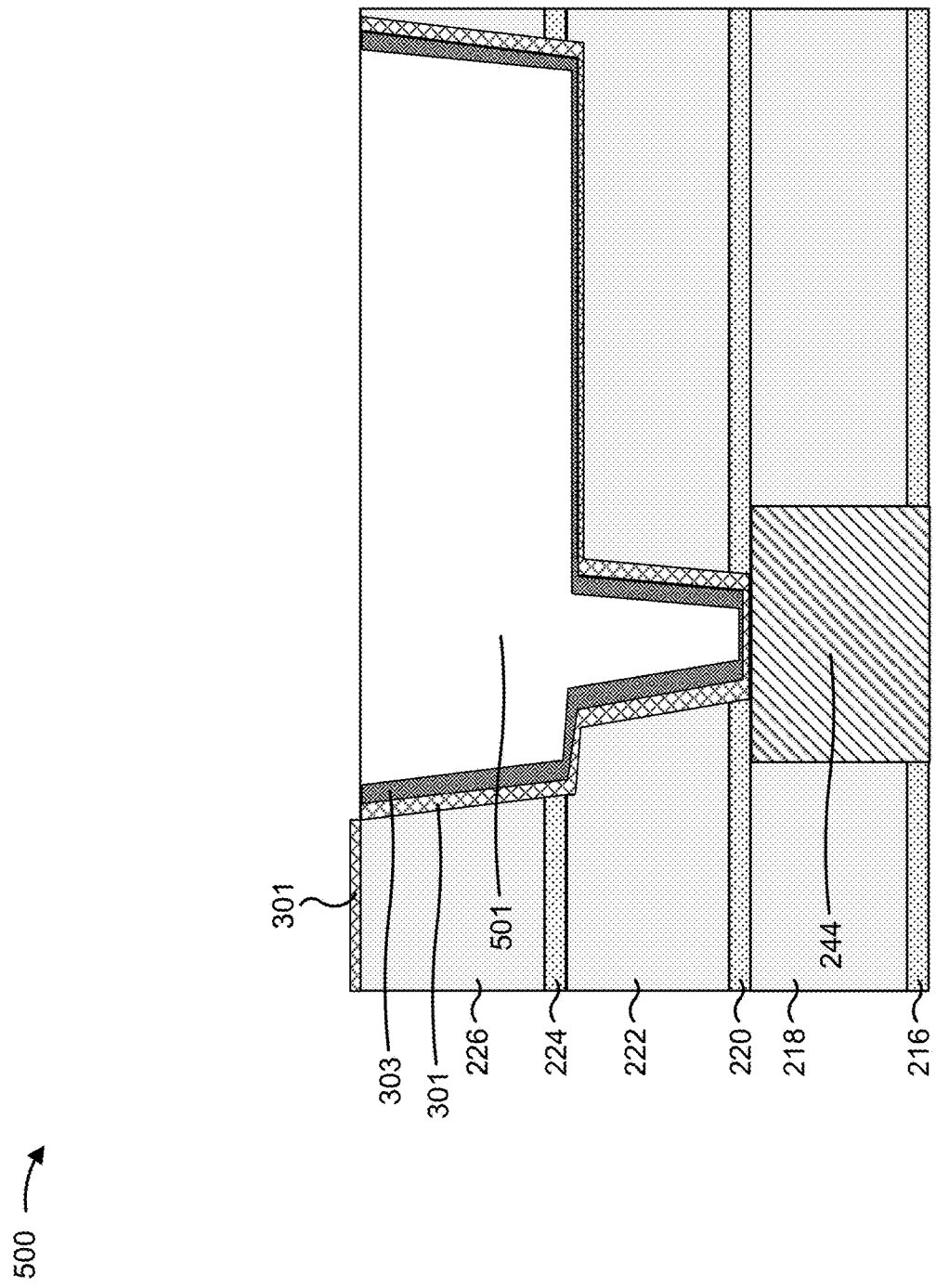

As shown in FIG. 5F, the blocking layer 503 may be selectively etched. In some implementations, the etch tool 108 performs dry etching using a plasma, such as a hydrogen ($H_2$) or ammonia ($NH_3$) plasma. The plasma may chemically interact with the blocking layer 503 but not with the barrier layer 301 or the liner layer 303. Accordingly, the etch tool 108 may etch the blocking layer 503 and not other layers.

Regardless, some blocking material may remain at the bottom surface of the recess 501. Accordingly, trace amounts of benzotriazole, 5-Decyne, and/or another blocking material may be detectable at an interface between the conductive structure 238 and the conductive structure 248.

Figure 5G:
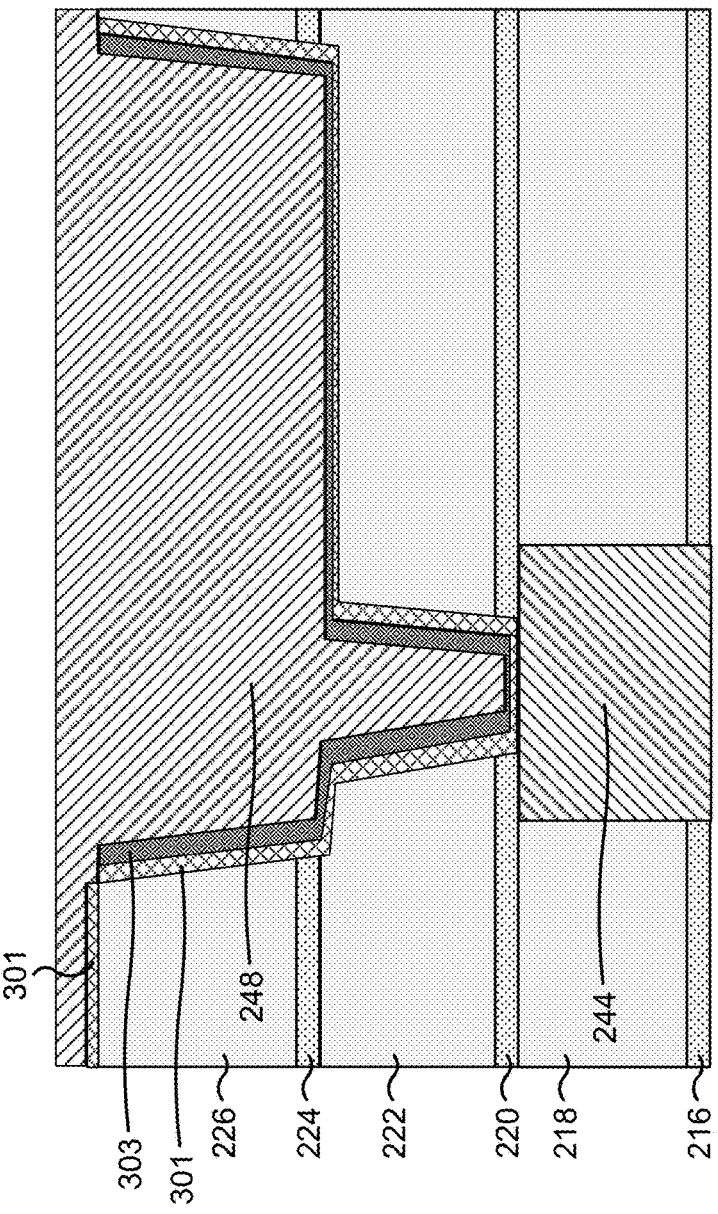

As shown in FIG. 5G, the conductive structure 248 may be formed in the recess 501 and over the barrier layer 301 and the liner layer 303. The deposition tool 102 may deposit copper of the conductive structure 248 using a CVD technique, a PVD technique, an ALD technique, or another type of deposition technique, the plating tool 112 may deposit the copper of the conductive structure 248 using an electroplating operation, or a combination thereof.

Figure 5H:
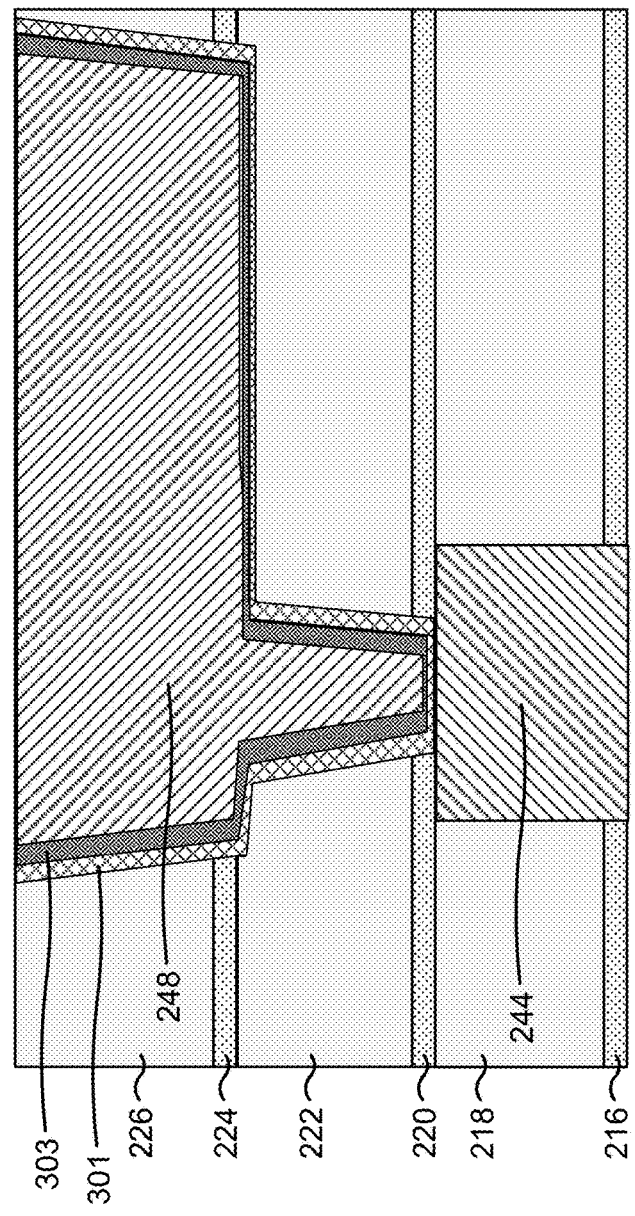

In some implementations, the copper flows over the dielectric layer 226 as well as into the recess 501. Accordingly, as shown in FIG. 5H, the conductive structure 248 may be planarized. The planarization tool 110 may planarize the conductive structure 248 after the conductive structure 248 is deposited. Additionally, portions of the barrier layer 301 (and any portions of the liner layer 303) deposited over the dielectric layer 226 may be removed during planarization. In some implementations, the planarization tool 110 uses CMP.

By using techniques as described in connection with FIGS. 5A-5H, the barrier layer 301 prevents diffusion of copper from the conductive structure 248, which reduces resistivity of the conductive structure 238, and the liner layer 303 improves a flow of copper into the recess 501, and the barrier layer 301 and the liner layer 303 are thinner at the bottom surface of the recess 501 as compared with the sidewalls in order to reduce contact resistance between the conductive structure 248 and the conductive structure 244.

As indicated above, FIGS. 5A-5H are provided as an example. Other examples may differ from what is described with regard to FIGS. 5A-5H. For example, in some implementations, an additional liner material, such as cobalt, may be included. An additional liner of cobalt improves EM lifetime of the conductive structure 248 by further preventing copper atom migration. In some implementations, a liner may be formed of Ru, Co, RuCo, or the like.

In this way, a barrier layer is selectively formed on a bottom surface of a recess (e.g., in which a BEOL conductive structure will be formed) such that a ruthenium liner is selectively deposited on sidewalls of the BEOL conductive structure but thinner on the bottom surface. The barrier layer prevents diffusion of metal ions from the BEOL conductive structure and is thinner at the bottom surface as compared to the sidewalls in order to reduce contact resistance. The ruthenium liner improves copper flow into the BEOL conductive structure and is thinner at the bottom surface in order to further reduce contact resistance.

Figure 6A:
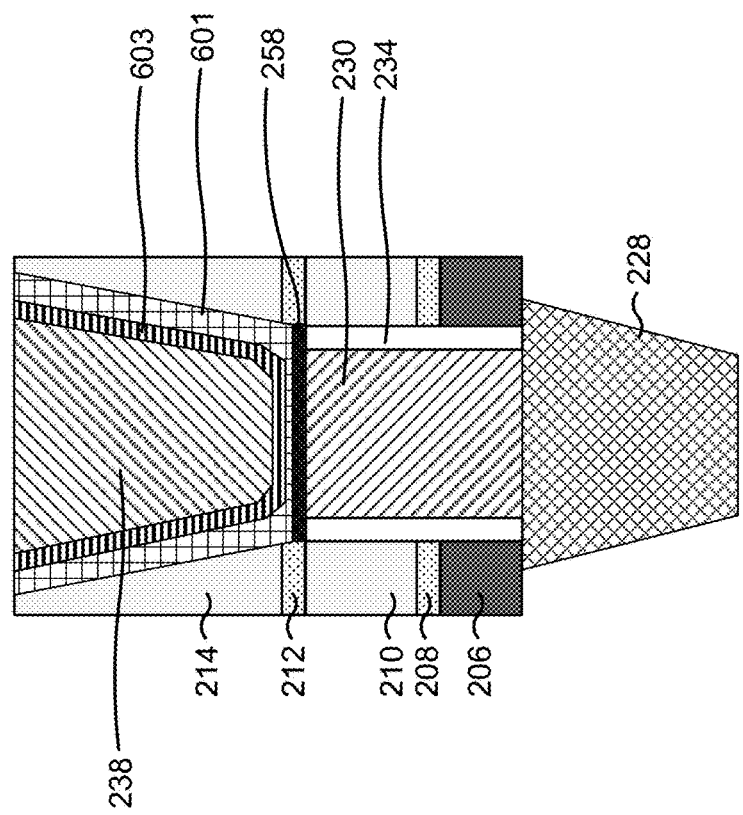
FIGS. 6A and 6B are diagram of an example conductive structure described herein.

FIG. 6A is a diagram of an example semiconductor structure 600 described herein. The semiconductor structure 600 includes a conductive structure 238 that is formed with a barrier layer 601 and a liner material 603 over a contact 230 that is formed with the liner 234 and a graphene cap 258. Although described using the conductive structure 238 over the source/drain contact 230 that is over source/drain 228, the description similarly applies to conductive structure 240 over gate contact 242 over gate 232 that is formed with a graphene cap 256.

The graphene cap 258 may have a thickness from approximately 2 Å to approximately 15 Å. Selecting a thickness of at least 2 Å may prevent diffusion from the copper of the upper conductive structure 238 or the cobalt of the liner material 603 to the Ru-based liner 234. As a result, electrical performance of the conductive structure 238 is improved. Selecting a thickness of no more than 15 Å prevents the graphene cap 258 from significantly increasing the contact resistance between the conductive structure 238 and the contact 230.

As shown in FIG. 6A, the conductive structure 238 may be formed in a dielectric layer 214. For example, the dielectric layer 214 may include silicon oxycarbide (SiOC). The conductive structure 238 is electrically connected to the contact 230 that is formed in a dielectric layer 210 below an ESL 212 and in a dielectric layer 206 below an ESL 208. The ESLs 208 and 212 may each include aluminum oxide ($Al_2O_3$), aluminum nitride (AlN), silicon nitride (SiN), silicon oxynitride ($SiO_xN_y$), aluminum oxynitride (AlON), and/or a silicon oxide ($SiO_x$). In some implementations, the ESL 208 and/or the ESL 212 include a plurality of ESL layers stacked together to function as an etch stop.

In some implementations, the conductive structure 238 is formed in a recess (e.g., recess 802 as described in connection with FIGS. 8A-8E). Sidewalls of the recess may form an angle from approximately 84 degrees to approximately 90 degrees. Selecting an angle of at least 84 degrees allows the conductive structure 238 to remain relatively narrow and conduct current faster. Selecting an angle of no more than 90 degrees allows for formation of material on sidewalls of the recess. Accordingly, a ratio of a width at the top of the recess to a width at the bottom of the recess may be from approximately 1.03 to approximately 1.2.

The recess 802 may have a depth that may be approximately equal to a thickness of the dielectric layer 214. A ratio of the depth to a thickness of the ESL 212 may be in a range from approximately four to approximately ten. Selecting a ratio of at least four ensures that a sufficient volume of the recess 802 is occupied by copper of the conductive structure 238 to reduce resistivity of the conductive structure 238 and/or the ESL 212 is not too thick to prevent the conductive structure 238 from being formed through the ESL 212. Selecting a ratio of no more than ten conserves a volume of copper used to form the conductive structure 238 and/or ensures that the ESL 212 is not too thin to stop unwanted etching through the ESL 212 and into the dielectric layer 210. For example, the depth may be in a range from approximately 200 Å to approximately 300 Å, and the thickness of the ESL 212 may be in a range from approximately 15 Å to approximately 40 Å.

The barrier layer 601 may include tantalum (Ta), tantalum nitride (TaN), tantalum pentoxide ($Ta_2O_5$), titanium-tantalum alloy nitride (TaTiN), and/or titanium nitride (TiN), among other examples. The barrier layer 601 helps prevent diffusion of copper atoms from the conductive structure 238 to other layers. A ratio of a thickness of the barrier layer 601 to a thickness of the graphene cap 258 may be in a range from approximately 0.50 to approximately 10.0. Selecting a ratio of at least 0.50 ensures that the graphene cap 258 is thin enough such that the contact resistance between the conductive structure 238 and the contact 230 is not significantly increased and/or the barrier layer 601 is thick enough to prevent copper diffusion. Selecting a ratio of no more than 10.0 ensures that the graphene cap 258 is thick enough to prevent diffusion from the copper of the upper conductive structure 238 and/or the barrier layer 601 is thin enough such that the contact resistance between the conductive structure 238 and the contact 230 is not significantly increased. For example, the barrier layer 601 may have a thickness from approximately 8 Å to approximately 20 Å.

In some implementations, the barrier layer 601 may form less effectively on the graphene cap 258 as compared with sidewalls of the recess 802. Accordingly, a ratio of a thickness of the barrier layer 601 over the graphene cap 258 to a thickness of the barrier layer 601 at other locations may be in a range from approximately 0.3 to approximately 0.5. Selecting a ratio of at least 0.3 ensures that the barrier layer 601 is thin enough such that the contact resistance between the conductive structure 238 and the contact 230 is not significantly increased. Selecting a ratio of no more than 0.5 ensures that the barrier layer 601 is thick enough to prevent copper diffusion. For example, the barrier layer 601 may have a thickness from approximately 3 Å to approximately 10 Å over the graphene cap 258.

In some implementations, the barrier layer 601 is adjacent to the liner material 603. The liner material 603 may include cobalt to help sheet resistance of the conductive structure 238 in combination with ruthenium to help prevent diffusion of cobalt atoms to other layers. A ratio of a thickness of the ruthenium to a thickness of the graphene cap 258 may be in a range from approximately 0.3 to approximately 7.5. Selecting a ratio of at least 0.3 ensures that the graphene cap 258 is thin enough such that the contact resistance between the conductive structure 238 and the contact 230 is not significantly increased and/or the ruthenium is thick enough to prevent cobalt diffusion. Selecting a ratio of no more than 7.5 ensures that the graphene cap 258 is thick enough to prevent diffusion from the copper of the upper conductive structure 238 and/or the ruthenium is thin enough such that the sheet resistance of the conductive structure 238 is not significantly increased. For example, the ruthenium may have a thickness from approximately 5 Å to approximately 15 Å.

As an alternative, the liner material 603 may include cobalt to help sheet resistance of the conductive structure 238, without ruthenium. A ratio of a thickness of the cobalt to a thickness of the graphene cap 258 may be in a range from approximately 0.3 to approximately 7.5. Selecting a ratio of at least 0.3 ensures that the graphene cap 258 is thin enough such that the contact resistance between the conductive structure 238 and the contact 230 is not significantly increased and/or the cobalt is thick enough to reduce sheet resistance of the conductive structure 238. Selecting a ratio of no more than 7.5 ensures that the graphene cap 258 is thick enough to prevent diffusion from the copper of the upper conductive structure 238 and/or the cobalt is thin enough such that too many cobalt atoms do not diffuse from the cobalt liner. For example, the cobalt liner may have a thickness from approximately 5 Å to approximately 15 Å.

Figure 6B:
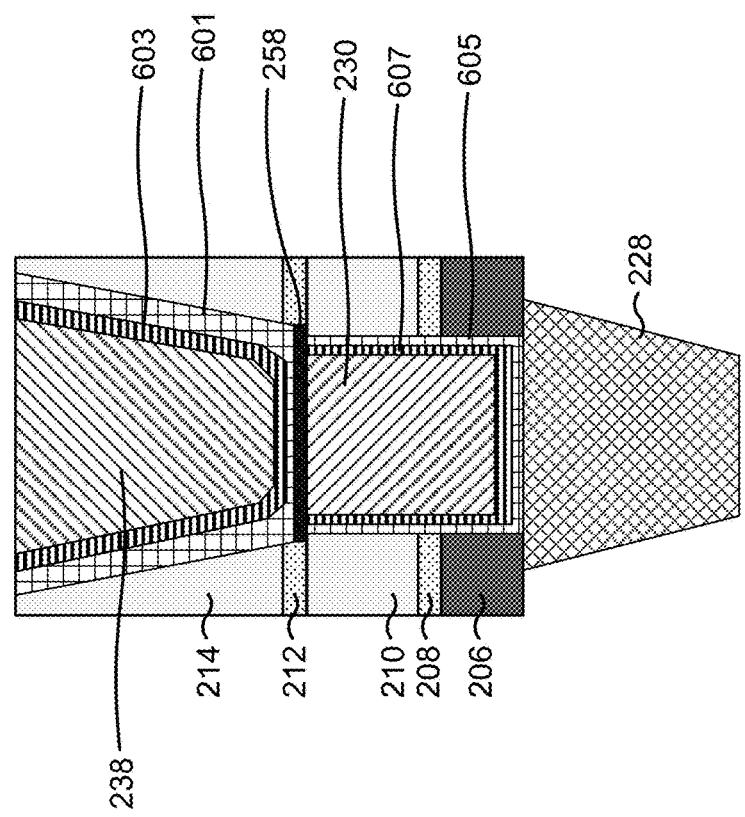

FIG. 6B is a diagram of an example semiconductor structure 650 described herein. The semiconductor structure 650 is similar to semiconductor structure 600 except that the contact 230 includes a barrier layer 605 and/or a liner material 607. Although described using the conductive structure 238 over the source/drain contact 230 that is over source/drain 228, the description similarly applies to conductive structure 240 over gate contact 242 over gate 232 that is formed with a graphene cap 256.

The barrier layer 605 may include tantalum (Ta), tantalum nitride (TaN), tantalum pentoxide ($Ta_2O_5$), titanium-tantalum alloy nitride (TaTiN), and/or titanium nitride (TiN), among other examples. The barrier layer 605 helps prevent diffusion of copper atoms from the contact 230 to other layers. A ratio of a thickness of the barrier layer 605 to a thickness of the graphene cap 258 may be in a range from approximately 0.3 to approximately 7.5. Selecting a ratio of at least 0.3 ensures that the graphene cap 258 is thin enough such that the contact resistance between the conductive structure 238 and the contact 230 is not significantly increased and/or the barrier layer 605 is thick enough to prevent copper diffusion. Selecting a ratio of no more than 7.5 ensures that the graphene cap 258 is thick enough to prevent diffusion from the copper of the upper conductive structure 238 and/or the barrier layer 605 is thin enough such that the contact resistance between the contact 230 and the source/drain 228 is not significantly increased. For example, the barrier layer 605 may have a thickness from approximately 5 Å to approximately 15 Å.

Additionally, or alternatively, the contact 230 may be adjacent to the liner material 607. The liner material 607 may include ruthenium when the contact 230 comprises cobalt or copper. As an alternative, the contact 230 may comprise bulk ruthenium. The liner material 607 helps prevent diffusion of cobalt atoms to other layers. A ratio of a thickness of the liner material 607 to a thickness of the graphene cap 258 may be in a range from approximately 0.6 to approximately 15.0. Selecting a ratio of at least 0.6 ensures that the graphene cap 258 is thin enough such that the contact resistance between the conductive structure 238 and the contact 230 is not significantly increased and/or the liner material 607 is thick enough to prevent cobalt diffusion for the contact 230. Selecting a ratio of no more than 15.0 ensures that the graphene cap 258 is thick enough to prevent diffusion from the copper of the upper conductive structure 238 and/or the liner material 607 is thin enough such that the sheet resistance of the contact 230 is not significantly increased. For example, the ruthenium may have a thickness from approximately 10 Å to approximately 30 Å.

As indicated above, FIGS. 6A and 6B are provided as examples. Other examples may differ from what is described with regard to FIGS. 6A and 6B.

Figure 7A:
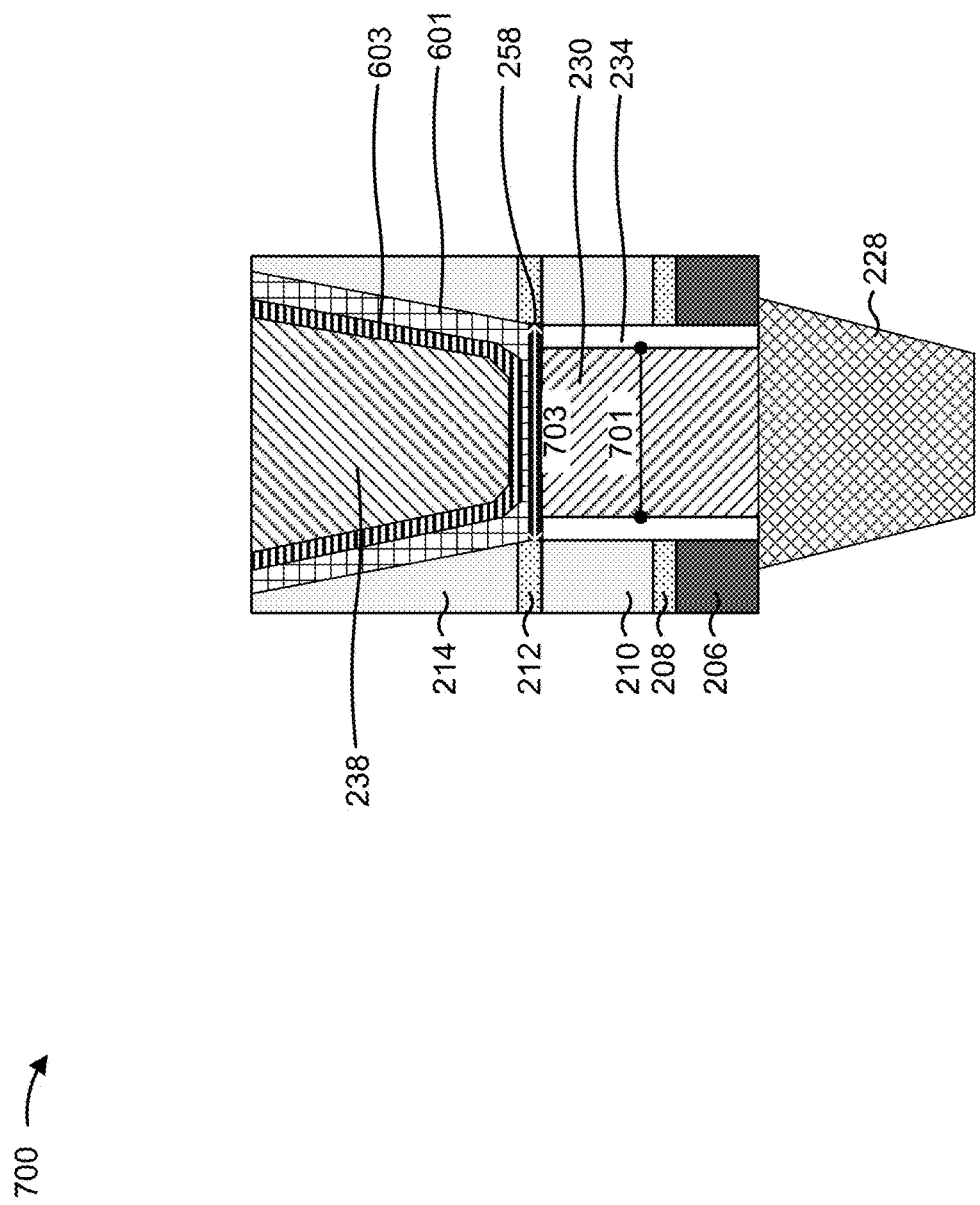
FIGS. 7A and 7B are diagram of an example conductive structure described herein.

FIG. 7A illustrates an example semiconductor structure 700 described herein. Semiconductor structure 700 is structural similar to semiconductor structure 600, described in connection with FIG. 6A, and is dimensioned as a circuit element. FIG. 7A illustrates the contact 230 with a critical dimension represented by 701 and the conductive structure 238 with a critical dimension represented by 703. The width 701 at a top surface of the contact 230 may be smaller than the width 703 at a bottom surface of the conductive structure 238. Accordingly, the conductive structure 238 may funnel electric potential towards the contact 230 to activate current through the source/drain 228. In one example, the width 701 may be in a range from approximately 6 nanometers (nm) to approximately 15 nm, and the width 703 may be in a range from approximately 8 nm to approximately 22 nm. Selecting a critical dimension 703 of at least 8 nm allows for easier control of EUV and other fabrication processes. Selecting a critical dimension 703 of no more than 22 nm provides for sufficient miniaturization of a semiconductor device including the semiconductor structure 400.

Figure 7B:
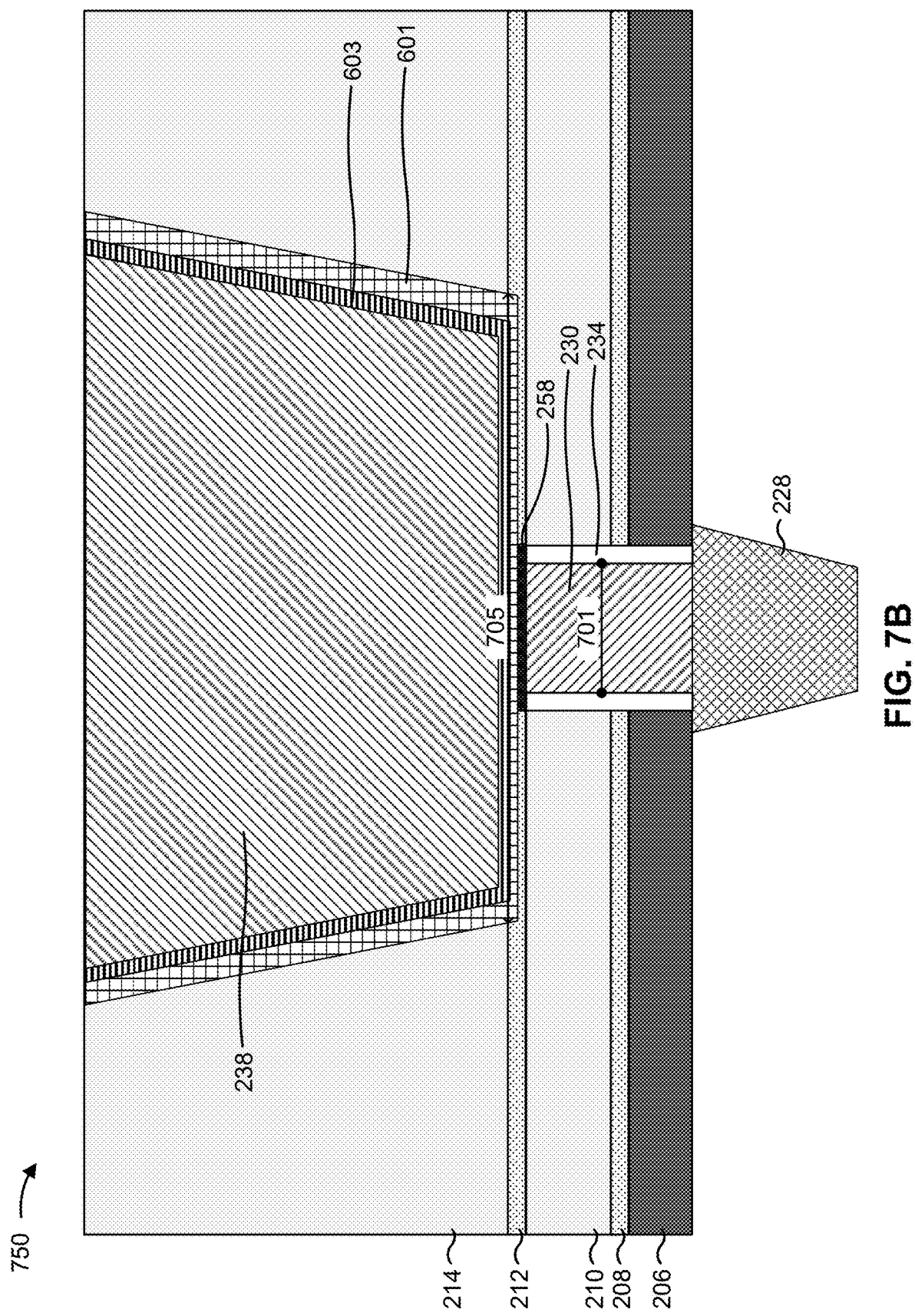

FIG. 7B illustrates an example semiconductor structure 750 described herein. Semiconductor structure 750 is structural similar to semiconductor structure 600, described in connection with FIG. 6A, and is dimensioned as a seal ring. FIG. 7B illustrates the contact 230 with a critical dimension represented by 701 and the conductive structure 238 with a critical dimension represented by 705. The width 701 at a top surface of the contact 230 may be smaller than the width 705 at a bottom surface of the conductive structure 238. Accordingly, the conductive structure 238 may funnel electric potential towards the contact 230 to activate current through the source/drain 228. In one example, the width 701 may be in a range from approximately 6 nm to approximately 15 nm, and the width 705 may be in a range from approximately 100 nm to approximately 180 nm. Selecting a critical dimension 705 of at least 100 nm electrically insulates the semiconductor structure 750 from neighboring semiconductor structures in a same semiconductor device. Selecting a critical dimension 703 of no more than 180 nm provides for sufficient miniaturization of the semiconductor device including the semiconductor structure 750.

As indicated above, FIGS. 7A and 7B are provided as examples. Other examples may differ from what is described with regard to FIGS. 7A and 7B.

FIGS. 8A-8E are diagrams of an example implementation 800 described herein. Example implementation 800 may be an example process for forming a conductive structure 238 over a contact 230 with a graphene cap 258. The graphene cap 258 reduces contact resistance, which increases electrical performance of an electronic device including the conductive structure 238. Additionally, the graphene cap 258 prevents copper diffusion from the conductive structure 238.

Figure 8A:
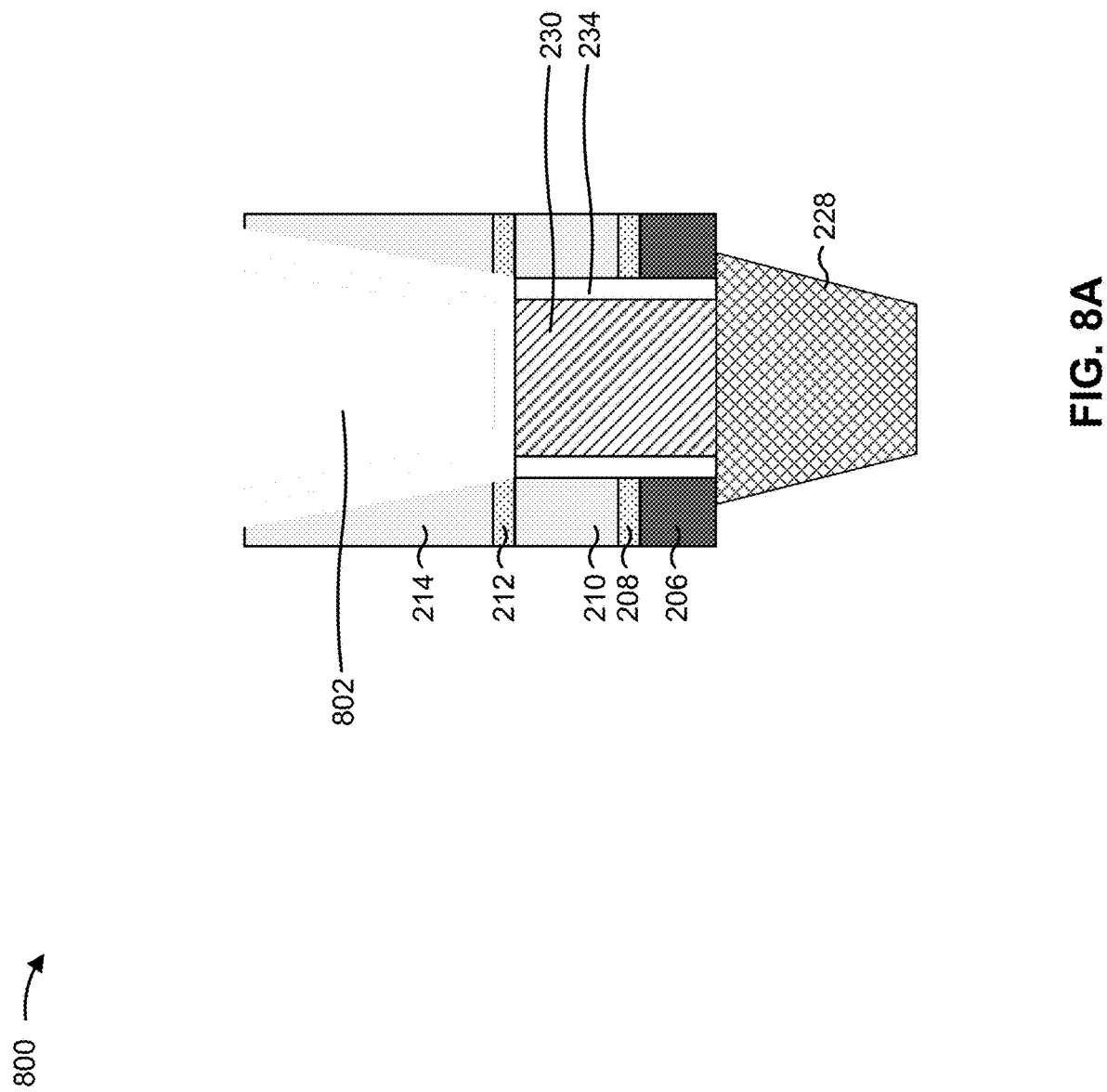
FIGS. 8A-8E are diagrams of an example implementation described herein.

As shown in FIG. 8A, the example process for forming the conductive structure 238 may be performed in connection with an MEOL. In some implementations, the MEOL includes a contact 230 formed over a source/drain 228 and in a dielectric layer 210 that is above an ESL 208 and in a dielectric layer 206. Although described with respect to forming the conductive structure 238 over the source/drain contact 230 that is over source/drain 228, the description similarly applies to forming conductive structure 240 over gate contact 242 over gate 232 that is formed with a graphene cap 256.

An ESL 212 may be formed over the dielectric layer 210 and the contact 230. The deposition tool 102 may deposit the ESL 212 by a CVD technique, a PVD technique, an ALD technique, or another type of deposition technique. The planarization tool 110 may planarize the ESL 212 after the ESL 212 is deposited.

A dielectric layer 214 may be formed over the ESL 212. For example, the deposition tool 102 may deposit the dielectric layer 214 by a CVD technique, a PVD technique, an ALD technique, or another type of deposition technique. The planarization tool 110 may planarize the dielectric layer 214 after the dielectric layer 214 is deposited.

As further shown in FIG. 8A, the dielectric layer 214 may be etched to form an opening (resulting in recess 802) such that the contact 230 is at least partially exposed. For example, the deposition tool 102 may form a photoresist layer on the dielectric layer 214 (or on an ESL formed on the dielectric layer 214, such as ESL 216), the exposure tool 104 may expose the photoresist layer to a radiation source to pattern the photoresist layer, the developer tool 106 may develop and remove portions of the photoresist layer to expose the pattern, and the etch tool 108 may etch portions of the dielectric layer 214 to form the recess 802. In some implementations, a photoresist removal tool removes the remaining portions of the photoresist layer (e.g., using a chemical stripper, a plasma asher, and/or another technique) after the etch tool 108 etches the recess 802.

Figure 8B:
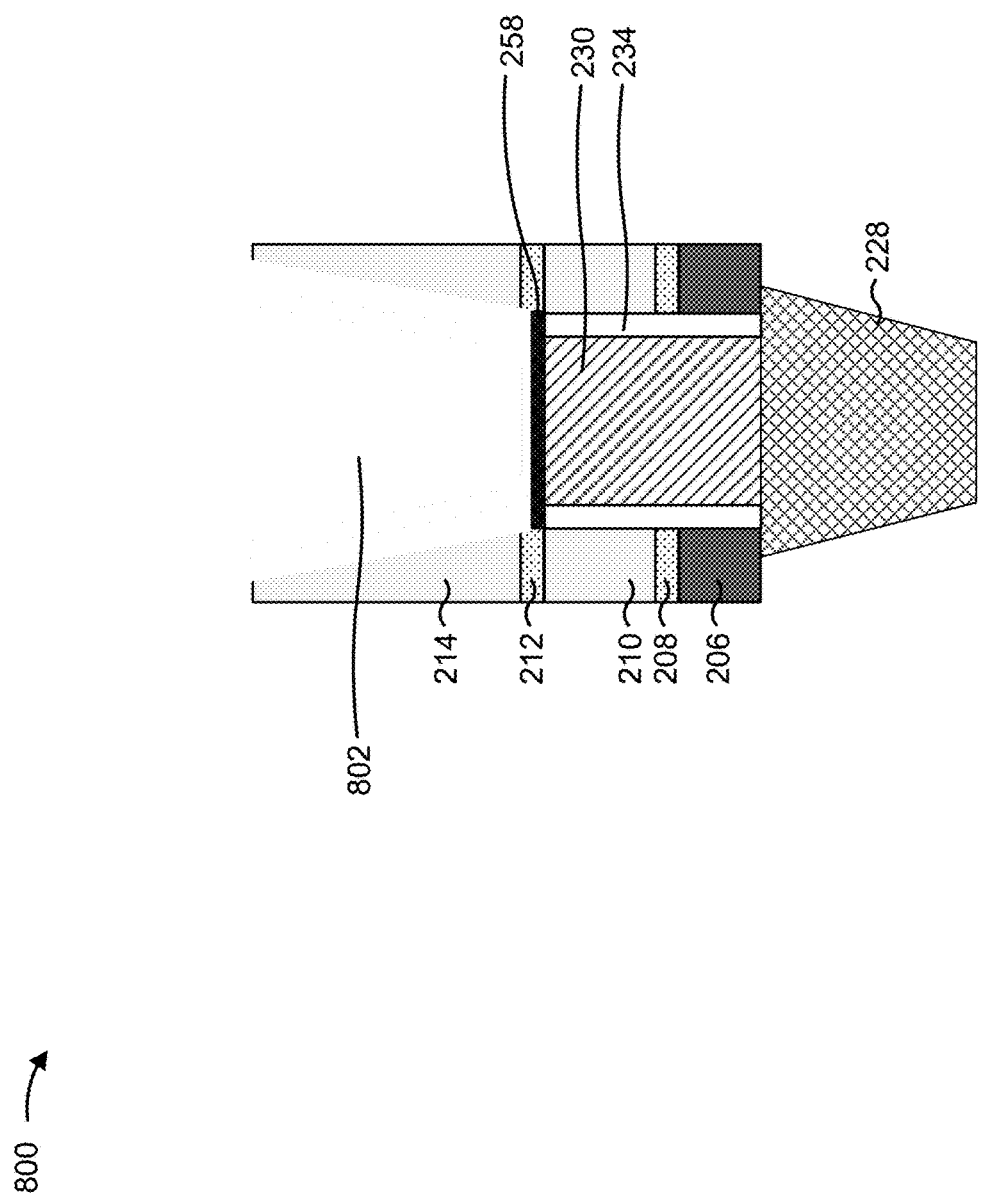

As shown in FIG. 8B, a graphene cap 258 may be formed over the contact 230. The deposition tool 102 may deposit the graphene cap 258 by a CVD technique, a PVD technique, an ALD technique, or another type of deposition technique. In some implementations, the deposition tool 102 deposits the graphene cap 258 for an amount of time in a range from approximately 4 minutes to approximately 18 minutes. Selecting at least 4 minutes ensures that the graphene cap 258 is thick enough to reduce prevent diffusion from the copper of the upper conductive structure 238. Selecting no more than 18 minutes ensures that the graphene cap 258 not so thick as to significantly increase contact resistance between the conductive structure 238 and the contact 230.

Although described with respect to depositing the graphene cap 258 after forming and etching the ESL 212 and the dielectric layer 214, deposition tool 102 may deposit graphene before forming and etching the ESL 212 and the dielectric layer 214. For example, the deposition tool 102 may selectively deposit graphene on the contact 230 but not on the dielectric layer 210 by using a precursor that reacts with metal but not with dielectric material. Accordingly, the ESL 212 and the dielectric layer 214 are etched to expose the graphene cap 258 that is already formed on a top surface of the contact 230.

Figure 8C:
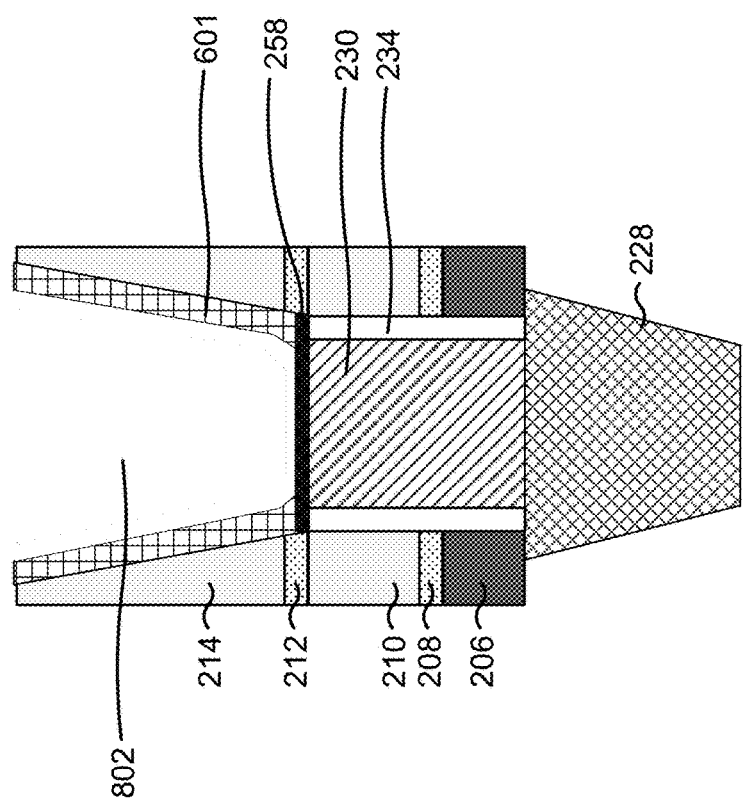

As shown in FIG. 8C, a barrier layer 601 may be formed over sidewalls of the recess 802. The deposition tool 102 may deposit the barrier layer 301 by a CVD technique, a PVD technique, an ALD technique, or another type of deposition technique. In some implementations, the barrier layer 601 is deposited on the dielectric layer 214 as well. In some implementations, a ratio of a deposition time associated with the graphene cap 258 to a deposition time associated with the barrier layer 601 is in a range from approximately one to approximately two. Selecting a ratio of at least one ensures that the barrier layer 601 is thick enough to prevent copper diffusion from the conductive structure 238. Selecting a ratio of no more than two ensures that the barrier layer 601 is not so thick as to significantly increase contact resistance between the conductive structure 238 and the contact 230. For example, the deposition tool 102 deposits the barrier layer 601 for an amount of time in a range from approximately 1 minute to approximately 10 minutes.

In some implementations, the barrier layer 601 may form less effectively on the graphene cap 258 as compared with sidewalls of the recess 802. Accordingly, as described in connection with FIG. 6A, the barrier layer 601 may have a thickness from approximately 3 Å to approximately 10 Å over the graphene cap 258 and a thickness from approximately 8 Å to approximately 20 Å over the sidewalls.

Figure 8D:
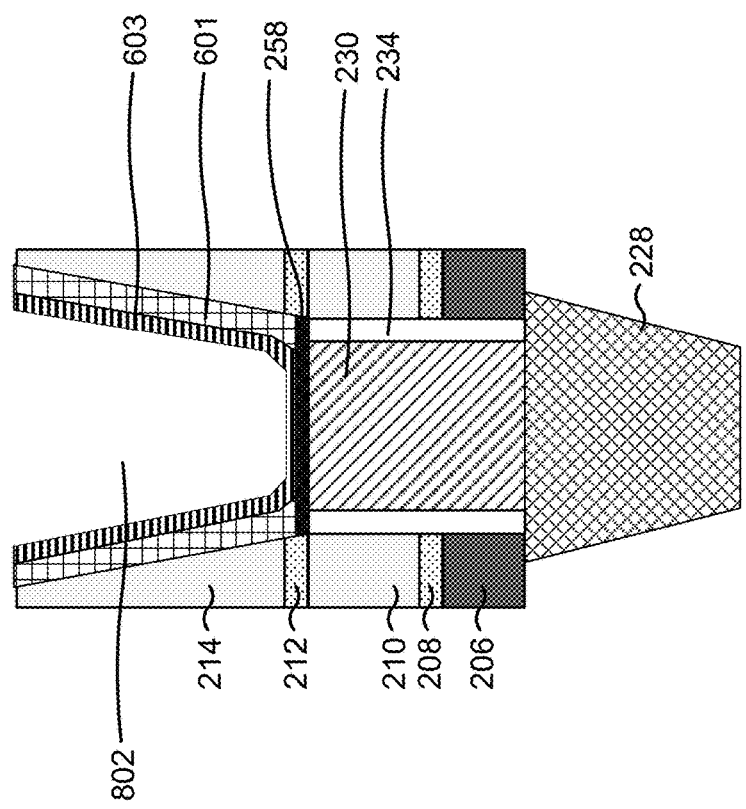

As shown in FIG. 8D, a liner material 603 may be formed over the barrier layer 601. The deposition tool 102 may deposit the liner material 603 by a CVD technique, a PVD technique, an ALD technique, or another type of deposition technique. In some implementations, the liner material 603 is deposited over the dielectric layer 214 as well. In some implementations, a ratio of a deposition time associated with the graphene cap 258 to a deposition time associated with the liner material 603 is in a range from approximately one to approximately two. Selecting a ratio of at least one ensures that the liner material 603 is thick enough to prevent diffusion from the copper of the upper conductive structure 238. Selecting a ratio of no more than two ensures that the liner material 603 is not so thick as to significantly increase contact resistance between the conductive structure 238 and the contact 230. For example, the deposition tool 102 deposits the liner material 603 for an amount of time in a range from approximately 1 minute to approximately 10 minutes.

In some implementations, the liner material 603 includes ruthenium in order to improve the flow of copper into recess 802. In some implementations, the liner material 603 includes cobalt in order to reduce sheet resistance of conductive structure 238. In such implementations, the barrier layer 601 may be doped with ruthenium to increase the conductivity. For example, the ion implantation tool 114 may dope the barrier layer 601 with ruthenium ions. In other implementations, the liner material 603 includes both a layer of cobalt and a layer of ruthenium.

Figure 8E:
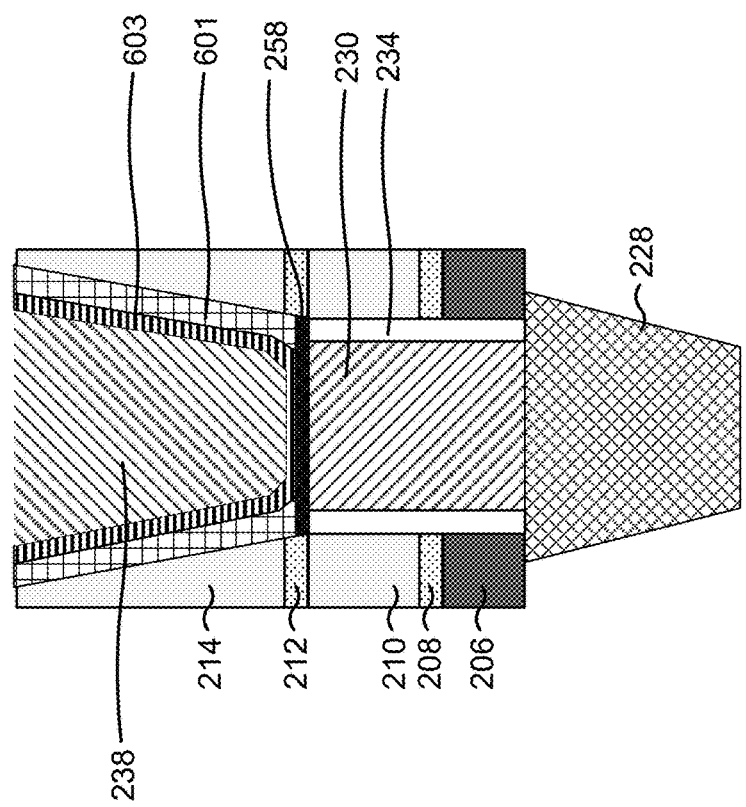

As shown in FIG. 8E, the conductive structure 238 may be formed in the recess 802 and over the graphene cap 258, the barrier layer 601, and the liner material 603. The deposition tool 102 may deposit the copper of the conductive structure 238 using a CVD technique, a PVD technique, an ALD technique, or another type of deposition technique, the plating tool 112 may deposit the copper of the conductive structure 238 using an electroplating operation, or a combination thereof. In some implementations, the copper flows over the dielectric layer 214 as well as into the recess 802. Accordingly, the conductive structure 238 may be planarized. The planarization tool 110 may planarize the conductive structure 238 after the conductive structure 238 is deposited. Additionally, portions of the barrier layer 601 and the liner material 603 deposited over the dielectric layer 214 may be removed during planarization.

By using techniques as described in connection with FIGS. 8A-8E, the barrier layer 601 prevents diffusion of copper from the conductive structure 238, which reduces resistivity of the conductive structure 238, the liner material 603 improves flow of copper into the recess 802, and the graphene cap 258 prevents diffusion from the copper of the upper conductive structure 238 or the cobalt of the liner material 603. As indicated above, FIGS. 8A-8E are provided as an example. Other examples may differ from what is described with regard to FIGS. 8A-8E. For example, in some implementations, one or more of the barrier layer 601 or the liner material 603 may be omitted.

Figure 9A:
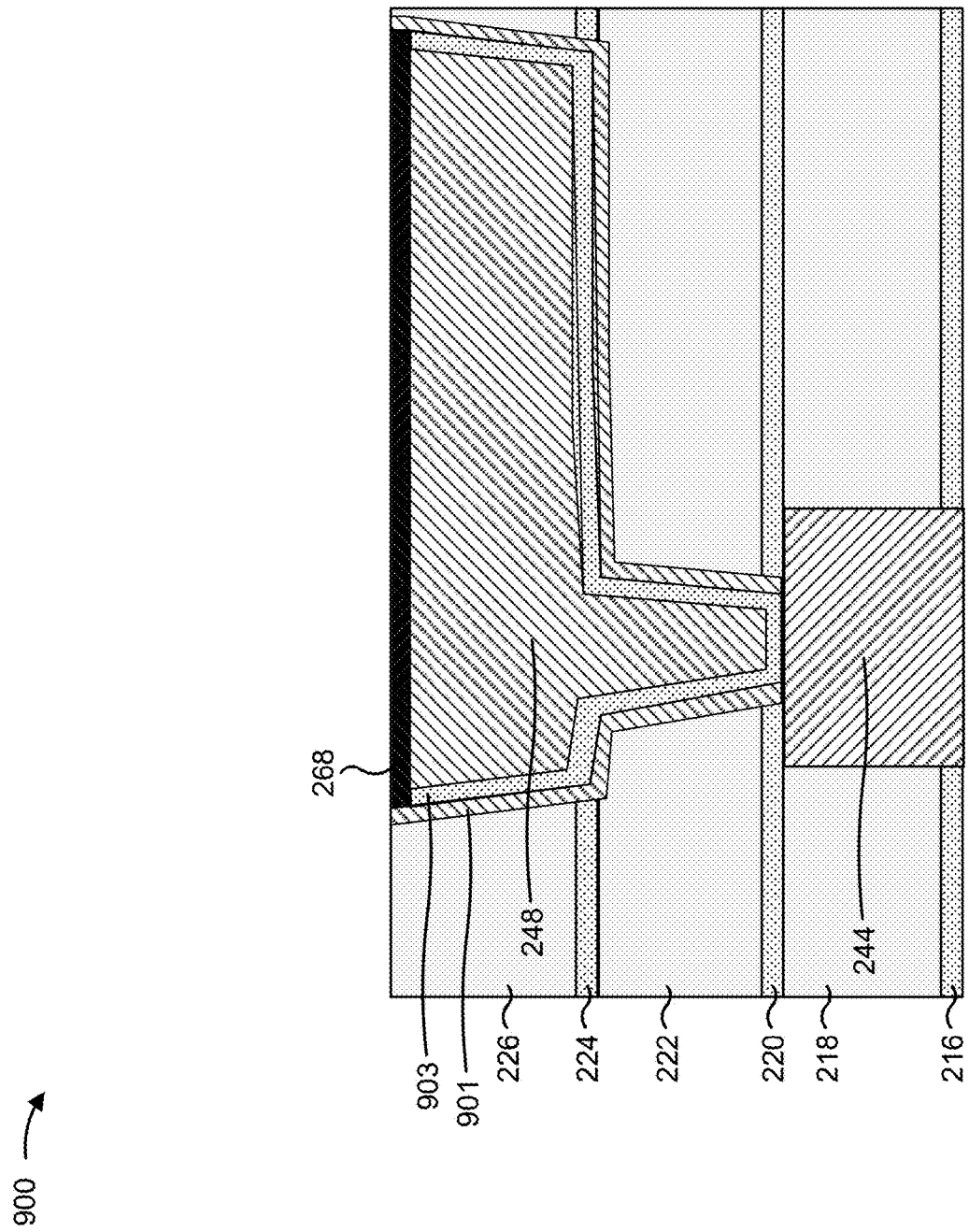
FIGS. 9A and 9B are diagram of an example conductive structure described herein.

FIG. 9A is a diagram of an example semiconductor structure 900 described herein. The semiconductor structure 900 includes a conductive structure 248 that is formed with a barrier layer 901 and a liner material 903 over a conductive structure 244. Although described using the conductive structure 244 over an interconnect 238 that connects to a source/drain contact 230 that is over source/drain 228, the description similarly applies to conductive structure 246 over an interconnect 240 that connects to a gate contact 242 over gate 232. Additionally, or alternatively, the description similarly applies to higher-layer metallization layers in a BEOL other than the conductive structure 248 and/or the conductive structure 250.

As further shown in FIG. 9A, the conductive structure 248 includes a graphene cap 268. The graphene cap 268 may have a thickness from approximately 2 Å to approximately 15 Å. Selecting a thickness of at least 2 Å prevents diffusion from copper of an upper conductive structure. As a result, electrical performance of the conductive structure 248 is improved. Selecting a thickness of no more than 15 Å prevents the graphene cap 268 from significantly increasing the contact resistance at the conductive structure 248.

As shown in FIG. 9A, the conductive structure 248 may be formed in a dielectric layer 226 above an ESL 224 and a dielectric layer 222 above an ESL 220. For example, the dielectric layers 222 and 226 may each include silicon oxycarbide (SiOC). The ESLs 220 and 224 may each include aluminum oxide ($Al_2O_3$), aluminum nitride (AlN), silicon nitride (SiN), silicon oxynitride ($SiO_xN_y$), aluminum oxynitride (AlON), and/or a silicon oxide ($SiO_x$). In some implementations, the ESL 220 and/or the ESL 224 include a plurality of ESL layers stacked together to function as an etch stop. The conductive structure 248 is electrically connected to the conductive structure 244 that is formed in a dielectric layer 218 above an ESL 216. For example, the dielectric layer 218 may include silicon oxycarbide (SiOC). The ESL 216 may include aluminum oxide ($Al_2O_3$), aluminum nitride (AlN), silicon nitride (SiN), silicon oxynitride ($SiO_xN_y$), aluminum oxynitride (AlON), and/or a silicon oxide ($SiO_x$).

In some implementations, the conductive structure 248 is formed in a recess (e.g., recess 1101 as described in connection with FIGS. 11A-11E). Sidewalls of the recess may form an angle from approximately 84 degrees to approximately 90 degrees. Selecting an angle of at least 84 degrees allows the conductive structure 248 to remain relatively narrow and conduct current faster. Selecting an angle of no more than 90 degrees allows for formation of material on sidewalls of the recess. Although depicted with the conductive structure 248 having a dual damascene profile, the description similarly applies to a conductive structure 248 having a single damascene profile (e.g., as depicted in FIG. 10A).

The barrier layer 901 may include tantalum (Ta), tantalum nitride (TaN), tantalum pentoxide ($Ta_2O_5$), titanium-tantalum alloy nitride (TaTiN), and/or titanium nitride (TiN), among other examples. The barrier layer 901 helps prevent diffusion of copper atoms from the conductive structure 248 to other layers. A ratio of a thickness of the barrier layer 901 to a thickness of the graphene cap 268 may be in a range from approximately 0.3 to approximately 10.0. Selecting a ratio of at least 0.3 ensures that the graphene cap 268 is thin enough such that the contact resistance at the conductive structure 248 is not significantly increased and/or the barrier layer 901 is thick enough to prevent copper diffusion. Selecting a ratio of no more than 10.0 ensures that the graphene cap 268 is thick enough to prevent diffusion from copper of an upper conductive structure and/or the barrier layer 901 is thin enough such that the contact resistance at the conductive structure 248 is not significantly increased. For example, the barrier layer 901 may have a thickness from approximately 5 Å to approximately 20 Å.

In some implementations, the conductive structure 244 may include an additional graphene cap such that the barrier layer 901 forms less effectively on the additional graphene cap as compared with sidewalls and other portions of the recess 1101. Accordingly, a ratio of a thickness of the barrier layer 901 over the additional graphene cap to a thickness of the barrier layer 901 at other locations may be in a range from approximately 0.4 to approximately 0.5. Selecting a ratio of at least 0.4 ensures that the barrier layer 901 is thin enough such that the contact resistance between the conductive structure 248 and the conductive structure 244 is not significantly increased. Selecting a ratio of no more than 0.5 ensures that the barrier layer 901 is thick enough to prevent copper diffusion. For example, the barrier layer 901 may have a thickness from approximately 2 Å to approximately 10 Å over the additional graphene cap.

In some implementations, the barrier layer 901 is adjacent to the liner material 903. A ratio of a thickness of the ruthenium to a thickness of the graphene cap 268 may be in a range from approximately 0.3 to approximately 7.5. Selecting a ratio of at least 0.3 ensures that the graphene cap 268 is thin enough such that the contact resistance at the conductive structure 248 is not significantly increased and/or the ruthenium is thick enough to prevent diffusion from copper of an upper conductive structure 238. Selecting a ratio of no more than 7.5 ensures that the graphene cap 268 is thick enough to prevent diffusion of copper into the conductive structure 248 and/or the ruthenium is thin enough such that the sheet resistance of the conductive structure 248 is not significantly increased. For example, the ruthenium may have a thickness from approximately 5 Å to approximately 15 Å.

Figure 9B:
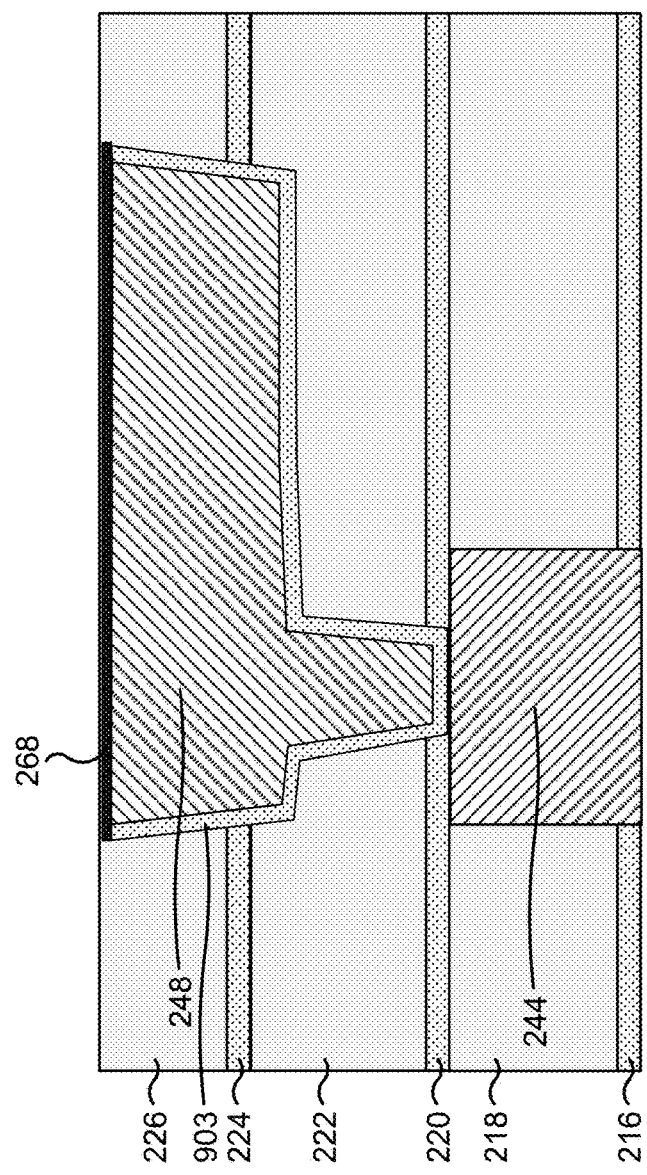

FIG. 9B is a diagram of an example semiconductor structure 950 described herein. The semiconductor structure 950 is similar to semiconductor structure 900 except that the conductive structure 248 includes the liner material 903 without the barrier layer 901. Although described using the conductive structure 244 over an interconnect 238 that connects to a source/drain contact 230 that is over source/drain 228, the description similarly applies to conductive structure 246 over an interconnect 240 that connects to a gate contact 242 over gate 232. Additionally, or alternatively, the description similarly applies to higher-layer metallization layers in a BEOL other than the conductive structure 248 and/or the conductive structure 250. Omitting the barrier layer 901 reduces contact resistance at the conductive structure 248 but increases possible copper diffusion from the conductive structure 248.

As indicated above, FIGS. 9A and 9B are provided as examples. Other examples may differ from what is described with regard to FIGS. 9A and 9B.

FIG. 10A illustrates an example semiconductor structure 1000 described herein. Semiconductor structure 1000 is structural similar to semiconductor structure 900, described in connection with FIG. 9A, and is dimensioned as a circuit element. FIG. 10A illustrates the conductive structure 248 with a critical dimension represented by 1001. The width 1001 at a bottom surface of the conductive structure 248 may be in a range from approximately 8 nm to approximately 22 nm. Selecting a critical dimension 1001 of at least 8 nm allows for easier control of EUV and other fabrication processes. Selecting a critical dimension 1001 of no more than 22 nm provides for sufficient miniaturization of a semiconductor device including the semiconductor structure 1000.

Figure 10B:
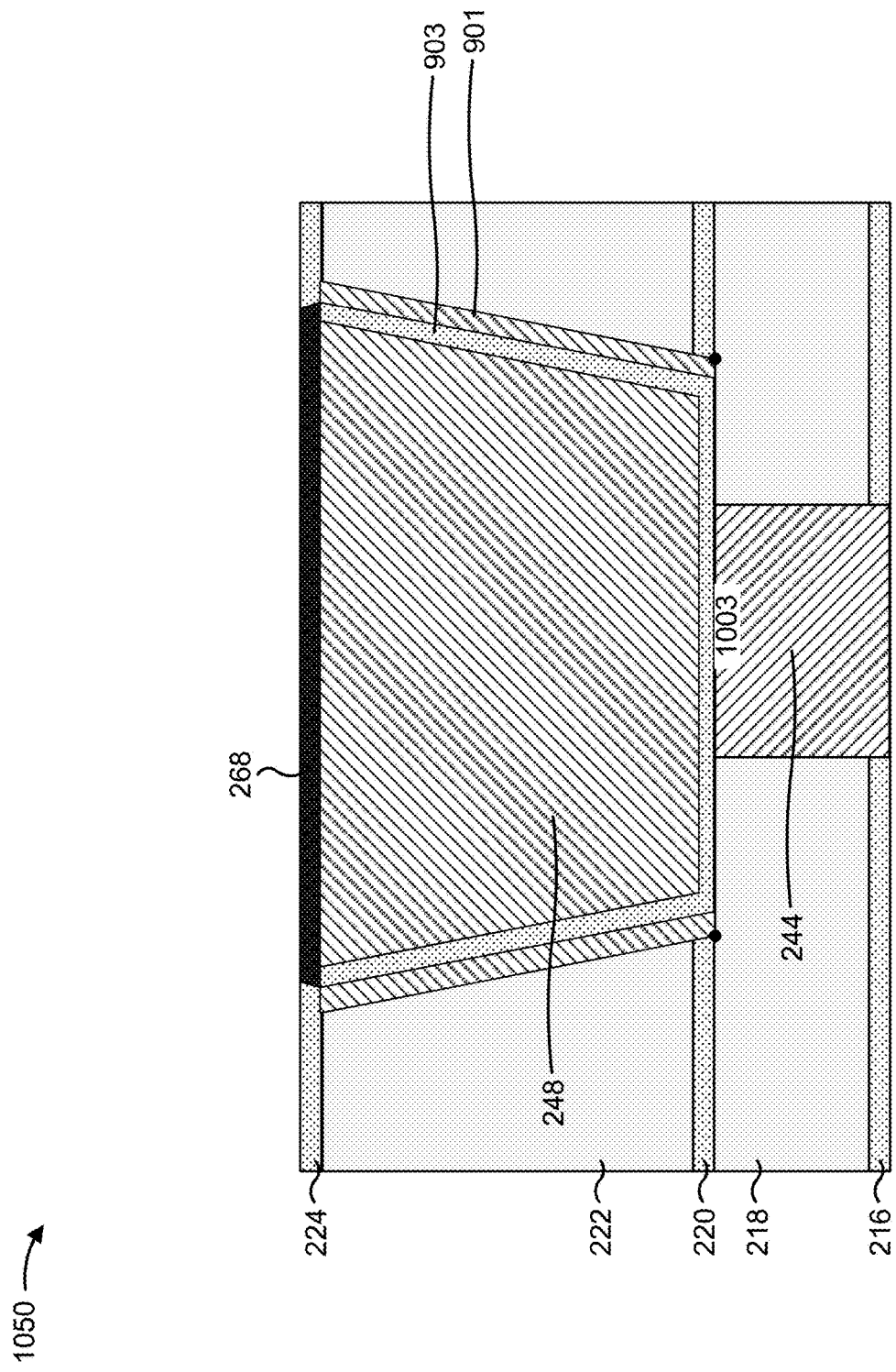

FIG. 10B illustrates an example semiconductor structure 1050 described herein. Semiconductor structure 1050 is structural similar to semiconductor structure 900, described in connection with FIG. 9A, and is dimensioned as a seal ring. FIG. 10B illustrates the conductive structure 248 with a critical dimension represented by 1003. The width 1003 at a bottom surface of the conductive structure 248 may be in a range from approximately 100 nm to approximately 180 nm. Selecting a critical dimension 1003 of at least 100 nm electrically insulates the semiconductor structure 1050 from neighboring semiconductor structures in a same semiconductor device. Selecting a critical dimension 1003 of no more than 180 nm provides for sufficient miniaturization of the semiconductor device including the semiconductor structure 1050.

As indicated above, FIGS. 10A and 10B are provided as examples. Other examples may differ from what is described with regard to FIGS. 10A and 10B.

FIGS. 11A-11E are diagrams of an example implementation 1100 described herein. Example implementation 1100 may be an example process for forming a conductive structure 248 over a conductive structure 244 and with a graphene cap 268. The graphene cap 268 reduces contact resistance, which increases electrical performance of an electronic device including the conductive structure 248.

Figure 11A:
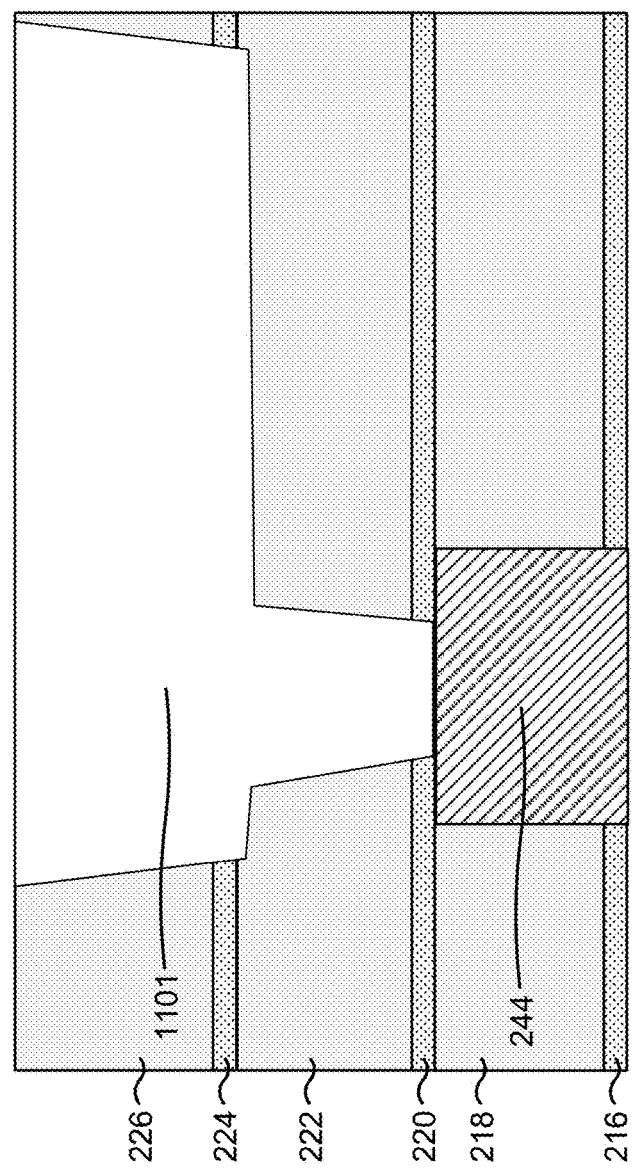
FIGS. 11A-11E are diagrams of an example implementation described herein.

As shown in FIG. 11A, the example process for forming the conductive structure 248 may be performed in connection with an MEOL. In some implementations, the MEOL includes a conductive structure 244 formed in a dielectric layer 218 that is above an ESL 216. Although described using the conductive structure 244 over an interconnect 238 that connects to a source/drain contact 230 that is over source/drain 228, the description similarly applies to conductive structure 246 over an interconnect 240 that connects to a gate contact 242 over gate 232. Additionally, or alternatively, the description similarly applies to higher-layer metallization layers in a BEOL other than the conductive structure 248 and/or the conductive structure 250.

An ESL 220 may be formed over the dielectric layer 218 and the conductive structure 244. The deposition tool 102 may deposit the ESL 220 by a CVD technique, a PVD technique, an ALD technique, or another type of deposition technique. The planarization tool 110 may planarize the ESL 220 after the ESL 220 is deposited.

A dielectric layer 222 may be formed over the ESL 220. For example, the deposition tool 102 may deposit the dielectric layer 222 by a CVD technique, a PVD technique, an ALD technique, or another type of deposition technique. The planarization tool 110 may planarize the dielectric layer 218 after the dielectric layer 222 is deposited.

Similarly, for a dual damascene profile, an additional ESL 224 may be formed over the dielectric layer 222, and an additional dielectric layer 226 may be formed over the ESL 224.

As further shown in FIG. 11A, the dielectric layers 226 and 222 may be etched to form an opening (resulting in recess 1101) such that the conductive structure 244 is at least partially exposed. For example, the deposition tool 102 may form a photoresist layer on the dielectric layer 226 (or on an ESL formed on the dielectric layer 226), the exposure tool 104 may expose the photoresist layer to a radiation source to pattern the photoresist layer, the developer tool 106 may develop and remove portions of the photoresist layer to expose the pattern, and the etch tool 108 may etch portions of the dielectric layers 226 and 222 to form the recess 1101. In some implementations, a photoresist removal tool removes the remaining portions of the photoresist layer (e.g., using a chemical stripper, a plasma asher, and/or another technique) after the etch tool 108 etches the recess 1101. For a dual damascene profile, as shown in FIG. 11A, the recess 1101 may be formed using at least two separate etching steps.

Figure 11B:
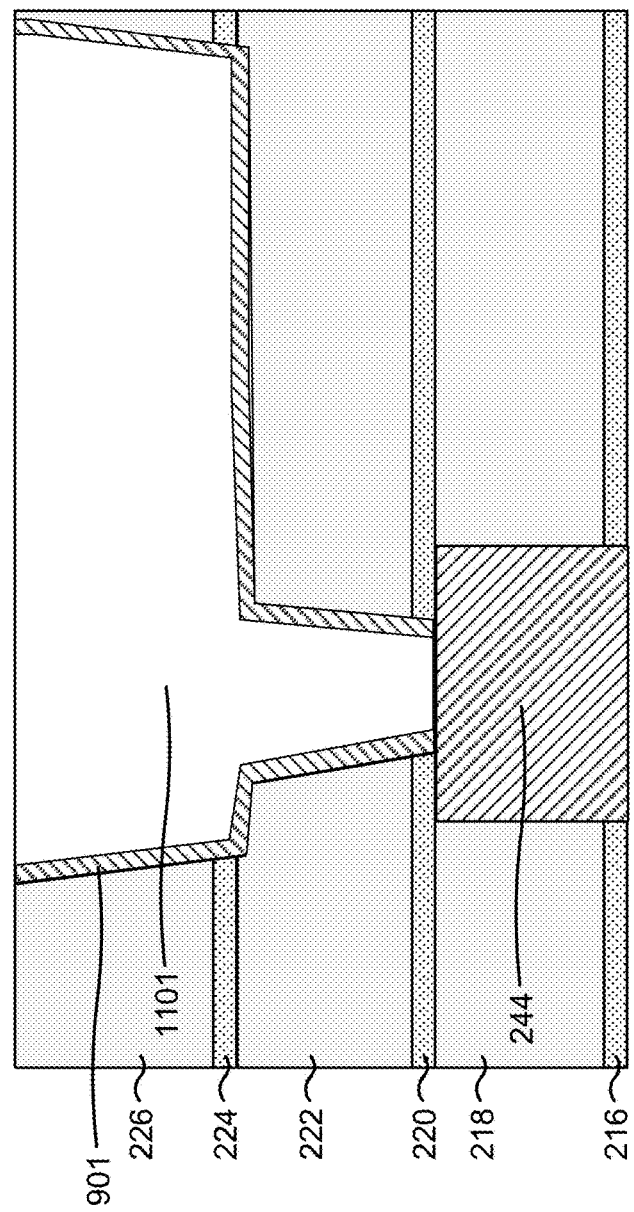

As shown in FIG. 11B, a barrier layer 901 may be formed over sidewalls of the recess 1101. The deposition tool 102 may deposit the barrier layer 901 by a CVD technique, a PVD technique, an ALD technique, or another type of deposition technique. In some implementations, the barrier layer 901 is deposited on the dielectric layer 226 as well. In some implementations, the deposition tool 102 deposits the barrier layer 901 for an amount of time in a range from approximately 1 minute to approximately 10 minutes. Selecting at least 1 minute ensures that the barrier layer 901 is thick enough to prevent diffusion of copper from conductive structure 248. Selecting no more than 10 minutes ensures that the barrier layer 901 is not too thick so as to significantly increase contact resistance between the conductive structure 244 and the conductive structure 248.

In some implementations, a graphene cap may be formed over the conductive structure 244. The deposition tool 102 may deposit the graphene cap by a CVD technique, a PVD technique, an ALD technique, or another type of deposition technique. In some implementations, a ratio of a deposition time associated with the graphene cap to a deposition time associated with the barrier layer 901 is in a range from approximately one to approximately two. Selecting a ratio of at least one ensures that the graphene cap is thick enough to prevent diffusion from the copper of the upper conductive structure 248. Selecting a ratio of no more than two ensures that the graphene cap is not so thick as to significantly increase contact resistance between the conductive structure 244 and the conductive structure 248. For example, the deposition tool 102 deposits the graphene cap for an amount of time in a range from approximately 4 minutes to approximately 18 minutes.

As described above in connection with FIG. 8B, the graphene cap 258 may be formed on the conductive structure 244 after forming and etching the ESLs 220 and 224 and the dielectric layers 222 and 226, or the deposition tool 102 may deposit graphene before forming and etching the ESLs 220 and 224 and the dielectric layers 222 and 226. For example, the deposition tool 102 may selectively deposit graphene on the conductive structure 244 but not on the dielectric layer 218 by using a precursor that reacts with metal but not with dielectric material. Accordingly, the ESLs 220 and 224 and the dielectric layers 222 and 226 are etched to expose the graphene cap that is already formed on a top surface of the conductive structure 244.

Accordingly, in some implementations, the barrier layer 901 forms less effectively on the graphene cap as compared with other portions of the recess 1101. Accordingly, as described in connection with FIG. 9A, the barrier layer 301 may have a thickness from approximately 2 Å to approximately 10 Å over the graphene cap and a thickness from approximately 5 Å to approximately 20 Å over the other portions of the recess 1101.

Figure 11C:
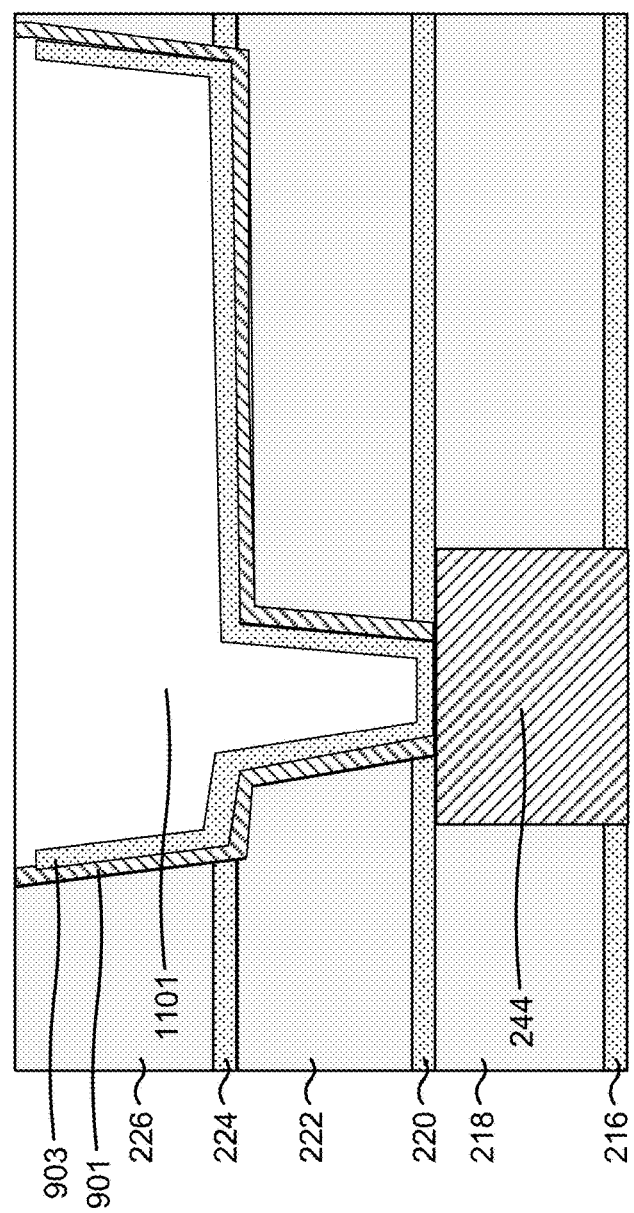

As shown in FIG. 11C, a liner material 903 may be formed over the barrier layer 901. The deposition tool 102 may deposit the liner material 903 by a CVD technique, a PVD technique, an ALD technique, or another type of deposition technique. In some implementations, the liner material 903 is deposited over the dielectric layer 226 as well. In some implementations, the deposition tool 102 deposits the liner material 903 for an amount of time in a range from approximately 1 minute to approximately 10 minutes. Selecting at least 1 minute ensures that the liner material 903 is thick enough to improve adhesion for the following-formed conductive structure 248. Selecting no more than 10 minutes ensures that the liner material 903 is not too thick so as to significantly increase sheet resistance of the conductive structure 248. In some implementations, the liner material 903 includes ruthenium in order to improve the flow of copper into recess 1101.

Figure 11D:
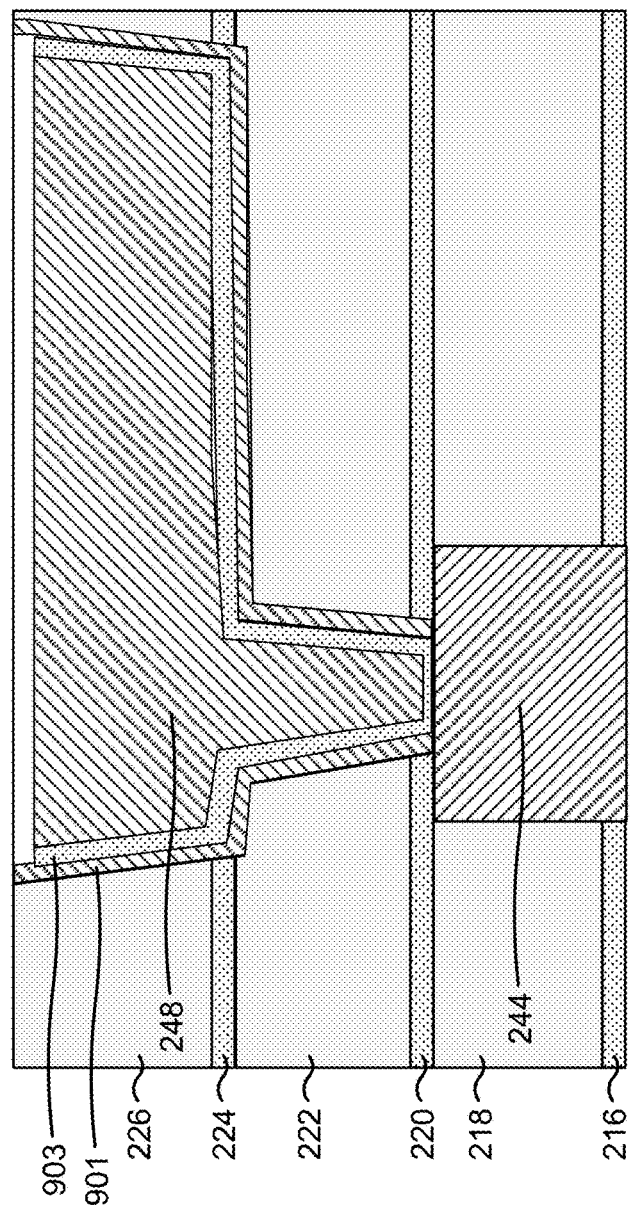

As shown in FIG. 11D, the conductive structure 248 may be formed in the recess 1101 and over the barrier layer 901 and the liner material 903. The deposition tool 102 may deposit the copper of the conductive structure 248 using a CVD technique, a PVD technique, an ALD technique, or another type of deposition technique, the plating tool 112 may deposit the copper of the conductive structure 248 using an electroplating operation, or a combination thereof.

In some implementations, the copper flows over the dielectric layer 226 as well as into the recess 1101. Accordingly, the conductive structure 248 may be planarized. The planarization tool 110 may planarize the conductive structure 248 after the conductive structure 248 is deposited. Additionally, portions of the barrier layer 901 and the liner material 903 deposited over the dielectric layer 226 may be removed during planarization.

Figure 11E:
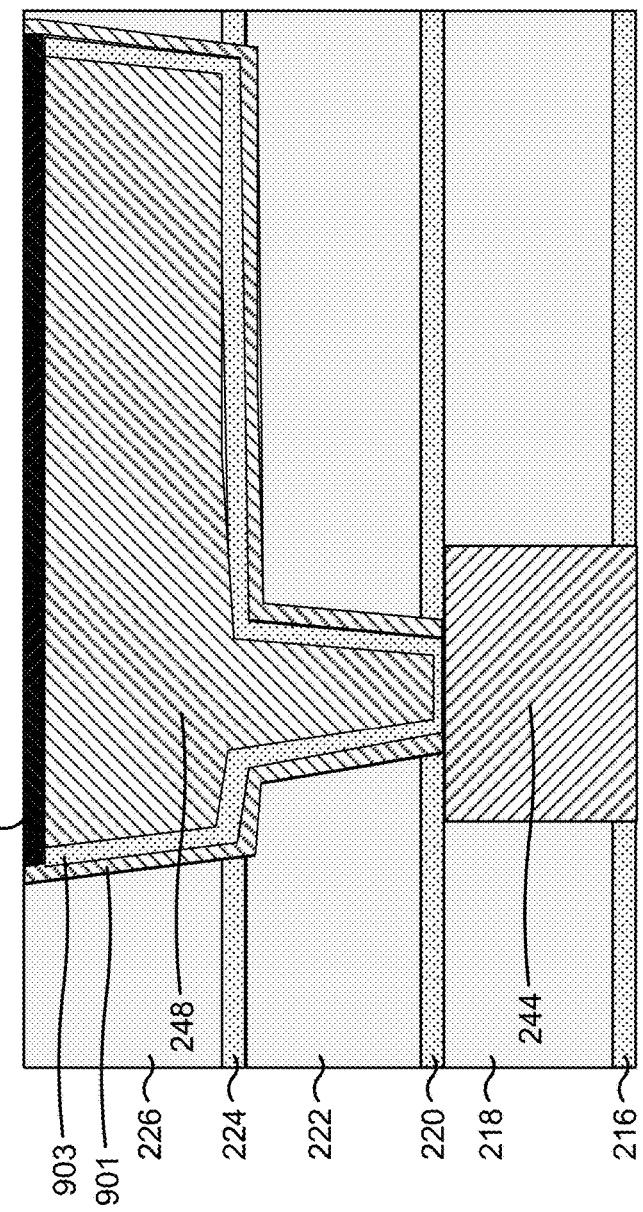

In some implementations, the planarization tool 110 uses CMP, which causes a recess to form in the conductive structure 248 due to dishing. Accordingly, as shown in FIG. 11E, a graphene cap 268 may be formed in the recess and on a top surface of the conductive structure 248. The deposition tool 102 may deposit the graphene cap 268 by a CVD technique, a PVD technique, an ALD technique, or another type of deposition technique. In some implementations, a ratio of a deposition time associated with the graphene cap 268 to a deposition time associated with the barrier layer 901 and/or the liner material 903 is in a range from approximately one to approximately two. Selecting a ratio of at least one ensures that the graphene cap 268 is thick enough to prevent diffusion of copper into the upper conductive structure 248. Selecting a ratio of no more than two ensures that the graphene cap 268 is not so thick as to significantly increase contact resistance at the conductive structure 248. For example, the deposition tool 102 deposits the graphene cap 268 for an amount of time in a range from approximately 4 minutes to approximately 18 minutes.

By using techniques as described in connection with FIGS. 11A-11E, the barrier layer 901 prevents diffusion of copper from the conductive structure 248, which reduces resistivity of the conductive structure 248, the liner material 903 improves flow of copper into the recess 1101, and the graphene cap 268 prevents diffusion of copper into the conductive structure 248. As indicated above, FIGS. 11A-11E are provided as an example. Other examples may differ from what is described with regard to FIGS. 11A-11E. For example, in some implementations, one or more of the barrier layer 901 or the liner material 903 may be omitted.

Figure 12A:
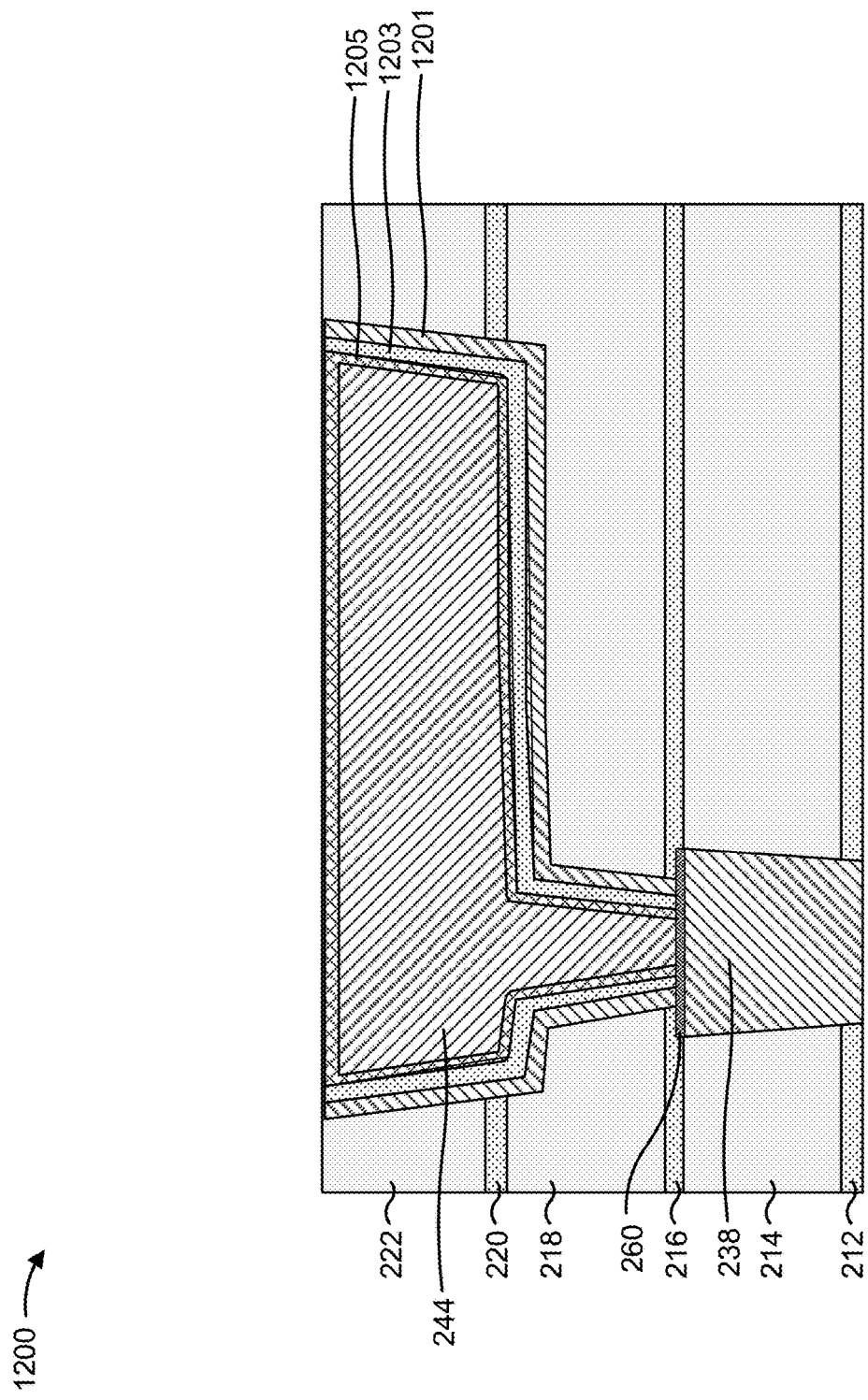
FIGS. 12A and 12B are diagram of an example conductive structure described herein.

FIG. 12A is a diagram of an example semiconductor structure 1200 described herein. The semiconductor structure 1200 includes a conductive structure 244 that is formed with a barrier layer 1201 and liner materials 1203 and 1205 over a conductive structure 238. Although described using the conductive structure 244 over the conductive structure 238 that connects to a source/drain contact 230 that is over source/drain 228, the description similarly applies to conductive structure 246 over a conductive structure 240 that connects to a gate contact 242 over gate 232.

As further shown in FIG. 12A, the conductive structure 238 includes a cobalt cap 260. The cobalt cap 260 may have a thickness from approximately 5 Å to approximately 30 Å. Selecting a thickness of at least 5 Å allows for sufficient diffusion of cobalt from the cobalt cap 260 into the conductive structure 238 to prevent further diffusion of cobalt from liner material 1205 into the conductive structure 238. As a result, electrical performance of the conductive structure 238 is improved. Selecting a thickness of no more than 30 Å prevents the cobalt cap 260 from diffusing too much cobalt from the cobalt cap 260 into the conductive structure 238 such that the electrical performance of the conductive structure 238 is diminished.

As shown in FIG. 12A, the conductive structure 244 may be formed in a dielectric layer 222 above an ESL 220 and a dielectric layer 218 above an ESL 216. For example, the dielectric layers 218 and 222 may each include silicon oxycarbide (SiOC). The ESLs 216 and 220 may each include aluminum oxide ($Al_2O_3$), aluminum nitride (AlN), silicon nitride (SiN), silicon oxynitride ($SiO_xN_y$), aluminum oxynitride (AlON), and/or a silicon oxide ($SiO_x$). In some implementations, the ESL 216 and/or the ESL 220 include a plurality of ESL layers stacked together to function as an etch stop. The conductive structure 244 is electrically connected to the conductive structure 238 that is formed in a dielectric layer 214 above an ESL 212. For example, the dielectric layer 214 may include silicon oxycarbide (SiOC). The ESL 212 may include aluminum oxide ($Al_2O_3$), aluminum nitride (AlN), silicon nitride (SiN), silicon oxynitride ($SiO_xN_y$), aluminum oxynitride (AlON), and/or a silicon oxide ($SiO_x$).

Figure 13A:
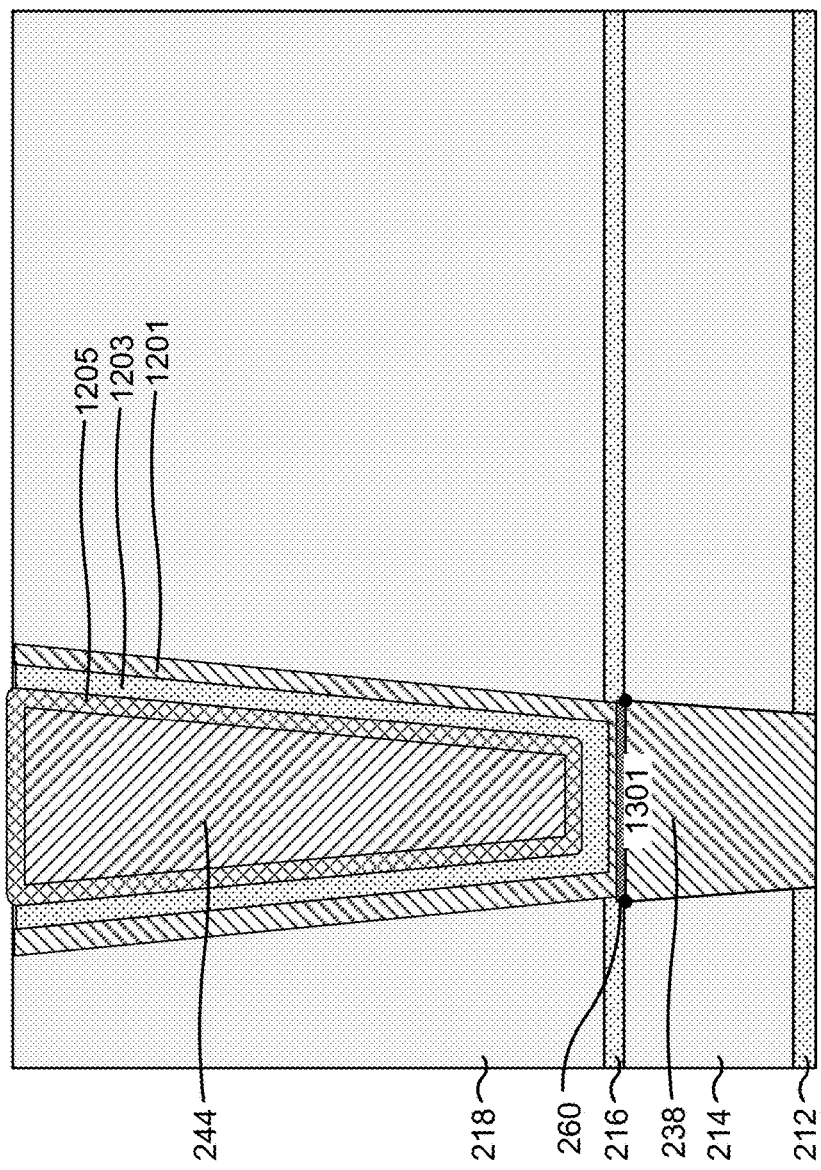
FIGS. 13A and 13B are diagram of an example conductive structure described herein.

In some implementations, the conductive structure 244 is formed in a recess (e.g., recess 1401 as described in connection with FIGS. 14A-14E). Sidewalls of the recess may form an angle from approximately 84 degrees to approximately 90 degrees. Selecting an angle of at least 84 degrees allows the conductive structure 248 to remain relatively narrow and conduct current faster. Selecting an angle of no more than 90 degrees allows for formation of material on sidewalls of the recess. Although depicted with the conductive structure 244 having a dual damascene profile, the description similarly applies to a conductive structure 244 having a single damascene profile (e.g., as depicted in FIG. 13A).

The barrier layer 1201 may include tantalum (Ta), tantalum nitride (TaN), tantalum pentoxide ($Ta_2O_5$), titanium-tantalum alloy nitride (TaTiN), and/or titanium nitride (TiN), among other examples. The barrier layer 1201 helps prevent diffusion of copper atoms from the conductive structure 244 to other layers. A ratio of a thickness of the barrier layer 1201 to a thickness of the cobalt cap 260 may be in a range from approximately 0.25 to approximately 4.0. Selecting a ratio of at least 0.25 ensures that the cobalt cap 260 is thin enough such too many cobalt atoms are not diffused from the cobalt cap 260 and/or the barrier layer 1201 is thick enough to prevent copper diffusion. Selecting a ratio of no more than 4.0 ensures that the cobalt cap 260 is thick enough such that enough cobalt atoms are diffused to prevent further diffusion from the liner material 1205 and/or the barrier layer 1201 is thin enough such that the contact resistance at the conductive structure 244 is not significantly increased. For example, the barrier layer 1201 may have a thickness from approximately 8 Å to approximately 20 Å.

In some implementations, the barrier layer 1201 forms less effectively on the cobalt cap 260 as compared with sidewalls and other portions of the recess 1401. Accordingly, a ratio of a thickness of the barrier layer 1201 over the cobalt cap 260 to a thickness of the barrier layer 1201 at other locations may be in a range from approximately 0.3 to approximately 0.5. Selecting a ratio of at least 0.3 ensures that the barrier layer 1201 is thin enough such that the contact resistance between the conductive structure 244 and the conductive structure 238 is not significantly increased. Selecting a ratio of no more than 0.5 ensures that the barrier layer 1201 is thick enough to prevent copper diffusion. For example, the barrier layer 1201 may have a thickness from approximately 3 Å to approximately 8 Å over the cobalt cap 260.

In some implementations, the barrier layer 1201 is adjacent to the liner materials 1203 and 1205. The liner material 1203 may include ruthenium to improve the adhesion for the conductive structure 244. A ratio of a thickness of the ruthenium to a thickness of the cobalt cap 260 may be in a range from approximately 0.2 to approximately 3.0. Selecting a ratio of at least 0.2 ensures that the cobalt cap 260 is thin enough such that too many cobalt atoms do not diffuse from the cobalt cap 260 and/or the ruthenium is thick enough to improve copper flow into the conductive structure 244. Selecting a ratio of no more than 3.0 ensures that the cobalt cap 260 is thick enough such that enough cobalt atoms are diffused to prevent further diffusion from the liner material 1205 and/or the ruthenium is thin enough such that the sheet resistance of the conductive structure 244 is not significantly increased. For example, the ruthenium may have a thickness from approximately 5 Å to approximately 15 Å.

Additionally, the liner material 1205 may include cobalt to help reduce sheet resistance of the conductive structure 244. A ratio of a thickness of the cobalt liner to a thickness of the cobalt cap 260 may be in a range from approximately 0.2 to approximately 7.0. Selecting a ratio of at least 0.2 ensures that the cobalt cap 260 is thin enough such that too many cobalt atoms do not diffuse from the cobalt cap 260 and/or the cobalt liner is thick enough to reduce sheet resistance of the conductive structure 244. Selecting a ratio of no more than 7.0 ensures that the cobalt cap 260 is thick enough such that enough cobalt atoms are diffused to prevent further diffusion from the liner material 1205 and/or the cobalt liner is thin enough such that too many cobalt atoms do not diffuse from the cobalt liner. For example, the cobalt liner may have a thickness from approximately 5 Å to approximately 35 Å. In some implementations, as shown in FIG. 12A, the liner material 1205 also caps the conductive structure 244.

Figure 12B:
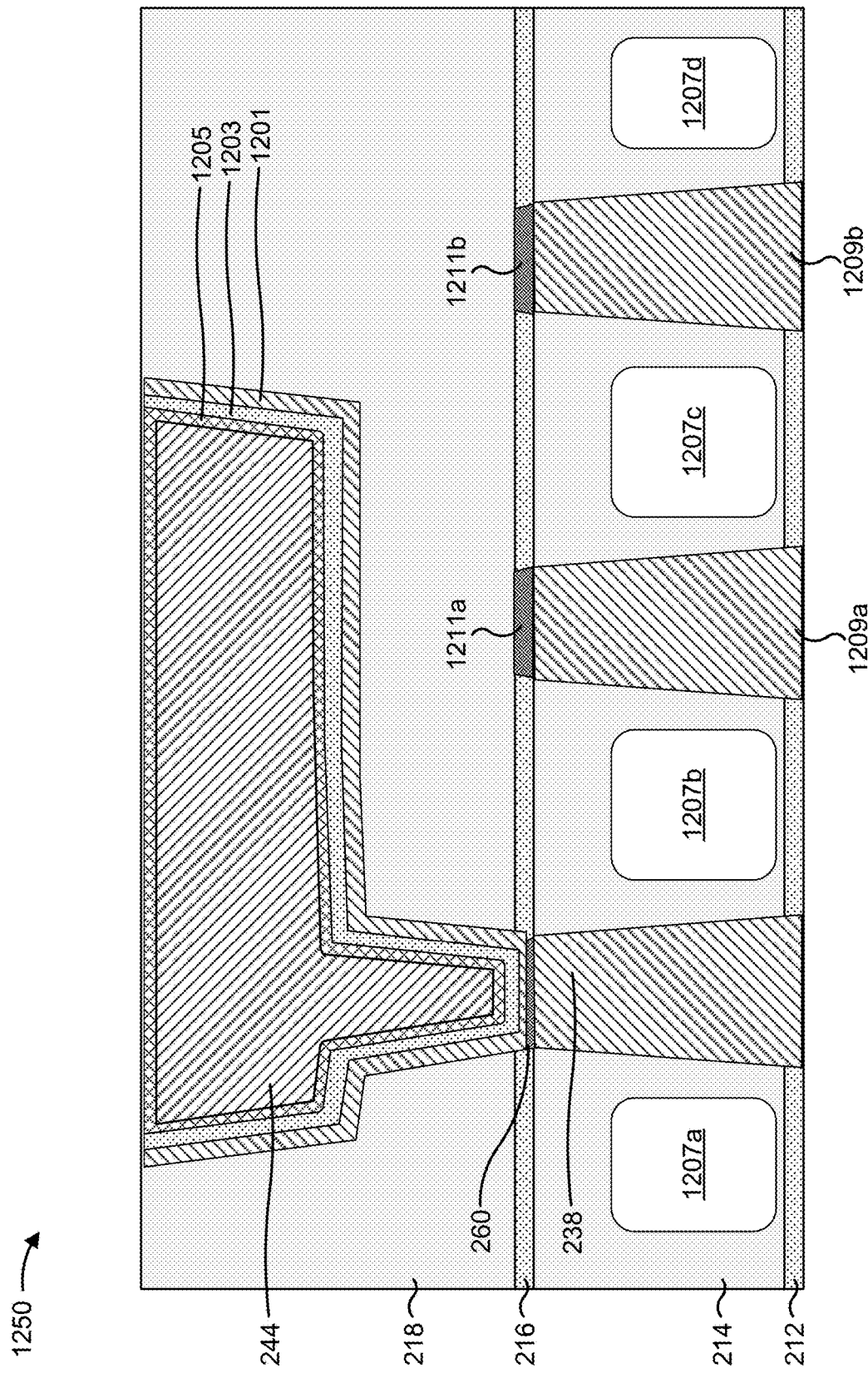

FIG. 12B is a diagram of an example semiconductor structure 1250 described herein. The semiconductor structure 1250 is similar to semiconductor structure 1200 except that the cobalt is deposited before the ESL 216 and the dielectric layer 218 are formed. For example, cobalt may be selectively deposited on metal such that dummy conductive structures 1209a and 1209b additionally include cobalt caps 1211a and 1211b, respectively, along with cobalt cap 260 between the conductive structure 238 and the conductive structure 244. The conductive structure 238 may be separate from dummy structures 1209a and 1209b using air pockets 1207a, 1207b, 1207c, and 1207d and/or other isolation structures (such as shallow trench isolation (STI) structures).

As indicated above, FIGS. 12A and 12B are provided as examples. Other examples may differ from what is described with regard to FIGS. 12A and 12B.

FIG. 13A illustrates an example semiconductor structure 1300 described herein. Semiconductor structure 1300 is structural similar to semiconductor structure 1200, described in connection with FIG. 12A, and is dimensioned as a circuit element. FIG. 13A illustrates the conductive structure 244 with a critical dimension represented by 1301. The width 1301 at a bottom surface of the conductive structure 248 may be in a range from approximately 10 nm to approximately 22 nm. Selecting a critical dimension 1301 of at least 10 nm allows for easier control of EUV and other fabrication processes. Selecting a critical dimension 1301 of no more than 22 nm provides for sufficient miniaturization of a semiconductor device including the semiconductor structure 1300.

Figure 13B:
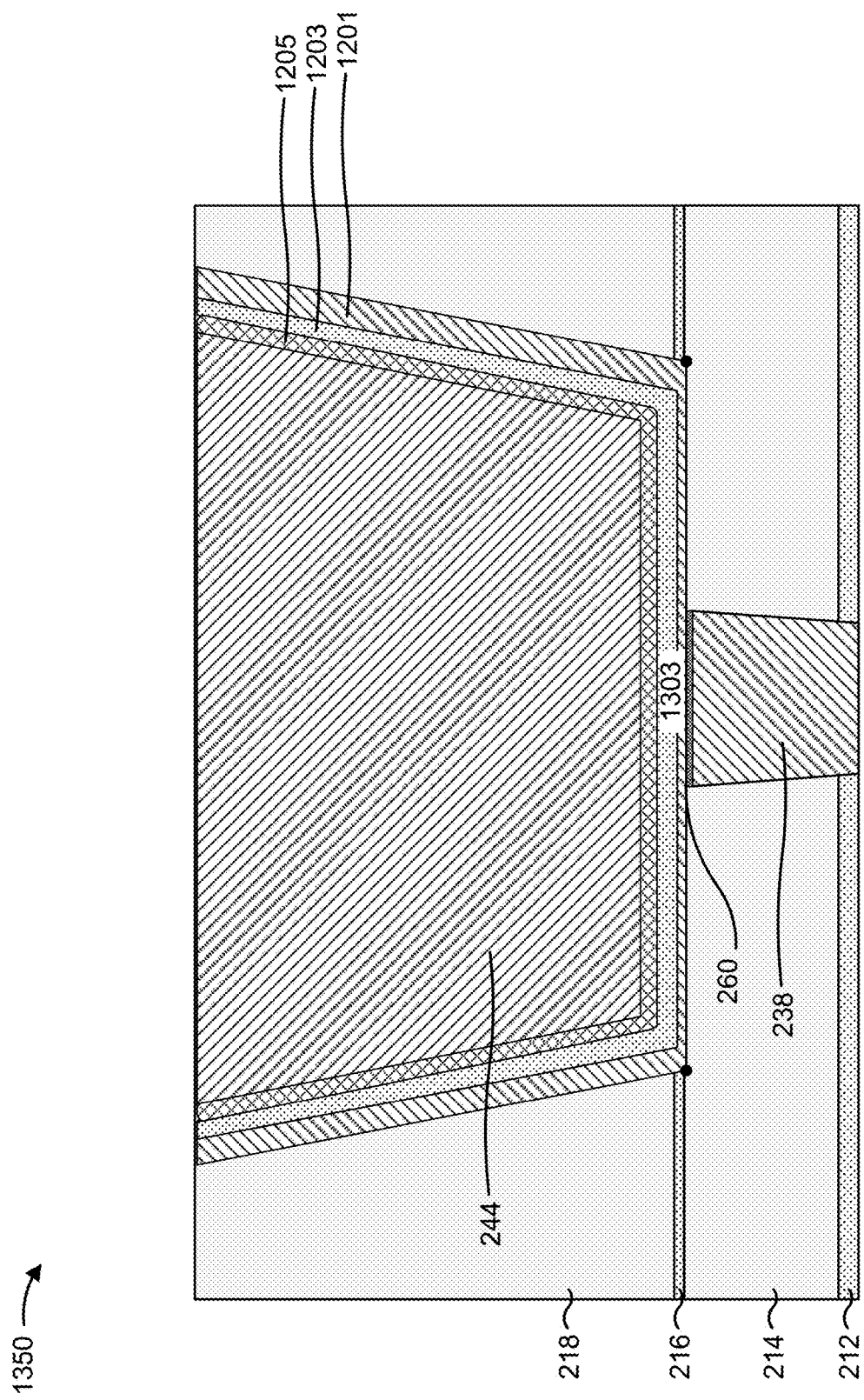

FIG. 13B illustrates an example semiconductor structure 1350 described herein. Semiconductor structure 1350 is structural similar to semiconductor structure 1200, described in connection with FIG. 12A, and is dimensioned as a seal ring. FIG. 13B illustrates the conductive structure 244 with a critical dimension represented by 1303. The width 1303 at a bottom surface of the conductive structure 248 may be in a range from approximately 100 nm to approximately 180 nm. Selecting a critical dimension 1303 of at least 100 nm electrically insulates the semiconductor structure 1350 from neighboring semiconductor structures in a same semiconductor device. Selecting a critical dimension 1303 of no more than 180 nm provides for sufficient miniaturization of the semiconductor device including the semiconductor structure 1350.

As indicated above, FIGS. 13A and 13B are provided as examples. Other examples may differ from what is described with regard to FIGS. 13A and 13B.

FIGS. 14A-14G are diagrams of an example implementation 1400 described herein. Example implementation 1400 may be an example process for forming a conductive structure 244 over a conductive structure 238 with a cobalt cap 260. The cobalt cap 260 diffuses cobalt into the conductive structure 238 to prevent further diffusion of cobalt from liner material 1205 into the conductive structure 238. As a result, electrical performance of the conductive structure 238 is improved.

Figure 14A:
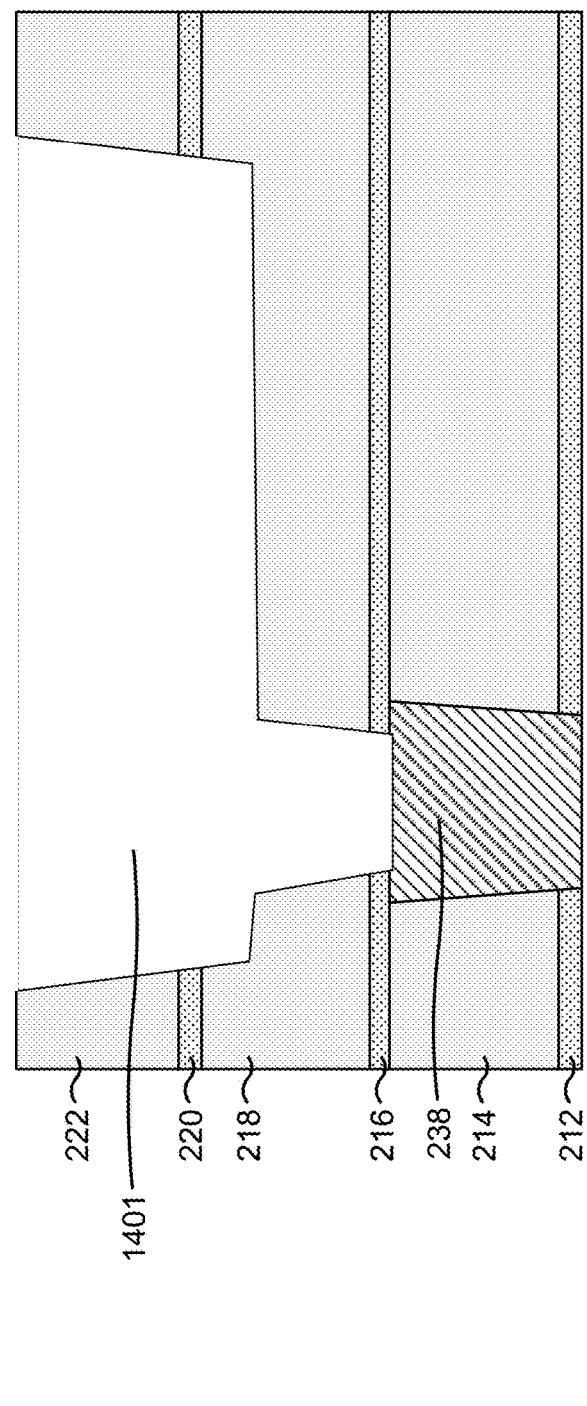
FIGS. 14A-14G are diagrams of an example implementation described herein.

As shown in FIG. 14A, the example process for forming the conductive structure 244 may be performed in connection with an MEOL. In some implementations, the MEOL includes a conductive structure 238 formed in a dielectric layer 214 that is above an ESL 212. Although described using the conductive structure 238 over a source/drain contact 230 that is over source/drain 228, the description similarly applies to conductive structure 240 over a gate contact 242 that is over gate 232.

An ESL 216 may be formed over the dielectric layer 214 and the conductive structure 244. The deposition tool 102 may deposit the ESL 216 by a CVD technique, a PVD technique, an ALD technique, or another type of deposition technique. The planarization tool 110 may planarize the ESL 216 after the ESL 216 is deposited.

A dielectric layer 218 may be formed over the ESL 216. For example, the deposition tool 102 may deposit the dielectric layer 218 by a CVD technique, a PVD technique, an ALD technique, or another type of deposition technique. The planarization tool 110 may planarize the dielectric layer 218 after the dielectric layer 218 is deposited.

Similarly, for a dual damascene profile, an additional ESL 220 may be formed over the dielectric layer 218, and an additional dielectric layer 222 may be formed over the ESL 220.

As further shown in FIG. 14A, the dielectric layers 222 and 218 may be etched to form an opening (resulting in recess 1401) such that the conductive structure 238 is at least partially exposed. For example, the deposition tool 102 may form a photoresist layer on the dielectric layer 222 (or on an ESL formed on the dielectric layer 222, such as ESL 224), the exposure tool 104 may expose the photoresist layer to a radiation source to pattern the photoresist layer, the developer tool 106 may develop and remove portions of the photoresist layer to expose the pattern, and the etch tool 108 may etch portions of the dielectric layers 222 and 218 to form the recess 1401. In some implementations, a photoresist removal tool removes the remaining portions of the photoresist layer (e.g., using a chemical stripper, a plasma asher, and/or another technique) after the etch tool 108 etches the recess 1401. For a dual damascene profile, as shown in FIG. 14A, the recess 1401 may be formed using at least two separate etching steps.

Figure 14B:
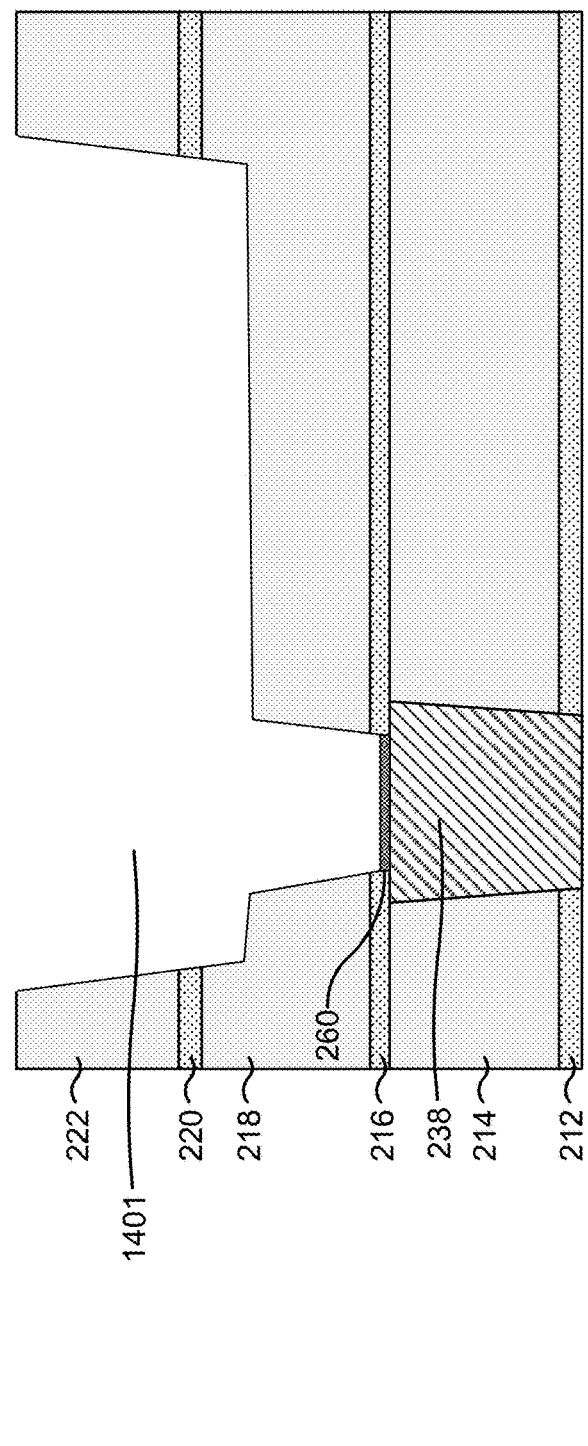

As shown in FIG. 14B, a cobalt cap 260 may be formed over the conductive structure 238. The deposition tool 102 may deposit the cobalt cap 260 by a CVD technique, a PVD technique, an ALD technique, or another type of deposition technique. In some implementations, the deposition tool 102 deposits the cobalt cap 260 for an amount of time in a range from approximately 1 minute to approximately 10 minutes. Selecting at least 1 minute ensures that the cobalt cap 260 is thick enough such that enough cobalt atoms are diffused to prevent further diffusion from the liner material 1205. Selecting no more than 10 minutes ensures that the cobalt cap 260 is thin enough such that too many cobalt atoms do not diffuse from the cobalt cap 260.

As described above in connection with FIG. 9B, the cobalt cap 260 may be formed on the conductive structure 238 after forming and etching the ESLs 216 and 220 and the dielectric layers 218 and 222, or the deposition tool 102 may deposit cobalt before forming and etching the ESLs 216 and 220 and the dielectric layers 218 and 222. For example, the deposition tool 102 may selectively deposit cobalt on the conductive structure 238 but not on the dielectric layer 214 by using a precursor that reacts with metal but not with dielectric material. Accordingly, the ESLs 216 and 220 and the dielectric layers 218 and 222 are etched to expose the cobalt cap that is already formed on a top surface of the conductive structure 238.

Figure 14C:
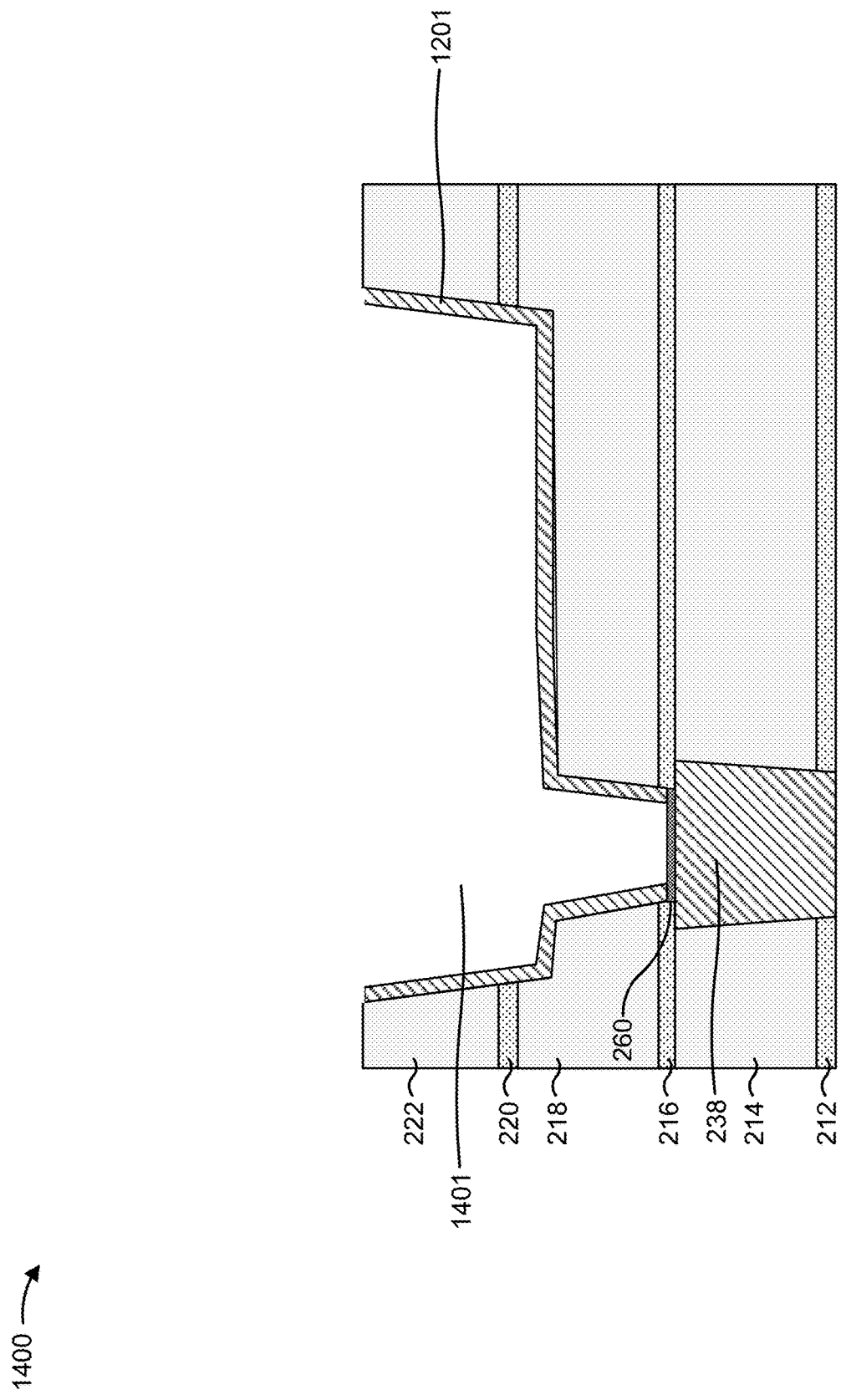

As shown in FIG. 14C, a barrier layer 901 may be formed over sidewalls of the recess 1401. The deposition tool 102 may deposit the barrier layer 1201 by a CVD technique, a PVD technique, an ALD technique, or another type of deposition technique. In some implementations, the barrier layer 1201 is deposited on the dielectric layer 222 as well. In some implementations, the deposition tool 102 deposits the barrier layer 1201 for an amount of time in a range from approximately 1 minute to approximately 10 minutes. Selecting at least 1 minute ensures that the barrier layer 1201 is thick enough to prevent diffusion of copper from conductive structure 244. Selecting no more than 10 minutes ensures that the barrier layer 1201 is not too thick so as to significantly increase contact resistance between the conductive structure 238 and the conductive structure 248.

In some implementations, the barrier layer 1201 forms less effectively on the cobalt cap 260 as compared with other portions of the recess 1401. Accordingly, as described in connection with FIG. 12A, the barrier layer 1201 may have a thickness from approximately 3 Å to approximately 8 Å over the cobalt cap 260 and a thickness from approximately 8 Å to approximately 20 Å over the other portions of the recess 1401.

Figure 14D:
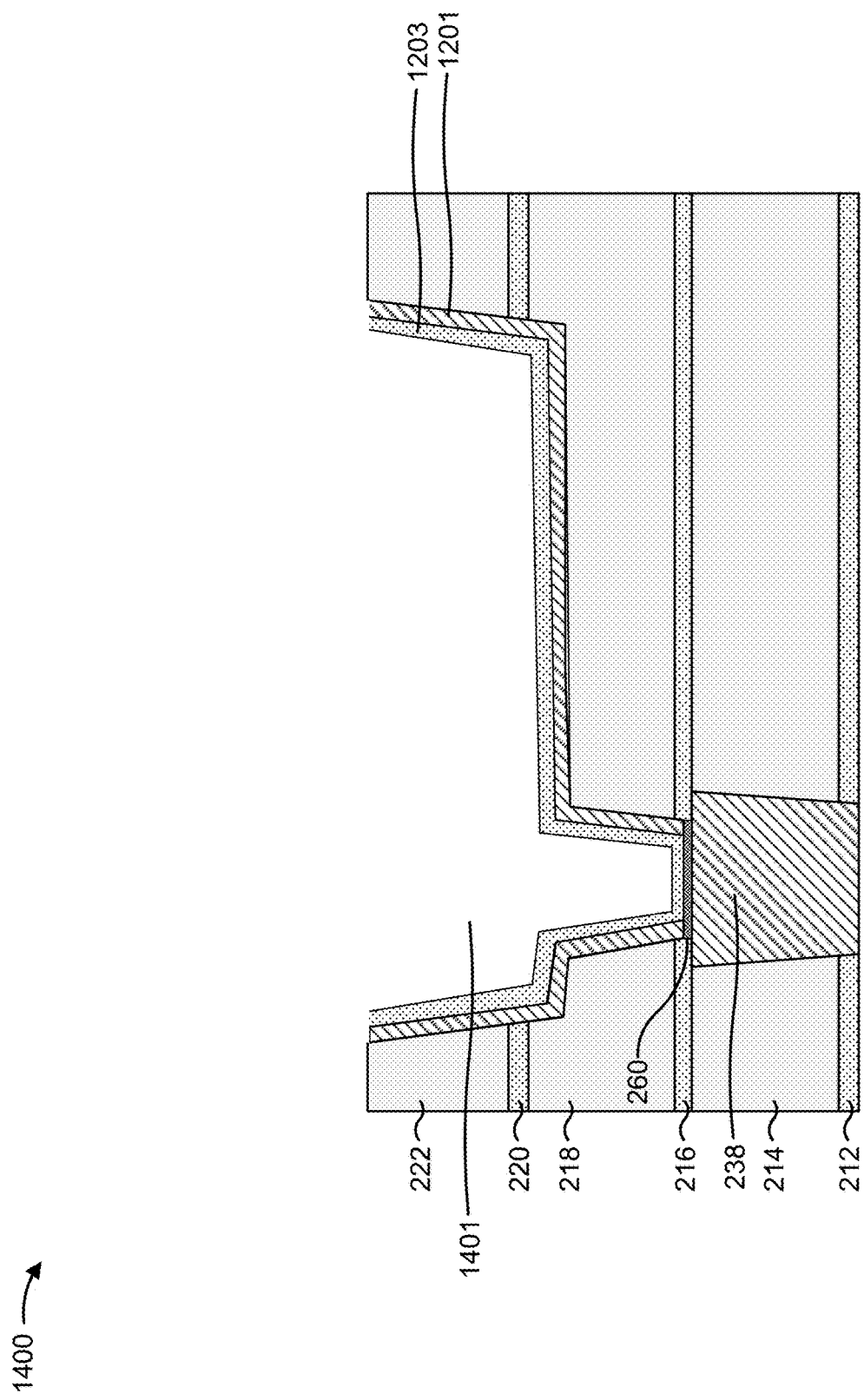

As shown in FIG. 14D, a liner material 1203 may be formed over the barrier layer 1201. The deposition tool 102 may deposit the liner material 1203 by a CVD technique, a PVD technique, an ALD technique, or another type of deposition technique. In some implementations, the liner material 1203 is deposited over the dielectric layer 222 as well. In some implementations, the deposition tool 102 deposits the liner material 1203 for an amount of time in a range from approximately 1 minute to approximately 10 minutes. Selecting at least 1 minute ensures that the liner material 1203 is thick enough to improve the adhesion for the conductive structure 244. Selecting no more than 10 minutes ensures that the liner material 1203 is not too thick so as to significantly increase sheet resistance of the conductive structure 244. In some implementations, the liner material 1203 includes ruthenium in order to improve the flow of copper into recess 1101.

Figure 14E:
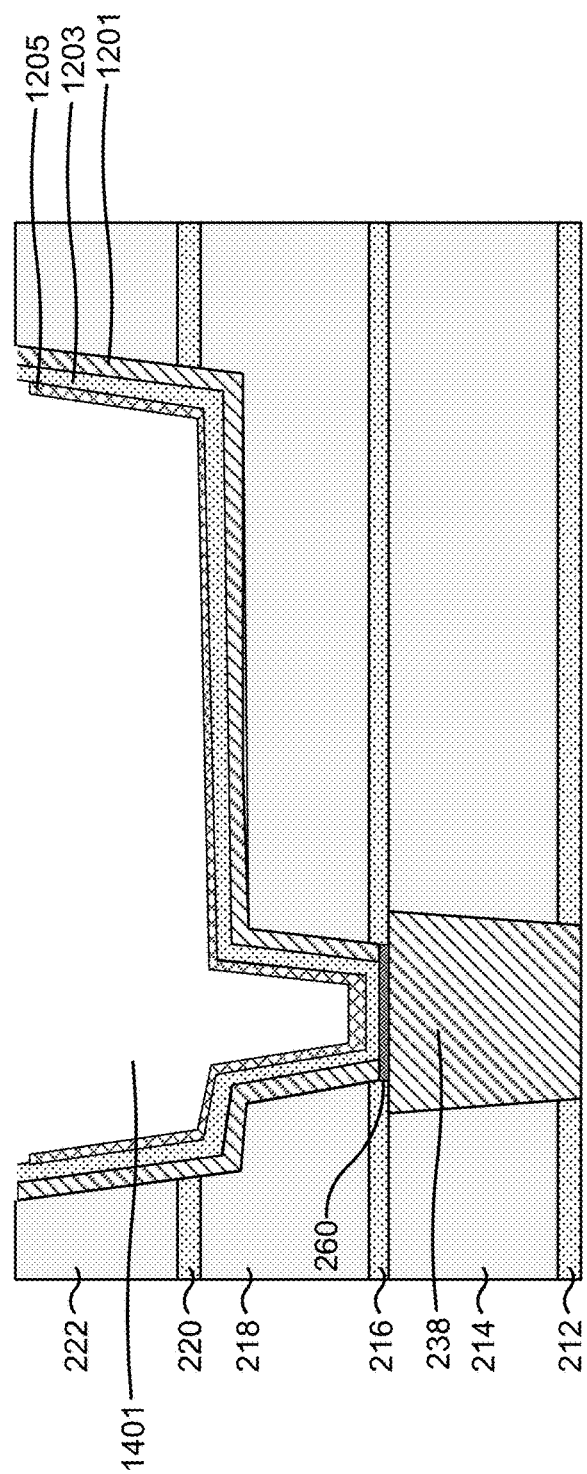

As shown in FIG. 14E, a liner material 1205 may be formed over the liner material 1203. The deposition tool 102 may deposit the liner material 1205 by a CVD technique, a PVD technique, an ALD technique, or another type of deposition technique. In some implementations, the liner material 1205 is deposited over the dielectric layer 222 as well. In some implementations, the deposition tool 102 deposits the liner material 1205 for an amount of time in a range from approximately 1 minute to approximately 10 minutes. Selecting at least 1 minute ensures that the liner material 1205 is thick enough to reduce sheet resistance of the conductive structure 244. Selecting no more than 10 minutes ensures that the liner material 1205 is not too thick so as to significantly increase contact resistance of the conductive structure 244. In some implementations, the liner material 1205 includes cobalt in order to reduce sheet resistance of the conductive structure 244.

Figure 14F:
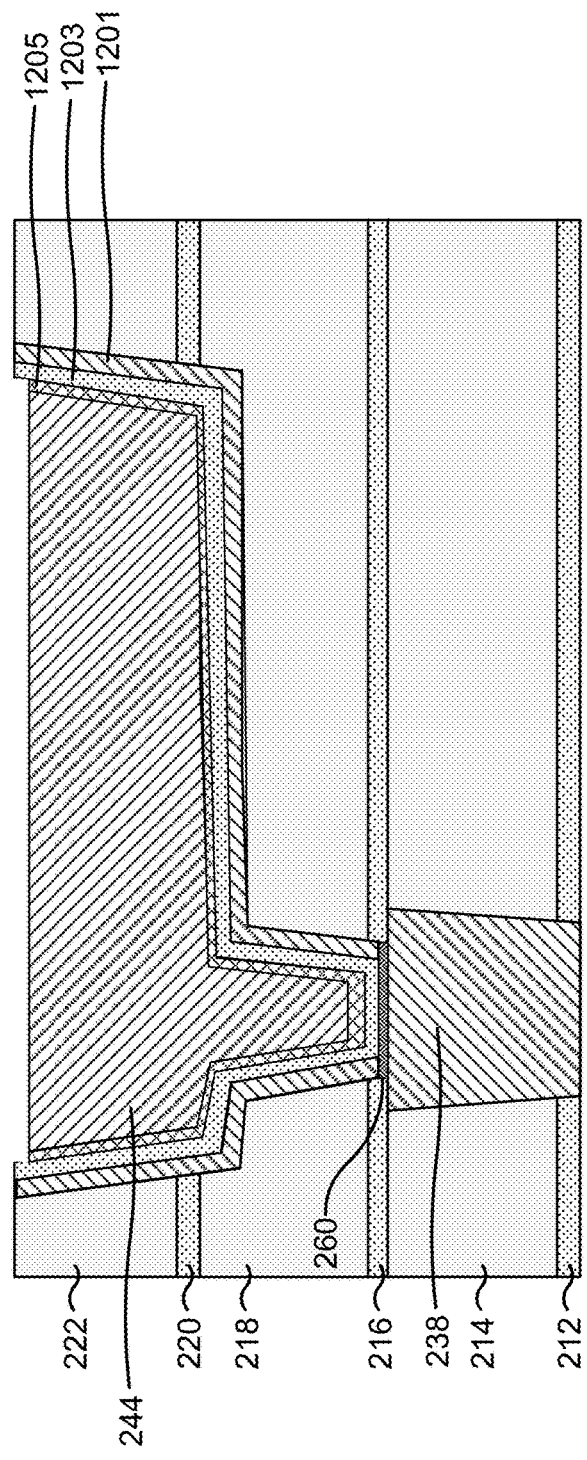

As shown in FIG. 14F, the conductive structure 244 may be formed in the recess 1401 and over the barrier layer 1201 and the liner materials 1203 and 1205. The deposition tool 102 may deposit the copper of the conductive structure 244 using a CVD technique, a PVD technique, an ALD technique, or another type of deposition technique, the plating tool 112 may deposit the copper of the conductive structure 244 using an electroplating operation, or a combination thereof.

In some implementations, the copper flows over the dielectric layer 222 as well as into the recess 1401. Accordingly, the conductive structure 244 may be planarized. The planarization tool 110 may planarize the conductive structure 244 after the conductive structure 244 is deposited. Additionally, portions of the barrier layer 1201 and the liner materials 1203 and 1205 deposited over the dielectric layer 222 may be removed during planarization.

Figure 14G:
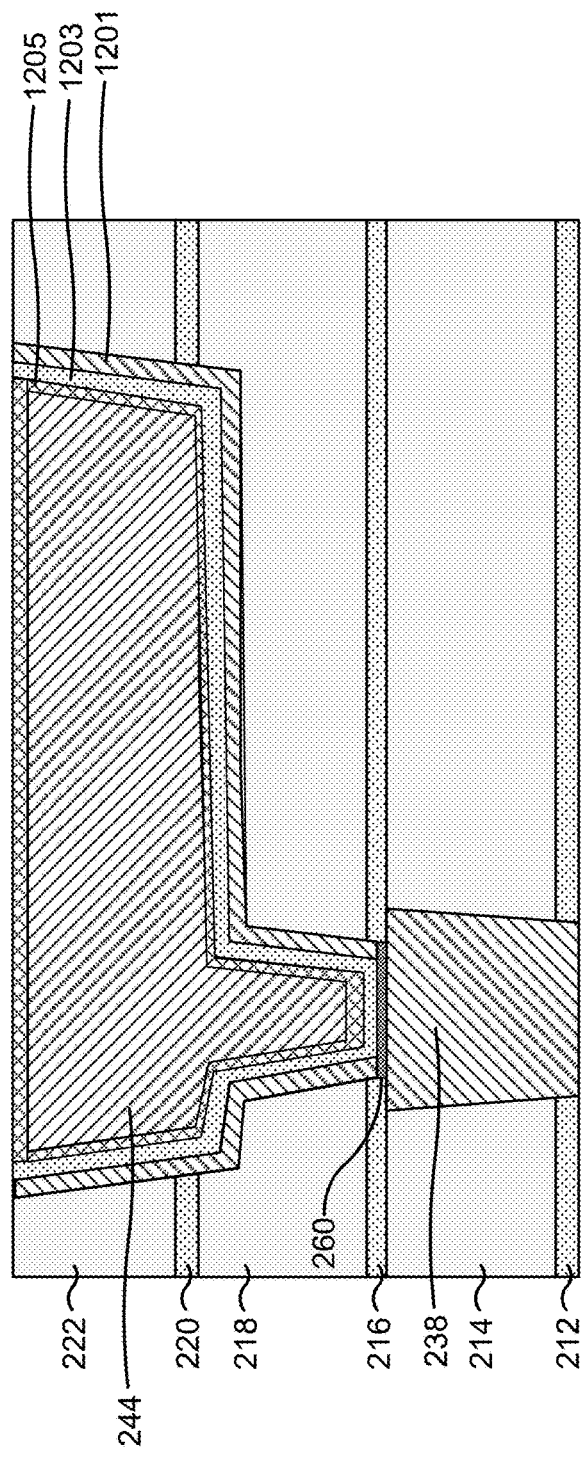

In some implementations, the planarization tool 110 uses CMP, which causes a recess to form in the conductive structure 244 due to dishing. Accordingly, as shown in FIG. 14G, additional cobalt may be formed in the recess and on a top surface of the conductive structure 244. The deposition tool 102 may deposit the cobalt by a CVD technique, a PVD technique, an ALD technique, or another type of deposition technique.

By using techniques as described in connection with FIGS. 14A-14E, the barrier layer 1201 prevents diffusion of copper from the conductive structure 244, which reduces resistivity of the conductive structure 244, the liner material 1203 improves flow of copper into the recess 1401, and the cobalt cap 260 prevents diffusion from the liner material 1205 into the conductive structure 238. As indicated above, FIGS. 14A-14E are provided as an example. Other examples may differ from what is described with regard to FIGS. 14A-14E. For example, in some implementations, one or more of the barrier layer 1201, the liner material 1203, or the liner material 1205 may be omitted.

In some implementations, and as described in connection with FIG. 2, one or more graphene caps formed according to example implementations 800 and 1100 may be used in combination in the same semiconductor device. Additionally, or alternatively, one or more graphene caps formed according to example implementation 800 and/or examples implementation 1100 may be used in combination with one or more cobalt caps formed according to example implementation 1400 in the same semiconductor device.

In this way, a graphene cap between a cobalt liner of an M0 interconnect and a VD or a VG blocks diffusion of cobalt from the liner into the VD or the VG. The graphene cap also blocks, or at least reduces, deposition of a barrier layer (e.g., titanium nitride (TiN), tantalum nitride (TaN), or another nitride material) in order to reduce contact resistance at an interface between the VD or the VG and the M0 interconnect. Additionally, or alternatively, a graphene cap over an M1 layer, an M2 layer, an M3 layer, or another BEOL conductive structure (or metallization layer) blocks upward diffusion of copper from the BEOL conductive structure. Additionally, the graphene cap does not diffuse (unlike cobalt does) and selectively deposits on the BEOL conductive structure but not a surrounding dielectric (unlike ruthenium). Additionally, or alternatively, a cobalt cap between a cobalt liner of an M1 layer and a single damascene metal etched M0 interconnect diffuses cobalt into the M0 interconnect and prevents additional diffusion of the cobalt liner. The cobalt cap may also be used to block, or at least reduce, deposition of a barrier layer (e.g., titanium nitride (TiN), tantalum nitride (TaN), or another nitride material) in order to reduce contact resistance at an interface between the M1 layer and the M0 interconnect.

Figure 15:
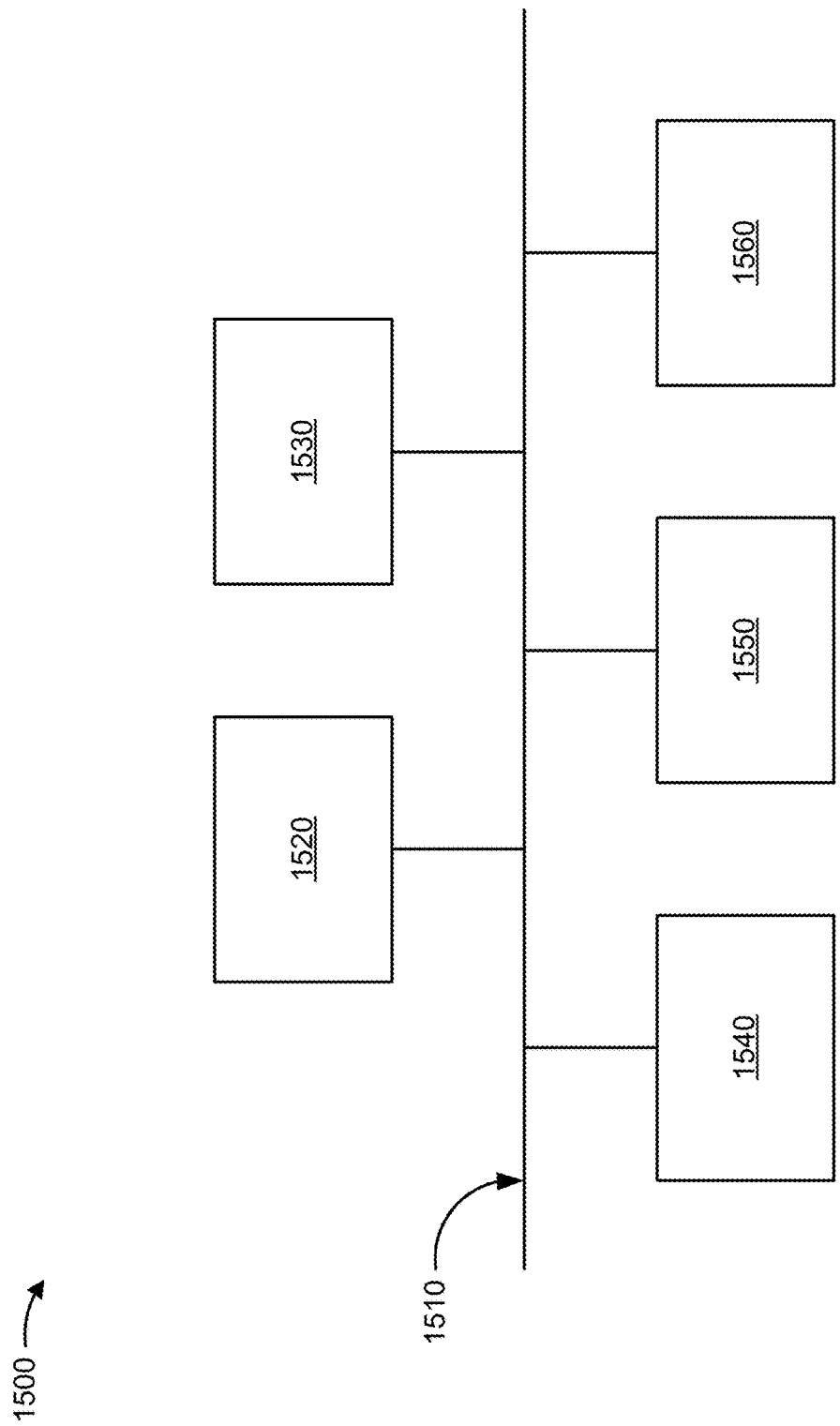
FIG. 15 is a diagram of example components of one or more devices of FIG. 1 described herein.

FIG. 15 is a diagram of example components of a device 1500. In some implementations, one or more of the semiconductor processing tools 102-114 and/or the wafer/die transport tool 116 may include one or more devices 1500 and/or one or more components of device 1500. As shown in FIG. 15, device 1500 may include a bus 1510, a processor 1520, a memory 1530, an input component 1540, an output component 1550, and a communication component 1560.

Bus 1510 includes one or more components that enable wired and/or wireless communication among the components of device 1500. Bus 1510 may couple together two or more components of FIG. 15, such as via operative coupling, communicative coupling, electronic coupling, and/or electric coupling. Processor 1520 includes a central processing unit, a graphics processing unit, a microprocessor, a controller, a microcontroller, a digital signal processor, a field-programmable gate array, an application-specific integrated circuit, and/or another type of processing component. Processor 1520 is implemented in hardware or a combination of hardware and software. In some implementations, processor 1520 includes one or more processors capable of being programmed to perform one or more operations or processes described elsewhere herein.

Memory 1530 includes volatile and/or nonvolatile memory. For example, memory 1530 may include random access memory (RAM), read only memory (ROM), a hard disk drive, and/or another type of memory (e.g., a flash memory, a magnetic memory, and/or an optical memory). Memory 1530 may include internal memory (e.g., RAM, ROM, or a hard disk drive) and/or removable memory (e.g., removable via a universal serial bus connection). Memory 1530 may be a non-transitory computer-readable medium. Memory 1530 stores information, instructions, and/or software (e.g., one or more software applications) related to the operation of device 1500. In some implementations, memory 1530 includes one or more memories that are coupled to one or more processors (e.g., processor 1520), such as via bus 1510.

Input component 1540 enables device 1500 to receive input, such as user input and/or sensed input. For example, input component 1540 may include a touch screen, a keyboard, a keypad, a mouse, a button, a microphone, a switch, a sensor, a global positioning system sensor, an accelerometer, a gyroscope, and/or an actuator. Output component 1550 enables device 1500 to provide output, such as via a display, a speaker, and/or a light-emitting diode. Communication component 1560 enables device 1500 to communicate with other devices via a wired connection and/or a wireless connection. For example, communication component 1560 may include a receiver, a transmitter, a transceiver, a modem, a network interface card, and/or an antenna.

Device 1500 may perform one or more operations or processes described herein. For example, a non-transitory computer-readable medium (e.g., memory 1530) may store a set of instructions (e.g., one or more instructions or code) for execution by processor 1520. Processor 1520 may execute the set of instructions to perform one or more operations or processes described herein. In some implementations, execution of the set of instructions, by one or more processors 1520, causes the one or more processors 1520 and/or the device 1500 to perform one or more operations or processes described herein. In some implementations, hardwired circuitry may be used instead of or in combination with the instructions to perform one or more operations or processes described herein. Additionally, or alternatively, processor 1520 may be configured to perform one or more operations or processes described herein. Thus, implementations described herein are not limited to any specific combination of hardware circuitry and software.

The number and arrangement of components shown in FIG. 15 are provided as an example. Device 1500 may include additional components, fewer components, different components, or differently arranged components than those shown in FIG. 15. Additionally, or alternatively, a set of components (e.g., one or more components) of device 1500 may perform one or more functions described as being performed by another set of components of device 1500.

Figure 16:
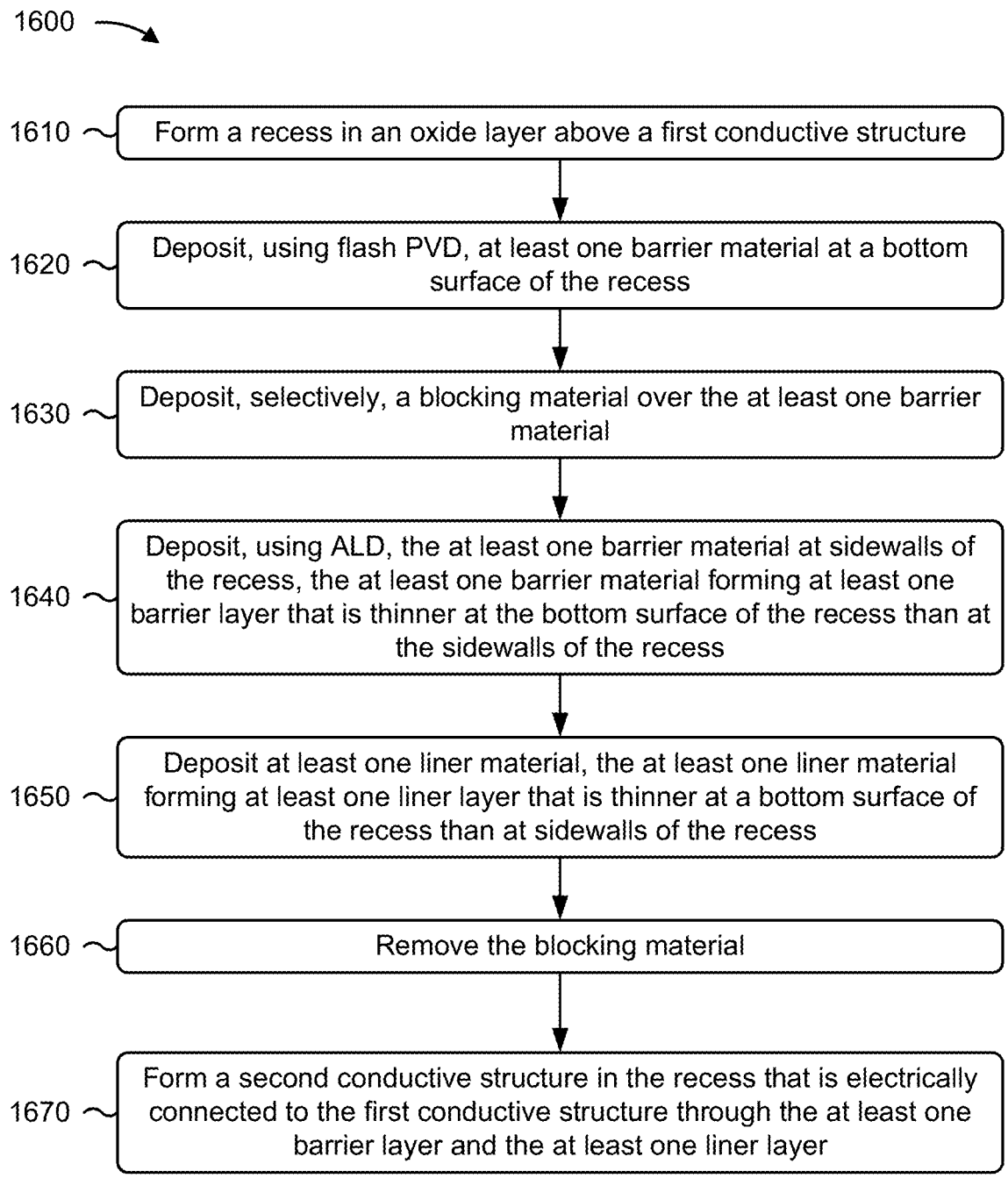
FIGS. 16-19 are flowcharts of example processes relating to forming conductive structures described herein.

FIG. 16 is a flowchart of an example process 1600 relating to forming conductive structures described herein. In some implementations, one or more process blocks of FIG. 16 may be performed by one or more semiconductor processing tools (e.g., one or more of the semiconductor processing tools 102-114). Additionally, or alternatively, one or more process blocks of FIG. 16 may be performed by one or more components of device 1500, such as processor 1520, memory 1530, input component 1540, output component 1550, and/or communication component 1560.

As shown in FIG. 16, process 1600 may include forming a recess in a dielectric layer above a first conductive structure (block 1610). For example, the one or more semiconductor processing tools 102-114 may form a recess 501 in a dielectric layer 222/226 above a first conductive structure 248, as described herein.

As further shown in FIG. 16, process 1600 may include depositing, using flash PVD, at least one barrier material at a bottom surface of the recess (block 1620). For example, the one or more semiconductor processing tools 102-114 may deposit, using flash PVD, at least one barrier material 301 at a bottom surface of the recess 501, as described herein.

As further shown in FIG. 16, process 1600 may include depositing, selectively, a blocking material over the at least one barrier material (block 1630). For example, the one or more semiconductor processing tools 102-114 may deposit, selectively, a blocking material 503 over the at least one barrier material 301, as described herein.

As further shown in FIG. 16, process 1600 may include depositing, using ALD, the at least one barrier material at sidewalls of the recess (block 1640). For example, the one or more semiconductor processing tools 102-114 may deposit, using ALD, the at least one barrier material 301 at sidewalls of the recess 501, as described herein. In some implementations, the at least one barrier material 301 forms at least one barrier layer that is thinner at the bottom surface of the recess than at the sidewalls of the recess 501.

As further shown in FIG. 16, process 1600 may include depositing at least one liner material (block 1650). For example, the one or more semiconductor processing tools 102-114 may deposit at least one liner material 303, as described herein. In some implementations, the at least one liner material 303 forms at least one liner layer that is thinner at a bottom surface of the recess than at sidewalls of the recess 501.

As further shown in FIG. 16, process 1600 may include removing the blocking material (block 1660). For example, the one or more semiconductor processing tools 102-114 may remove the blocking material 503, as described herein.

As further shown in FIG. 16, process 1600 may include forming a second conductive structure in the recess (block 1670). For example, the one or more semiconductor processing tools 102-114 may form a second conductive structure 248 in the recess 501, as described herein. In some implementations, the second conductive structure 248 is electrically connected to the first conductive structure 244 through the at least one barrier layer 301 and the at least one liner layer 303.

Process 1600 may include additional implementations, such as any single implementation or any combination of implementations described below and/or in connection with one or more other processes described elsewhere herein.

In a first implementation, forming the recess 501 includes forming the recess 501 using a dual damascene process, such that the bottom surface of the recess includes a first portion and second portion, the first portion being lower in the dielectric layer 222/226 relative to the second portion.

In a second implementation, alone or in combination with the first implementation, depositing the at least one barrier material 301 at the bottom surface of the recess 501 includes using directional deposition to deposit the at least one barrier material 301 at the bottom surface and not at the sidewalls, such that the at least one barrier material 301 is deposited on at least a portion of a top surface of the dielectric layer 222/226.

In a third implementation, alone or in combination with one or more of the first and second implementations, process 1600 further includes etching the at least one barrier material 301 from the top surface of the dielectric layer 222/226.

In a fourth implementation, alone or in combination with one or more of the first through third implementations, removing the blocking material 503 includes etching the blocking material 503 using a hydrogen or ammonia plasma.

In a fifth implementation, alone or in combination with one or more of the first through fourth implementations, forming the second conductive structure 248 includes flowing copper into the recess 501 and planarizing the copper using CMP.

Although FIG. 16 shows example blocks of process 1600, in some implementations, process 1600 may include additional blocks, fewer blocks, different blocks, or differently arranged blocks than those depicted in FIG. 16. Additionally, or alternatively, two or more of the blocks of process 1600 may be performed in parallel.

Figure 17:
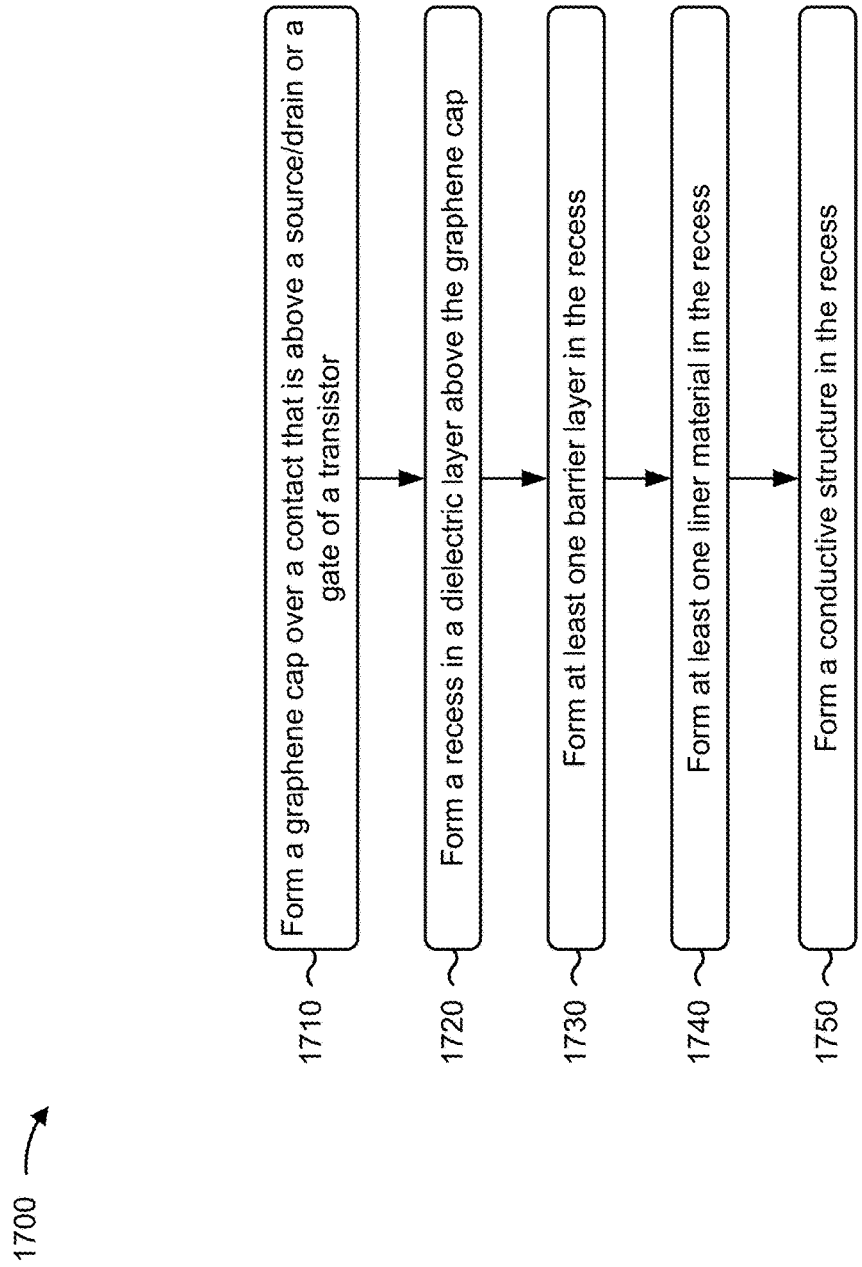

FIG. 17 is a flowchart of an example process 1700 associated with forming caps for MEOL and BEOL conductive structures. In some implementations, one or more process blocks of FIG. 17 be performed by one or more semiconductor processing tools (e.g., one or more of the semiconductor processing tools 102-114). Additionally, or alternatively, one or more process blocks of FIG. 17 may be performed by one or more components of device 1500, such as processor 1520, memory 1530, input component 1540, output component 1550, and/or communication component 1560.

As shown in FIG. 17, process 1700 may include forming a graphene cap over a contact that is above a source/drain or a gate of a transistor (block 1710). For example, the one or more semiconductor processing tools 102-114 may form a graphene cap 256/258 over a contact 242/230 that is above a source/drain 228 or a gate 232 of a transistor, as described herein.

As further shown in FIG. 17, process 1700 may include forming a recess in a dielectric layer above the graphene cap (block 1720). For example, the one or more semiconductor processing tools 102-114 may form a recess 802 in a dielectric layer 214 above the graphene cap 256/258, as described herein.

As further shown in FIG. 17, process 1700 may include forming at least one barrier layer in the recess (block 1730). For example, the one or more semiconductor processing tools 102-114 may form at least one barrier layer 301 in the recess 802, as described herein.

As further shown in FIG. 17, process 1700 may include forming at least one liner material in the recess (block 1740). For example, the one or more semiconductor processing tools 102-114 may form at least one liner material 303 in the recess 802, as described herein.

As further shown in FIG. 17, process 1700 may include forming a conductive structure in the recess (block 1750). For example, the one or more semiconductor processing tools 102-114 may form a conductive structure 240/238 in the recess 802, as described herein. In some implementations, the conductive structure 240/238 is electrically connected to the contact 242/230 through the graphene cap 256/258, the at least one barrier layer 601, and the at least one liner material 603.

Process 1700 may include additional implementations, such as any single implementation or any combination of implementations described below and/or in connection with one or more other processes described elsewhere herein.

In a first implementation, the graphene cap 256/258 has a thickness in a range from approximately 2 Å to approximately 15 Å.

In a second implementation, alone or in combination with the first implementation, the conductive structure 240/238 includes copper.

In a third implementation, alone or in combination with one or more of the first and second implementations, the at least one barrier layer 601 includes a nitride layer adapted to reduce diffusion from the conductive structure 240/238.

In a fourth implementation, alone or in combination with one or more of the first through third implementations, the at least one liner material 603 includes cobalt, ruthenium, or a combination thereof.

In a fifth implementation, alone or in combination with one or more of the first through fourth implementations, the contact 242/230 includes copper, cobalt, ruthenium, or a combination thereof.

In a sixth implementation, alone or in combination with one or more of the first through fifth implementations, a bottom surface of the conductive structure 240/238 is associated with a first width 703/705, a top surface of the contact 242/230 is associated with a second width 701, and the first width is larger than the second width.

Although FIG. 17 shows example blocks of process 1700, in some implementations, process 1700 may include additional blocks, fewer blocks, different blocks, or differently arranged blocks than those depicted in FIG. 17. Additionally, or alternatively, two or more of the blocks of process 1700 may be performed in parallel.

Figure 18:
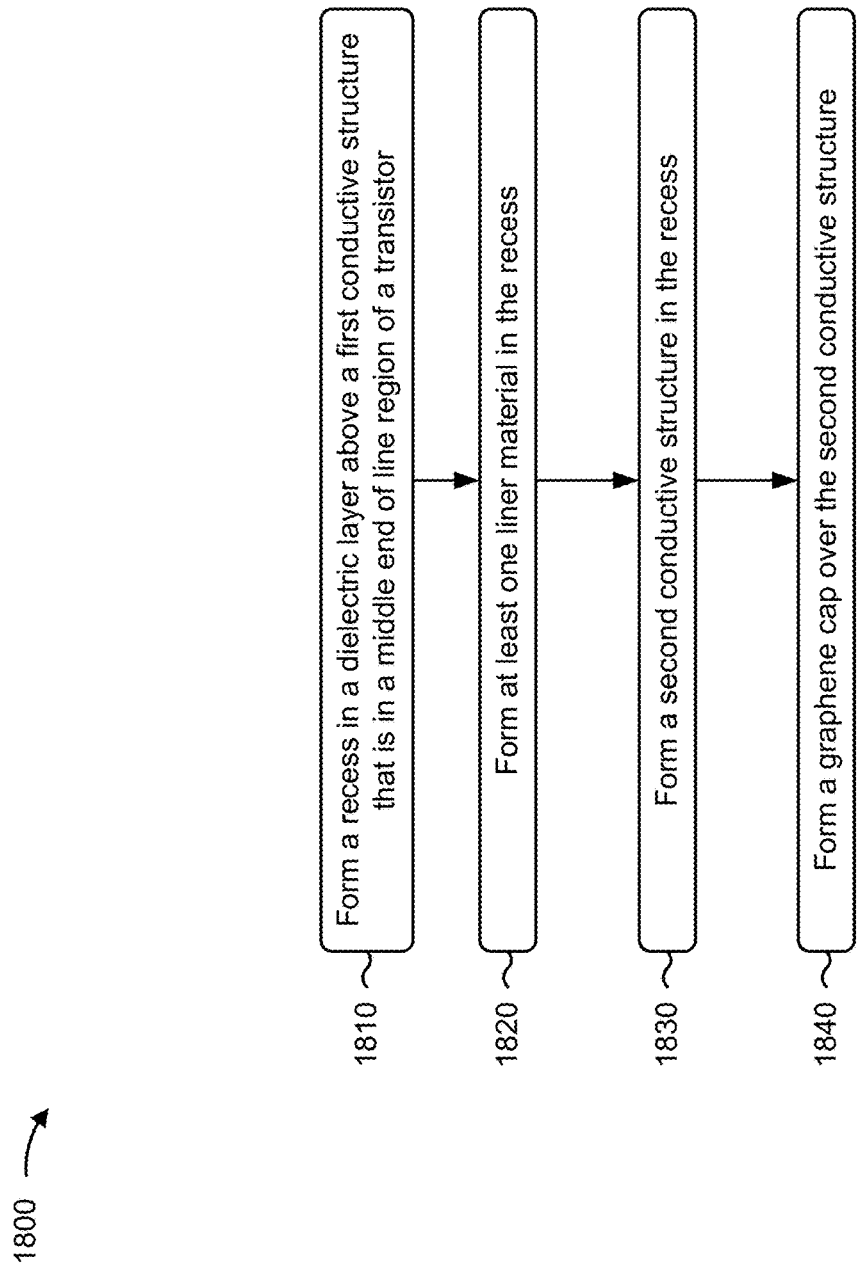

FIG. 18 is a flowchart of an example process 1800 associated with forming caps for MEOL and BEOL conductive structures. In some implementations, one or more process blocks of FIG. 18 may be performed by one or more semiconductor processing tools (e.g., one or more of the semiconductor processing tools 102-114). Additionally, or alternatively, one or more process blocks of FIG. 18 may be performed by one or more components of device 1500, such as processor 1520, memory 1530, input component 1540, output component 1550, and/or communication component 1560.

As shown in FIG. 18, process 1800 may include forming a recess in a dielectric layer above a first conductive structure that is in a middle end of line region of a transistor (block 1810). For example, the one or more semiconductor processing tools 102-114 may form a recess 1101 in a dielectric layer 218/222 above a first conductive structure 246/244 that is in a middle end of line region of a transistor, as described herein.

As further shown in FIG. 18, process 1800 may include forming at least one liner material in the recess (block 1820). For example, the one or more semiconductor processing tools 102-114 may form at least one liner material 903 in the recess 1101, as described herein.

As further shown in FIG. 18, process 1800 may include forming a second conductive structure in the recess (block 1830). For example, the one or more semiconductor processing tools 102-114 may form a second conductive structure 250/248 in the recess 1101, as described herein. In some implementations, the second conductive structure 248 is electrically connected to the first conductive structure 246/244 through the at least one liner material 903.

As further shown in FIG. 18, process 1800 may include forming a graphene cap over the second conductive structure (block 1840). For example, the one or more semiconductor processing tools 102-114 may form a graphene cap 264/268 over the second conductive structure 250/248, as described herein.

Process 1800 may include additional implementations, such as any single implementation or any combination of implementations described below and/or in connection with one or more other processes described elsewhere herein.

In a first implementation, the graphene cap 264/268 has a thickness in a range from approximately 2 Å to approximately 15 Å.

In a second implementation, alone or in combination with the first implementation, the graphene cap 264/268 is formed on a portion of the at least one liner material 903 and not on an oxide material 218/222 surrounding the second conductive structure 250/248.

In a third implementation, alone or in combination with one or more of the first and second implementations, the second conductive structure 250/248 includes copper.

In a fourth implementation, alone or in combination with one or more of the first through third implementations, the second conductive structure 250/248 is electrically connected to the first conductive structure 246/244 through at least one barrier layer 901 that includes a nitride layer adapted to reduce diffusion from the second conductive structure 250/248.

In a fifth implementation, alone or in combination with one or more of the first through fourth implementations, the graphene cap 264/268 is not formed on the at least one barrier layer 901.

In a sixth implementation, alone or in combination with one or more of the first through fifth implementations, the at least one liner material 903 includes ruthenium.

Although FIG. 18 shows example blocks of process 1800, in some implementations, process 1800 may include additional blocks, fewer blocks, different blocks, or differently arranged blocks than those depicted in FIG. 18. Additionally, or alternatively, two or more of the blocks of process 1800 may be performed in parallel.

Figure 19:
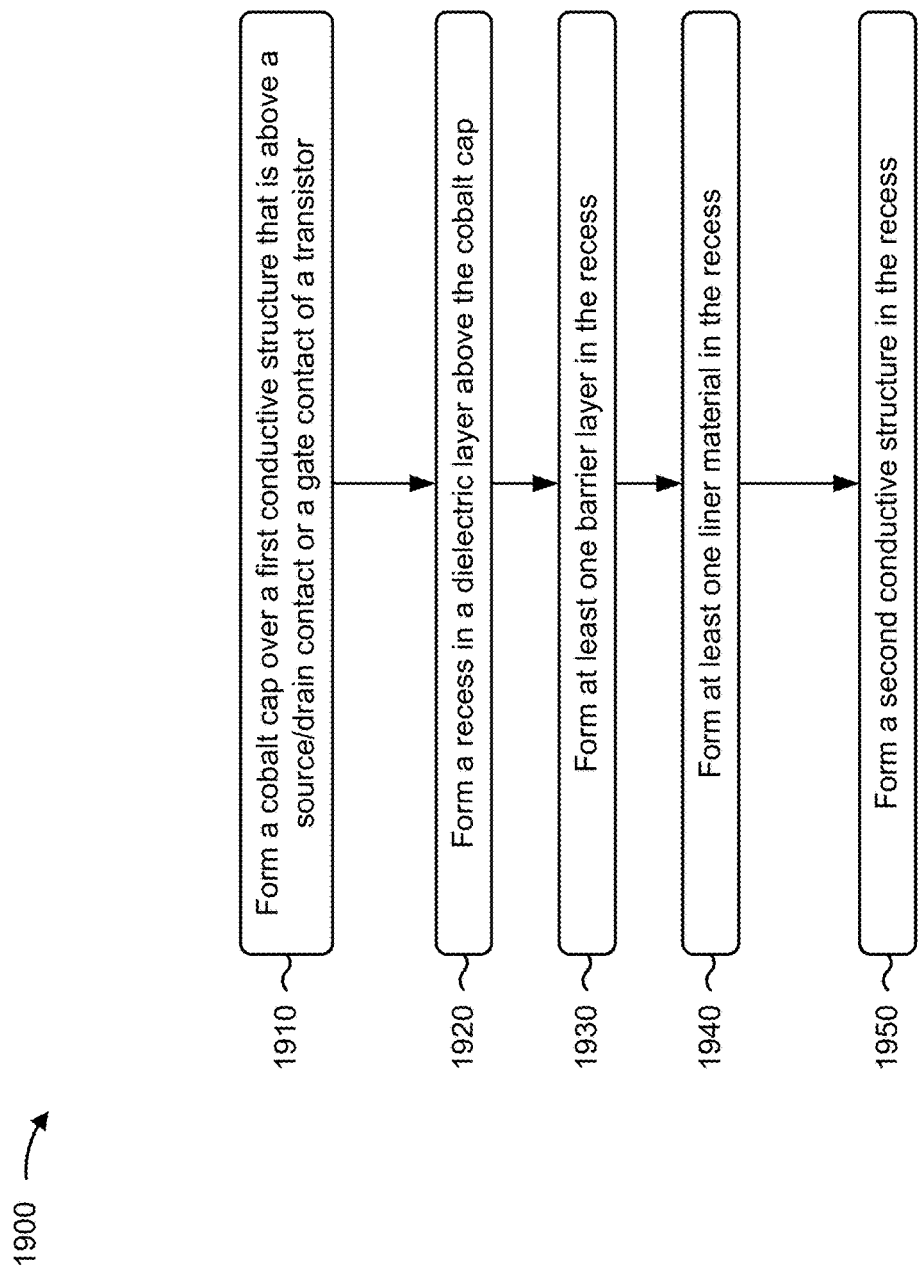

FIG. 19 is a flowchart of an example process 1900 associated with forming caps for MEOL and BEOL conductive structures. In some implementations, one or more process blocks of FIG. 19 may be performed by one or more semiconductor processing tools (e.g., one or more of the semiconductor processing tools 102-114). Additionally, or alternatively, one or more process blocks of FIG. 19 may be performed by one or more components of device 1500, such as processor 1520, memory 1530, input component 1540, output component 1550, and/or communication component 1560.

As shown in FIG. 19, process 1900 may include forming a cobalt cap over a first conductive structure that is above a source/drain contact or a gate contact of a transistor, wherein the cobalt cap is adapted to diffuse cobalt atoms into the first conductive structure (block 1910). For example, the one or more semiconductor processing tools 102-114 may form a cobalt cap 262/260 over a first conductive structure 240/238 that is above a source/drain contact 230 or a gate contact 242 of a transistor, as described herein. In some aspects, the cobalt cap 262/260 is adapted to diffuse cobalt atoms into the first conductive structure 240/238.

As further shown in FIG. 19, process 1900 may include forming a recess in a dielectric layer above the cobalt cap (block 1920). For example, the one or more semiconductor processing tools 102-114 may form a recess 1401 in a dielectric layer 218/222 above the cobalt cap 262/260, as described herein.

As further shown in FIG. 19, process 1900 may include forming at least one barrier layer in the recess (block 1930). For example, the one or more semiconductor processing tools 102-114 may form at least one barrier layer 1201 in the recess 1401, as described herein.

As further shown in FIG. 15, process 1900 may include forming at least one liner material in the recess (block 1940). For example, the one or more semiconductor processing tools 102-114 may form at least one liner material 1203/1205 in the recess 1401, as described herein.

As further shown in FIG. 19, process 1900 may include forming a second conductive structure in the recess (block 1950). For example, the one or more semiconductor processing tools 102-114 may form a second conductive structure 246/244 in the recess 1401, as described herein. In some implementations, the second conductive structure 246/244 is electrically connected to the first conductive structure 240/238 through the at least one barrier layer 1201, the at least one liner material 1203/1205, and the cobalt cap 262/260.

Process 1900 may include additional implementations, such as any single implementation or any combination of implementations described below and/or in connection with one or more other processes described elsewhere herein.

In a first implementation, the cobalt cap 262/260 has a thickness in a range from approximately 2 Å to approximately 15 Å.

In a second implementation, alone or in combination with the first implementation, the second conductive structure 246/244 includes copper.

In a third implementation, alone or in combination with one or more of the first and second implementations, the at least one barrier layer 1201 includes a nitride layer adapted to reduce diffusion from the second conductive structure 246/244.

In a fourth implementation, alone or in combination with one or more of the first through third implementations, the at least one liner material 1203/1205 includes cobalt, ruthenium, or a combination thereof.

In a fifth implementation, alone or in combination with one or more of the first through fourth implementations, the first conductive structure 240/238 includes ruthenium.

Although FIG. 19 shows example blocks of process 1900, in some implementations, process 1900 may include additional blocks, fewer blocks, different blocks, or differently arranged blocks than those depicted in FIG. 19. Additionally, or alternatively, two or more of the blocks of process 1900 may be performed in parallel.

As described in greater detail above, some implementations described herein provide a semiconductor structure. The semiconductor structure includes a conductive structure comprising copper in a recess of a surrounding dielectric layer. The semiconductor structure further includes at least one liner layer surrounding the conductive structure, wherein a thickness of the at least one liner layer is thinner at a bottom surface of the recess than at sidewalls of the recess. The semiconductor structure includes at least one barrier layer surrounding the at least one liner layer, wherein a thickness of the at least one liner layer is thinner at a bottom surface of the recess than at sidewalls of the recess.

As described in greater detail above, some implementations described herein provide a method. The method includes forming a recess in a dielectric layer above a first conductive structure. The method further includes depositing, using flash physical vapor deposition (PVD), at least one barrier material at a bottom surface of the recess. The method includes depositing, selectively, a blocking material over the at least one barrier material. The method further includes depositing, using atomic layer deposition (ALD), the at least one barrier material at sidewalls of the recess, wherein the at least one barrier material forms at least one barrier layer that is thinner at the bottom surface of the recess than at the sidewalls of the recess. The method includes depositing at least one liner material, wherein the at least one liner material forms at least one liner layer that is thinner at a bottom surface of the recess than at sidewalls of the recess. The method further includes removing the blocking material. The method includes forming a second conductive structure in the recess, wherein the second conductive structure is electrically connected to the first conductive structure through the at least one barrier layer and the at least one liner layer.

As described in greater detail above, some implementations described herein provide a semiconductor device. The semiconductor device includes a back-end-of-line region comprising a least a first conductive structure formed in a first recess in a first dielectric layer and a second conductive structure electrically connected to the first conductive structure and formed in a second recess in a second dielectric layer above the first dielectric layer. The second conductive structure is surrounded by at least one liner layer that has a first thickness at sidewalls of the second recess and a second thickness at a bottom surface of the second recess, and the second thickness is no more than 33% of the first thickness, where the at least one liner layer is surrounded by at least one barrier layer that has a third thickness at the sidewalls of the second recess and a fourth thickness at the bottom surface of the second recess, and the fourth thickness is no more than 50% of the third thickness.

As described in greater detail above, some implementations described herein provide a semiconductor structure. The semiconductor structure includes a via to drain (VD) or via to gate (VG) contact. The semiconductive structure further includes a graphene or cobalt cap formed over the VD or VG. The semiconductive structure includes a conductive structure that is electrically connected to the contact through the graphene or cobalt cap and at least one barrier layer.

As described in greater detail above, some implementations described herein provide a semiconductor structure. The semiconductor structure includes a first conductive structure in a middle-end-of-line region of a transistor. The semiconductor structure further includes a second conductive structure above the first conductive structure, wherein the second conductive structure is electrically connected to the first conductive structure through at least one liner material. The semiconductor structure includes a graphene or cobalt cap formed over the second conductive structure.

As described in greater detail above, some implementations described herein provide a semiconductor structure. The semiconductor structure includes a first conductive structure above a source/drain contact or a gate contact of a transistor. The semiconductor structure further includes a cobalt cap formed over the first conductive structure and adapted to diffuse cobalt atoms into the first conductive structure. The semiconductor structure includes a second conductive structure above the first conductive structure, wherein the second conductive structure is electrically connected to the first conductive structure through at least one barrier layer, at least one liner material, and the cobalt cap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a conductive structure comprising copper in a recess of a surrounding dielectric layer;
   a liner layer surrounding the conductive structure, wherein a thickness of the liner layer is thinner at a bottom surface of the recess than at sidewalls of the recess; and
   a barrier layer surrounding the liner layer, wherein the bottom surface of the recess includes one or more blocking materials.

2. The semiconductor structure of claim 1, wherein the one or more blocking materials comprise benzotriazole, 5-Decyne, or a combination thereof.

3. The semiconductor structure of claim 1, wherein the recess has a dual damascene profile, and wherein the bottom surface of the recess includes a first portion and second portion, the first portion being lower in the surrounding dielectric layer relative to the second portion.

4. The semiconductor structure of claim 1, wherein the barrier layer has a thickness in a range from approximately 5 Ångströms (Å) to approximately 15 Å at the bottom surface and a thickness in a range from approximately 8 Å to approximately 20 Å at the sidewalls.

5. The semiconductor structure of claim 1, wherein the liner layer has a thickness in a range from approximately 3 Ångströms (Å) to approximately 8 Å at the bottom surface and a thickness in a range from approximately 8 Å to approximately 20 Å at the sidewalls.

6. The semiconductor structure of claim 1, wherein the liner layer comprises ruthenium, and the barrier layer comprises a nitride.

7. The semiconductor structure of claim 1, wherein at least a portion of the liner layer has a first thickness, and wherein at least a portion of the barrier layer has a second thickness different from the first thickness.

8. A semiconductor structure, comprising:
   a first dielectric layer;
   a first etch stop layer residing on the first dielectric layer;
   a second dielectric layer residing on the first etch stop layer;
   a conductive structure in a recess through the first dielectric layer, the first etch stop layer, and the second dielectric layer, wherein the conductive structure comprises:
      a first portion extending through the first dielectric layer, and
      a second portion residing above the first portion and extending through the first etch stop layer and the second dielectric layer;
   a blocking layer in one or more bottom portions of the recess;
   a liner layer extending through the first dielectric layer, the first etch stop layer, and the second dielectric layer, wherein the liner layer at least partially surrounds the conductive structure and; and a barrier layer extending through the first dielectric layer, the first etch stop layer, and the second dielectric layer, wherein the barrier layer at least partially surrounds the liner layer.

9. The semiconductor structure of claim 8, wherein the barrier layer comprises one or more of tantalum (Ta), tantalum nitride (TaN), tantalum pentoxide (Ta2O5), titanium-tantalum alloy nitride (TaTiN), or titanium nitride (TiN).

10. The semiconductor structure of claim 8, wherein sidewalls of the conductive structure have an angle from approximately 84 degrees to approximately 90 degrees.

11. The semiconductor structure of claim 8, wherein the blocking layer is between the liner layer and the barrier layer.

12. The semiconductor structure of claim 8, wherein the blocking layer in a bottom portion, of the one or more bottom portions, intersecting with the second dielectric layer.

13. A semiconductor structure, comprising:
   a first conductive structure in a first recess extending through a first etch stop layer and a first dielectric layer residing on the first etch stop layer;
   a blocking layer in one or more bottom portions of the first recess;
   a liner layer in the first recess and surrounding at least a portion of the first conductive structure;
   a barrier layer in the first recess and surrounding the liner layer; and
   a second conductive structure in a second recess extending through a second etch stop layer and a second dielectric layer residing on the second etch stop layer, wherein the first etch stop layer resides on the second dielectric layer.

14. The semiconductor structure of claim 13, wherein the first conductive structure comprises a first portion and a second portion,
   wherein, in a cross section of the semiconductive structure, a width of the first portion is greater than a width of the second portion.

15. The semiconductor structure of claim 14, wherein, in the cross section of the semiconductor structure, a width of the second portion is less than a width of the second conductive structure.

16. The semiconductor structure of claim 13, wherein the first etch stop layer is in contact with the second conductive structure.

17. The semiconductor structure of claim 13, further comprising:
   a source/drain contact in contact with the second conductive structure.

18. The semiconductor structure of claim 13, wherein a width of a bottom of the first recess is less than a width of a top of the second recess.

19. The semiconductor structure of claim 13, wherein the blocking layer is between the liner layer and the barrier layer.

20. The semiconductor structure of claim 13, wherein the blocking layer in a bottom portion, of the one or more bottom portions, intersecting with the second dielectric layer.

* * * * *